US012740318B2

(12) United States Patent
Kim et al.

(10) Patent No.: US 12,740,318 B2
(45) Date of Patent: Sep. 15, 2026

(54) ORGANIC LIGHT EMITTING DIODE AND ORGANIC LIGHT EMITTING DEVICE INCLUDING THEREOF

(71) Applicant: LG DISPLAY CO., LTD., Seoul (KR)

(72) Inventors: Jong Uk Kim, Paju-si (KR); Suk Young Bae, Paju-si (KR); Dong Ryun Lee, Paju-si (KR); Han Jin Ahn, Paju-si (KR); Jun Yun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 780 days.

(21) Appl. No.: 18/026,751

(22) PCT Filed: Jun. 23, 2022

(86) PCT No.: PCT/KR2022/008930
§ 371 (c)(1),
(2) Date: Mar. 16, 2023

(87) PCT Pub. No.: WO2023/113124
PCT Pub. Date: Jun. 22, 2023

(65) Prior Publication Data

US 2024/0284793 A1 Aug. 22, 2024

(30) Foreign Application Priority Data

Dec. 16, 2021 (KR) ........................ 10-2021-0180229

(51) Int. Cl.
*H10K 85/60* (2023.01)
*C09K 11/06* (2006.01)
(Continued)

(52) U.S. Cl.
CPC ............ *H10K 85/658* (2023.02); *C09K 11/06* (2013.01); *C09K 2211/1018* (2013.01);
(Continued)

(58) Field of Classification Search
CPC .. H10K 85/658; H10K 50/11; H10K 2101/20; H10K 2101/30; H10K 50/12;
(Continued)

(56) References Cited

U.S. PATENT DOCUMENTS

2021/0384444 A1 12/2021 Yoon et al.
2024/0284793 A1 8/2024 Kim et al.

FOREIGN PATENT DOCUMENTS

CN 110903311 A 3/2020
CN 11574543 A 8/2020
(Continued)

OTHER PUBLICATIONS

Ahn, Dae Hyun, et al. "Rigid oxygen-bridged boron-based blue thermally activated delayed fluorescence emitter for organic light-emitting diode: approach towards satisfying high efficiency and long lifetime together." Advanced Optical Materials 8.11 (2020): 2000102. (Year: 2020).*

(Continued)

*Primary Examiner* — Dawn L Garrett
(74) *Attorney, Agent, or Firm* — Fish & Richardson P.C.

(57) ABSTRACT

The present disclosure relates to an organic light emitting diode in which an emitting material layer disposed between two electrodes includes a first compound in which an electron donor moiety is liked to an electron acceptor moiety via a carbon-carbon bond, and a second compound forming a fused ring between a boron atom and a nitrogen atom, and an organic light emitting device including the organic light emitting diode. The first compound and the second compound may be included in the same emitting material layer or adjacently disposed emitting material layers. The organic light emitting diode includes the emitting material layer where includes first compound that have high bonding energy between the electron acceptor moiety and the elec- (Continued)

tron donor moiety, and a second compound with an adjusted energy level compared to an energy level of the first compound, so that driving voltages of the organic light emitting diode can be lowered and luminous efficiency and luminous lifetime of the organic light emitting diode can be improved.

23 Claims, 19 Drawing Sheets

(51) Int. Cl.
*H10K 50/11* (2023.01)
*H10K 101/20* (2023.01)
*H10K 101/30* (2023.01)

(52) U.S. Cl.
CPC .......... *H10K 50/11* (2023.02); *H10K 2101/20* (2023.02); *H10K 2101/30* (2023.02)

(58) Field of Classification Search
CPC .... H10K 2101/40; H10K 50/13; C09K 11/06; C09K 2211/1018
See application file for complete search history.

(56) References Cited

FOREIGN PATENT DOCUMENTS

| | | | | | |
|---|---|---|---|---|---|
| CN | 113594376 | A | | 11/2021 | |
| EP | 4450587 | A1 | | 10/2024 | |
| JP | 2021-091644 | A | | 6/2021 | |
| JP | 2021182459 | A | | 11/2021 | |
| JP | 2024-502921 | A | | 1/2024 | |
| KR | 2021-0066706 | A | | 6/2021 | |
| KR | 2022-0063369 | A | | 5/2022 | |
| KR | 10-2023-0091277 | A | | 6/2023 | |
| WO | WO-2020138867 | A1 | * | 7/2020 | ........... H10K 85/322 |
| WO | WO 2021-073385 | A1 | | 4/2021 | |
| WO | 2023/113124 | A1 | | 6/2023 | |

OTHER PUBLICATIONS

Office Action in Korean Appln. No. 10-2021-0180229, mailed on Jul. 30, 2025, 15 pages (with English translation).
Japanese Office Action dated Apr. 11, 2024 issued in Patent Application No. 2023-515084 w/English Translation (10 pages).

* cited by examiner

ORGANIC LIGHT EMITTING DIODE AND ORGANIC LIGHT EMITTING DEVICE INCLUDING THEREOF

This application is a National Phase Entry of PCT International Application No. PCT/KR2022/008930, filed on Jun. 23, 2022, which claims the benefit of and the priority to Korean Patent Application No. 10-2021-0180229, filed in the Republic of Korea on Dec. 16, 2021, which are expressly incorporated by reference in their entirety into the present application.

TECHNICAL FIELD

The present disclosure relates to an organic light emitting diode, and more particularly, an organic light emitting diode having beneficial luminous properties and an organic light emitting device including thereof.

BACKGROUND ART

A flat display device including an organic light emitting diode (OLED) has attracted attention as a display device that can replace a liquid crystal display device (LCD). The OLED can be formed as a thin organic film less than 2000 Å and the electrode configuration can implement unidirectional or bidirectional images. Also, the OLED can be formed even on a flexible transparent substrate such as a plastic substrate so that a flexible or a foldable display device can be realized with ease using the OLED. In addition, the OLED can be driven at a lower voltage and the OLED has advantageous high color purity compared to the LCD.

In the OLED, when holes and electrons are injected into an emitting material layer between a cathode and an anode, electrical charges are recombined to form excitons as unstable excited state, and then emit light as the recombined excitons are shifted to a stable ground sate. Since fluorescent material uses only singlet exciton energy in the luminous process, the related art fluorescent material shows low luminous efficiency. Phosphorescent material can show high luminous efficiency since it uses triplet exciton energy as well as singlet exciton energy in the luminous process. However, examples of phosphorescent material include metal complexes, which have a short luminous lifespan for commercial use.

DISCLOSURE

Technical Problem

An object of the present disclosure is to provide an organic light emitting diode that can lower its driving voltage and can improve its luminous efficiency and luminous lifespan.

Technical Solution

In one aspect, the present disclosure provides an organic light emitting diode, includes: a first electrode; a second electrode facing the first electrode; and an emissive layer disposed between the first and second electrodes and including at least one emitting material layer, wherein the at least one emitting material layer includes a first compound and a second compound, wherein the first compound includes an organic compound having the following structure of Formula 1, and wherein the second compound includes an organic compound having the following structure of Formula 7:

[Formula 1]

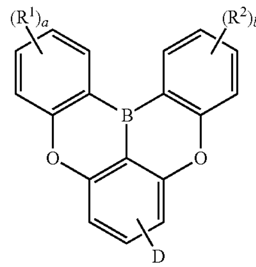

where in the Formula 1, each of $R^1$ and $R^2$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl amino, an unsubstituted or substituted $C_6$-$C_{30}$ aromatic group or an unsubstituted or substituted $C_3$-$C_{30}$ hetero aromatic group, each $R^1$ is different from or identical to each other when a is 2 or more, and each $R^2$ is different from or identical to each other when b is 2 or more, optionally, two adjacent $R^1$ when a is 2 or more and/or two adjacent $R^2$ when b is 2 or more are linked together to form an unsubstituted or substituted $C_6$-$C_{20}$ aromatic ring or an unsubstituted or substituted $C_3$-$C_{20}$ hetero aromatic ring;

D is a moiety having the following structure of Formula 2 or Formula 3; and each of a and b is 4 when each of $R^1$ and $R^2$ is a hydrogen atom, and each of a and b is independently 0, 1, 2, 3 or 4 when each of $R^1$ and $R^2$ is not a hydrogen atom,

[Formula 2]

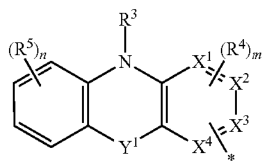

where in the Formula 2, $R^3$ is an unsubstituted $C_6$-$C_{30}$ aromatic group or an unsubstituted or substituted $C_3$-$C_{30}$ hetero aromatic group, each of $R^4$ and $R^5$ is independently a hydrogen atom, a deuterium, a tritium, a halogen atom, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_2$-$C_{20}$ alkynyl, an unsubstituted or substituted $C_2$-$C_{20}$ hetero alkynyl, an unsubstituted or substituted $C_1$-$C_{20}$ alkyl silyl, an unsubstituted or substituted $C_1$-$C_{20}$ hetero alkyl silyl, an unsubstituted or substituted $C_1$-$C_{20}$ alkyl amino, an unsubstituted or substituted $C_1$-$C_{20}$ alkoxy, carboxyl, cyano, sulfanyl, phosphine, an unsubstituted or substituted $C_3$-$C_{20}$ alicyclic group, an unsubstituted or substituted $C_3$-$C_{20}$ hetero alicyclic group, an unsubstituted or substituted $C_6$-$C_{30}$ aromatic group or an unsubstituted or substituted $C_3$-$C_{30}$ hetero aromatic group, each $R^4$ is different from or identical to each other when m is 2 or more, and each $R^5$ is different from or identical to each other when n is 2 or more, optionally, two adjacent $R^4$ when m is 2 or more and/or two adjacent $R^5$ when n is 2 or more are linked together to form an unsubstituted or substituted $C_6$-$C_{20}$ aromatic ring or an unsubstituted or substituted $C_3$-$C_{20}$ hetero aromatic ring;

one of $X^1$ to $X^4$ is a carbon atom linked to a hetero ring including a boron atom and an oxygen atom of Formula 1, and other of $X^1$ to $X^4$ is independently $CR^4$ or a nitrogen atom;

$Y^1$ is a single bond;

m is 0, 1, 2 or 3;

n is 0, 1, 2, 3 or 4; and the asterisk indicates a link position,

[Formula 3]

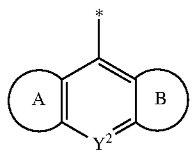

where in the Formula 3, $Y^2$ is $CR^6$ or N, wherein $R^6$ is a hydrogen atom, a deuterium, a tritium or an unsubstituted or substituted $C_1$-$C_{20}$ alkyl;

each of ring A and ring B independently has the following structure of Formula 4; and the asterisk indicated a link position,

[Formula 4]

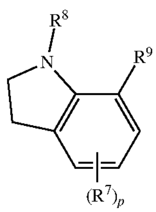

where in the Formula 4, $R^7$ is a deuterium, a tritium, an unsubstituted or substituted $C_1$-$C_{20}$ alkyl, an unsubstituted or substituted $C_1$-$C_{20}$ alkyl amino, an unsubstituted or substituted $C_6$-$C_{30}$ aromatic group or an unsubstituted or substituted $C_3$-$C_{30}$ hetero aromatic group, each $R^7$ is different from or identical to each other when p is 2 or more, optionally, two adjacent $R^7$ when p is 2 or more are linked together to form an unsubstituted or substituted $C_6$-$C_{20}$ aromatic ring or an unsubstituted or substituted $C_3$-$C_{20}$ hetero aromatic ring;

each of $R^8$ and $R^9$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl amino, an unsubstituted or substituted $C_6$-$C_{30}$ aromatic group or an unsubstituted or substituted $C_3$-$C_{30}$ hetero aromatic group, optionally, $R^8$ and $R^9$ are linked together to form an unsubstituted or substituted $C_6$-$C_{20}$ aromatic ring or an unsubstituted or substituted $C_3$-$C_{20}$ hetero aromatic ring; and p is 0, 1, 2, or 3.

[Formula 2]

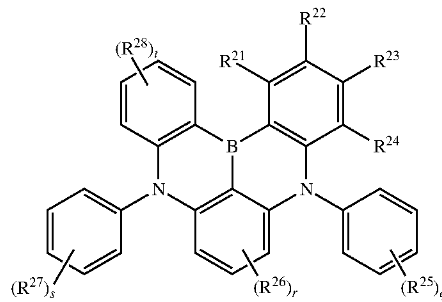

where in the Formula 7, each of $R^{21}$ to $R^{24}$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl silyl, an unsubstituted or substituted $C_1$-$C_{20}$ alkyl amino, an unsubstituted or substituted $C_6$-$C_{30}$ aromatic group or an unsubstituted or substituted $C_3$-$C_{20}$ hetero aromatic group, optionally, two adjacent groups among $R^{21}$ to $R^{24}$ are linked together to form an unsubstituted or substituted fused ring having a boron atom and a nitrogen atom;

each of $R^{25}$ to $R^{28}$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl silyl, an unsubstituted or substituted $C_1$-$C_{20}$ alkyl amino, an unsubstituted or substituted $C_6$-$C_{30}$ aromatic group or an unsubstituted or substituted $C_3$-$C_{20}$ hetero aromatic group, each $R^{25}$ is different from or identical to each other when q is 2 or more, each $R^{26}$ is different from or identical to each other when r is 2 or more, each $R^{27}$ is different from or identical to each other when s is 2 or more and each $R^{28}$ is different from or identical to each other when t is 2 or more;

each of q and s is independently 0, 1, 2, 3, 4 or 5;

r is 0, 1, 2 or 3; and t is 0, 1, 2, 3 or 4.

As an example, a highest occupied molecular orbital (HOMO) energy level of the first compound and a HOMO energy level of the second compound may satisfy the following relationship in Equation (1)

$$|HOMO^{FD} - HOMO^{DF}| < 0.3 \text{ eV} \quad (1)$$

where in the Equation (1), $HOMO^{DF}$ indicates the HOMO energy level of the first compound; and $HOMO^{FD}$ indicates the HOMO energy level of the second compound.

Alternatively, a lowest unoccupied molecular orbital (LUMO) energy level of the first compound may be higher than or equal to a LUMO energy level of the second compound.

As an example, an energy bandgap between a HOMO energy level and a LUMO energy level of the first compound may be between about 2.6 eV and about 3.1 eV.

In an example embodiment, each of $R^1$ and $R^2$ in Formula 1 may be independently a hydrogen atom, one of $X^1$ $X^4$ in Formula 2 may be a carbon atom linked to the hetero ring having the boron atom and the oxygen atom and other of $X^1$ to $X^4$ in Formula 2 may be independently $CR^4$.

For example, each of $R^1$ and $R^2$ in Formula 1 is independently a hydrogen atom and D in Formula 1 includes the following moiety of Formula 5:

[Formula 5]

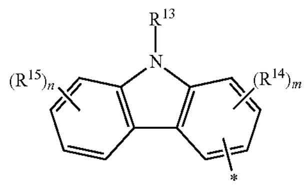

where in the Formula 5, $R^{13}$ is an unsubstituted or substituted $C_6$-$C_{30}$ aryl or an unsubstituted or substituted $C_3$-$C_{30}$ hetero aryl;

each of $R^{14}$ and $R^{15}$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl amino, an unsubstituted or substituted $C_6$-$C_{30}$ aromatic group or an unsubstituted or substituted $C_3$-$C_{30}$ hetero aromatic group, each $R^{14}$ is different from or identical to each other when m is 2 or more, and each $R^{15}$ is different from or identical to each other when n is 2 or more, optionally, two adjacent $R^{14}$ when m is 2 or more and/or two adjacent $R^{15}$ when n is 2 or more are linked together to form an unsubstituted or substituted $C_6$-$C_{20}$ aromatic ring or an unsubstituted or substituted $C_3$-$C_{20}$ hetero aromatic ring;

m is 0, 1, 2 or 3;

n is 0, 1, 2, 3 or 4; and the asterisk indicates a link position.

The second compound may include an organic compound having the following structure of Formula 8A, Formula 8B or Formula 8C:

[Formula 8A]

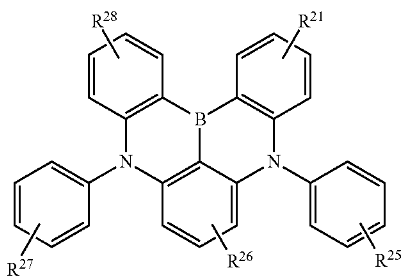

-continued

[Formula 8B]

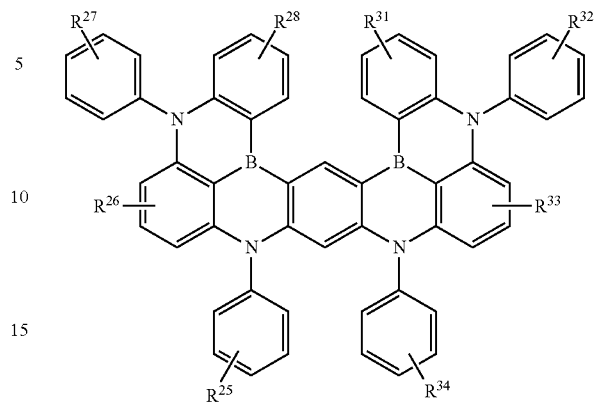

[Formula 8C]

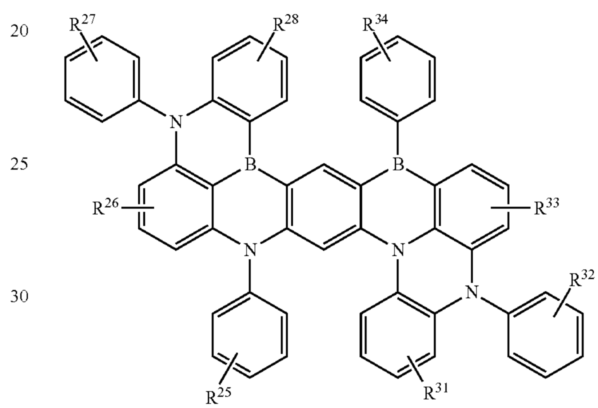

where in the Formulae 8A to 8C, each of $R^{21}$, $R^{25}$ to $R^{28}$ and $R^{31}$ to $R^{34}$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl silyl, an unsubstituted or substituted $C_1$-$C_{20}$ alkyl amino, an unsubstituted or substituted $C_6$-$C_{30}$ aryl or an unsubstituted or substituted $C_3$-$C_{20}$ hetero aryl.

In one example embodiment, the at least one emitting material layer can include a single-layered emitting material layer.

The single-layered emitting material layer can further include a third compound.

In an alternative embodiment, the at least one emitting material layer can include: a first emitting material layer disposed between the first and second electrodes; and a second emitting material layer disposed between the first electrode and the first emitting material layer or between the second electrode and the first emitting material layer, wherein the first emitting material layer can include the first compound, and wherein the second emitting material layer can include the second compound.

When each of the first compound and the second compound is included in each of the first emitting material layer and the second emitting material layer, respectively, the first emitting material layer can further include a third compound and the second emitting material layer can further include a fourth compound.

An excited triplet energy level of the third compound can be higher than an excited triplet energy level of the first compound, and wherein the excited triplet energy level of the first compound can be higher than an excited triplet energy level of the second compound.

An excited singlet energy level of the third compound can be higher than an excited singlet energy level of the first compound, and wherein the excited singlet energy level of the first compound can be higher than an excited singlet energy level of the second compound.

An excited singlet energy level of the fourth compound can be higher than an excited singlet energy level of the second compound.

When each of the first compound and the second compound is included in each of separate emitting material layers, the at least one emitting material layer can further include a third emitting material layer disposed oppositely to the second emitting material layer with respect to the first emitting material layer.

The third emitting material layer can include a fifth compound and a sixth compound, and wherein the fifth compound can include an organic compound having the structure of Formula 7.

The emissive layer can include: a first emitting part disposed between the first and second electrodes; a second emitting part disposed between the first emitting part and the second electrode; and a charge generation layer disposed between the first and second emitting parts, wherein at least one of the first emitting part and the second emitting part includes the at least one emitting material layer.

As an example, the first emitting part can include the at least one emitting material layer, and the second emitting part can emit at least one light of red color and green color.

In accordance with another aspect, the present disclosure provides an organic light emitting device, for example, an organic light emitting display device or an organic light emitting illumination device including a substrate and the organic light emitting diode on the substrate.

Advantageous Effects

The present disclosure relates to an organic light emitting diode where a first compound including an electron donor moiety and an electron acceptor moiety linked to the electron donor moiety through a linkage having strong bonding energy, and a second compound with controlling energy level are included in the same emitting material layer or adjacently disposed emitting material layers, and an organic light emitting device including the organic light emitting diode.

The first compound has the strong bonding energy between the electron donor and the electron acceptor, so that it can maintain its stable molecular conformation against heat generated in driving the diode. The energy levels of the first and second compound are adjusted so that holes are injected and transported rapidly to the first compound having beneficial luminous efficiency and thermal stability without trapping at the second compound. Since exciplex between the first compound and the second compound are not generated, it is possible to realize internal quantum efficiency of 100% at the first compound with excellent luminous efficiency and to transfer excitons generated at the first compound to the second compound.

With improving charge injection efficiency and exciton generation efficiency, the driving voltage of the organic light emitting diode can be lowered and the luminous efficiency of the organic light emitting diode can be improved. Since the ultimate light emission is occurred at the second compound which has narrow FWHM and beneficial luminous lifetime, it is possible to improve the color purity and luminous lifetime of the organic light emitting diode.

EMBODIMENT FOR INVENTION

The present disclosure relates to an organic light emitting diode where a first compound including an electron donor moiety and an electron acceptor moiety linked to the electron donor moiety via strong bonding energy and a second compound with adjusting energy level are included in the same emitting material layer or adjacently disposed emitting material layers and an organic light emitting device including the diode. The organic light emitting diode in accordance with the present disclosure can be applied to an organic light emitting device such as an organic light emitting display device or an organic light emitting illumination device. For example, the organic light emitting display device applying the organic light emitting diode will be described in detail.

Figure 1:
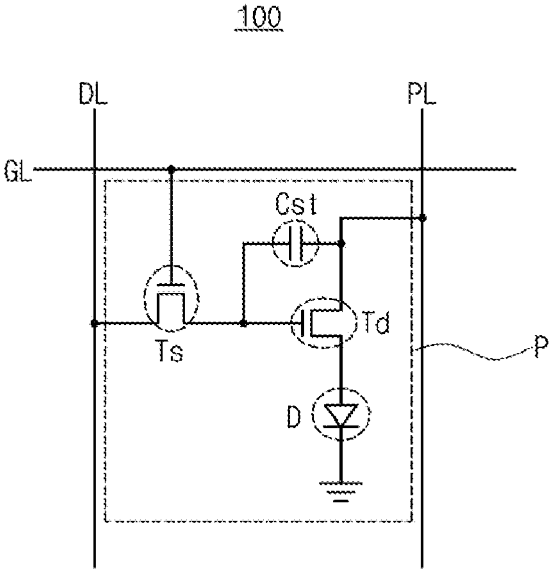
FIG. 1 illustrates a schematic circuit diagram of an organic light emitting display device in accordance with the present disclosure.
Figure 15:
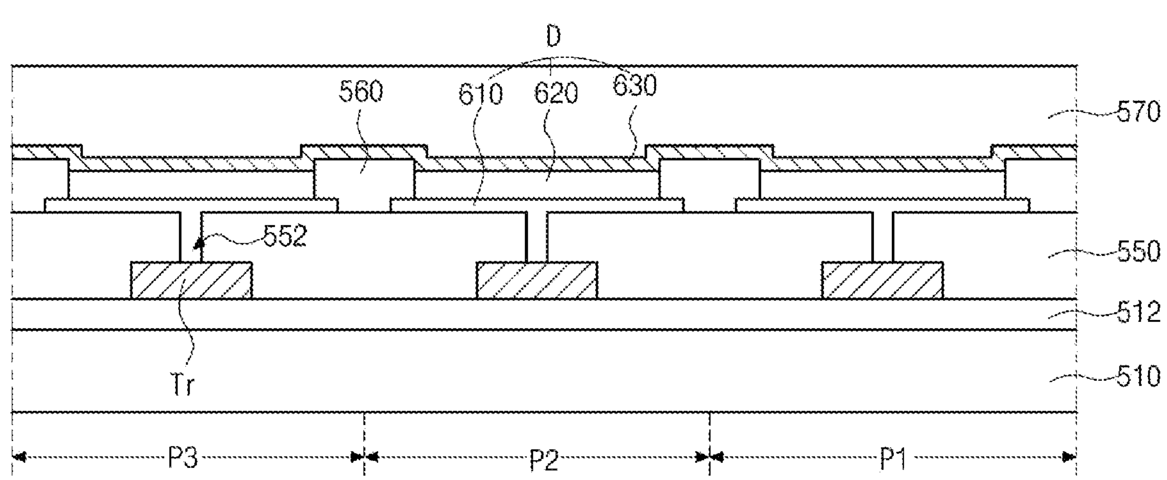
FIG. 15 illustrates a schematic cross-sectional view of an organic light emitting display device as an organic light emitting device in accordance with another example embodiment of the present disclosure.

FIG. 1 illustrates a schematic circuit diagram of an organic light emitting display device in accordance with the present disclosure. As illustrated in FIG. 1, a gate line GL, a data line DL and power line PL, each of which crosses each other to define a pixel region P, in the organic light emitting display device 100. A switching thin film transistor Ts, a driving thin film transistor Td, a storage capacitor Cst and an organic light emitting diode D are disposed within the pixel region P. The pixel region P may include a first pixel region P1 (FIG. 15), a second pixel region P2 (FIG. 15) and a third pixel region P3 (FIG. 15).

The switching thin film transistor Ts is connected to the gate line GL and the data line DL. The driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied to the gate line GL, a data signal applied to the data line DL is applied to a gate electrode 130 (FIG. 2) of the driving thin film transistor Td and one electrode of the storage capacitor Cst through the switching thin film transistor Ts.

The driving thin film transistor Td is turned on by the data signal applied to the gate electrode 130 (FIG. 2) so that a current proportional to the data signal is supplied from the power line PL to the organic light emitting diode D through the driving thin film transistor Td. And then, the organic light emitting diode D emits light with luminance proportional to the current flowing through the driving thin film transistor Td. In this case, the storage capacitor Cst is charged with voltage proportional to the data signal so that the voltage of the gate electrode in the driving thin film transistor Td is kept constant during one frame. Therefore, the organic light emitting display device can display a desired image.

Figure 2:
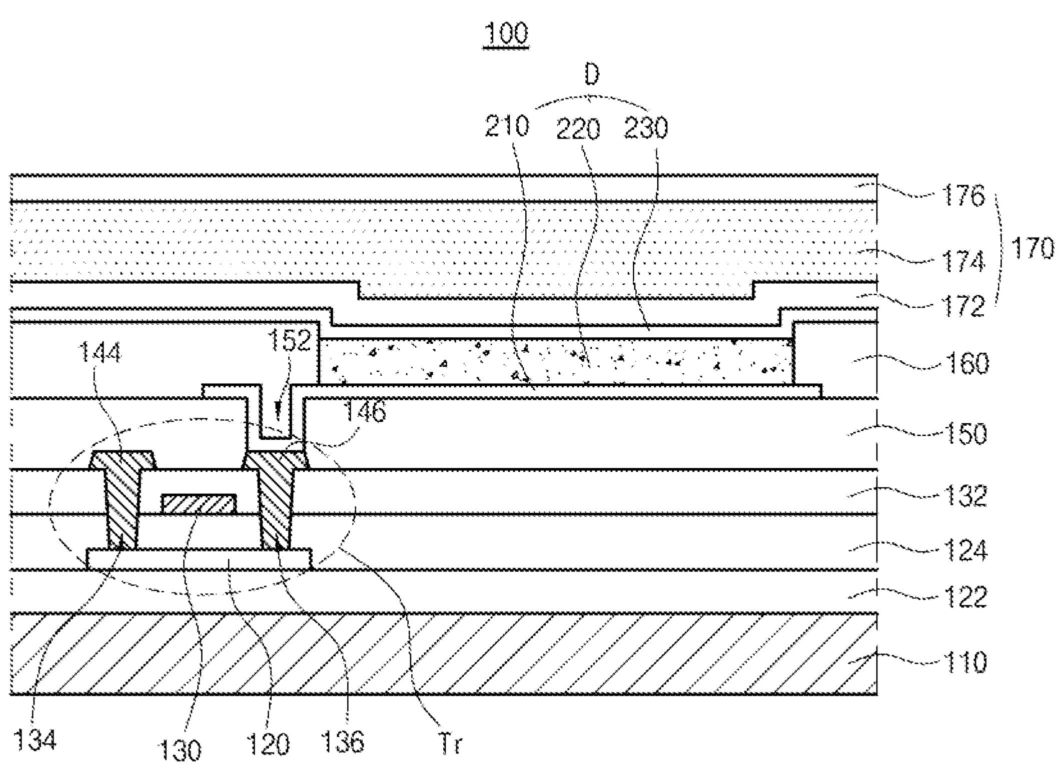
FIG. 2 illustrates a schematic cross-sectional view of an organic light emitting display device as an organic light emitting device in accordance with an example embodiment of the present disclosure.

FIG. 2 illustrates a schematic cross-sectional view of an organic light emitting display device in accordance with an example embodiment of the present disclosure. As illustrated in FIG. 2, the organic light emitting display device 100 includes a substrate 110, a thin-film transistor Tr on the substrate 110, and an organic light emitting diode D on a passivation layer 150 and connected to the thin film transistor Tr.

The substrate 110 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and/or combinations thereof. The substrate 110, on which the thin film transistor Tr and the organic light emitting diode D are arranged, forms an array substrate.

A buffer layer 122 may be disposed on the substrate 110. The thin film transistor Tr may be disposed on the buffer layer 122. The buffer layer 122 may be omitted.

A semiconductor layer 120 is disposed on the buffer layer 122. In one example embodiment, the semiconductor layer 120 may include, but is not limited to, oxide semiconductor materials. In this case, a light-shield pattern may be disposed under the semiconductor layer 120, and the light-shield pattern can prevent light from being incident toward the semiconductor layer 120, and thereby, preventing or reducing the semiconductor layer 120 from being degraded by the light. Alternatively, the semiconductor layer 120 may include polycrystalline silicon. In this case, opposite edges of the semiconductor layer 120 may be doped with impurities.

A gate insulating layer 124 including an insulating material is disposed on the semiconductor layer 120. The gate insulating layer 124 may include, but is not limited to, an inorganic insulating material such as silicon oxide ($SiO_x$, wherein $0<x\leq2$) or silicon nitride ($SiN_x$, wherein $0<x\leq2$).

A gate electrode 130 made of a conductive material such as a metal is disposed on the gate insulating layer 124 so as to correspond to a center of the semiconductor layer 120. While the gate insulating layer 124 is disposed on a whole area of the substrate 110 in FIG. 2, the gate insulating layer 124 may be patterned identically as the gate electrode 130.

An interlayer insulating layer 132 including an insulating material is disposed on the gate electrode 130 with and covers an entire surface of the substrate 110. The interlayer insulating layer 132 may include, but is not limited to, an inorganic insulating material such as silicon oxide ($SiO_x$) or silicon nitride ($SiN_x$), or an organic insulating material such as benzocyclobutene or photo-acryl.

The interlayer insulating layer 132 has first and second semiconductor layer contact holes 134 and 136 that expose or do not cover a portion of the surface nearer to the opposing ends than to a center of the semiconductor layer 120. The first and second semiconductor layer contact holes 134 and 136 are disposed on opposite sides of the gate electrode 130 and spaced apart from the gate electrode 130. The first and second semiconductor layer contact holes 134 and 136 are formed within the gate insulating layer 124 in FIG. 2. Alternatively, the first and second semiconductor layer contact holes 134 and 136 may be formed only within the interlayer insulating layer 132 when the gate insulating layer 124 is patterned identically as the gate electrode 130.

A source electrode 144 and a drain electrode 146, which are made of conductive material such as a metal, are disposed on the interlayer insulating layer 132. The source electrode 144 and the drain electrode 146 are spaced apart from each other on opposing sides of the gate electrode 130, and contact both sides of the semiconductor layer 120 through the first and second semiconductor layer contact holes 134 and 136, respectively.

The semiconductor layer 120, the gate electrode 130, the source electrode 144 and the drain electrode 146 constitute the thin film transistor Tr, which acts as a driving element. The thin film transistor Tr in FIG. 2 has a coplanar structure in which the gate electrode 130, the source electrode 144 and the drain electrode 146 are disposed on the semiconductor layer 120. Alternatively, the thin film transistor Tr may have an inverted staggered structure in which a gate electrode is disposed under a semiconductor layer and a source and drain electrodes are disposed on the semiconductor layer. In this case, the semiconductor layer may include amorphous silicon.

The gate line GL and the data line DL, which cross each other to define a pixel region P, and a switching element Ts, which is connected to the gate line GL and the data line DL, may be further formed in the pixel region P. The switching element Ts is connected to the thin film transistor Tr, which is a driving element. In addition, the power line PL is spaced apart in parallel from the gate line GL or the data line DL. The thin film transistor Tr may further include a storage capacitor Cst configured to constantly keep a voltage of the gate electrode 130 for one frame.

A passivation layer 150 is disposed on the source and drain electrodes 144 and 146. The passivation layer 150 covers the thin film transistor Tr on the whole substrate 110. The passivation layer 150 has a flat top surface and a drain contact hole 152 that exposes or does not cover the drain electrode 146 of the thin film transistor Tr. While the drain contact hole 152 is disposed on the second semiconductor layer contact hole 136, it may be spaced apart from the second semiconductor layer contact hole 136.

The organic light emitting diode (OLED) D includes a first electrode 210 that is disposed on the passivation layer 150 and connected to the drain electrode 146 of the thin film transistor Tr. The OLED D further includes an emissive layer 220 and a second electrode 230 each of which is disposed sequentially on the first electrode 210.

The first electrode 210 is disposed in each pixel region. The first electrode 210 may be an anode and include conductive material having relatively high work function value. For example, the first electrode 210 may include, but is not limited to, a transparent conductive oxide (TCO). In one example embodiment, when the organic light emitting display device 100 is a bottom-emission type, the first electrode 210 may have a single-layered structure of the TCO.

Alternatively, when the organic light emitting display device 100 is a top-emission type, a reflective electrode or a reflective layer may be disposed under the first electrode 210. For example, the reflective electrode or the reflective layer may include, but is not limited to, silver (Ag) or aluminum-palladium-copper (APC) alloy. In the OLED D of the top-emission type, the first electrode 210 may have a triple-layered structure of ITO/Ag/ITO or ITO/APC/ITO. In addition, a bank layer 160 is disposed on the passivation layer 150 in order to cover edges of the first electrode 210. The bank layer 160 exposes or does not cover a center of the first electrode 210 corresponding to pixel region.

An emissive layer 220 is disposed on the first electrode 210. In one example embodiment, the emissive layer 220 may have a single-layered structure of an emitting material layer (EML). Alternatively, the emissive layer 220 may have a multiple-layered structure of a hole injection layer (HIL), a hole transport layer (HTL) and/or an electron blocking layer (EBL), each of which is laminated sequentially between the EML and the first electrode 210, a hole blocking layer (HBL), an electron transport layer (ETL) and/or an electron injection layer (EIL), each of which is laminated sequentially between the EML and the second electrode 230 (FIGS. 3, 8, 11 and 14). In one aspect, the emissive layer 220 may have a single emitting part. Alternatively, the emissive layer 220 may have multiple emitting parts to form a tandem structure.

The second electrode 230 is disposed on the substrate 110 above which the emissive layer 220 is disposed. The second electrode 230 may be disposed on a whole display area. The second electrode 230 may include a conductive material with a relatively low work function value compared to the first electrode 210. The second electrode 230 may be a cathode. When the organic light emitting display device 100 is a top-emission type, the second electrode 230 is thin so as to have light-transmissive (semi-transmissive) property.

In addition, an encapsulation film 170 may be disposed on the second electrode 230 in order to prevent or reduce outer moisture from penetrating into the organic light emitting diode D. The encapsulation film 170 may have, but is not limited to, a laminated structure of a first inorganic insulating film 172, an organic insulating film 174 and a second inorganic insulating film 176. The encapsulation film 170 may be omitted.

A polarizing plate may be attached onto the encapsulation film to reduce reflection of external light. For example, the polarizing plate may be a circular polarizing plate. When the organic light emitting display device 100 is a bottom-emission type, the polarizing plate may be disposed under the substrate 110. Alternatively, when the organic light emitting display device 100 is a top-emission type, the polarizing plate may be disposed on the encapsulation film 170. In addition, a cover window may be attached to the encapsulation film 170 or the polarizing plate in the organic light emitting display device 100 of the top-emission type. In this case, the substrate 110 and the cover window may have a flexible property, thus the organic light emitting display device 100 may be a flexible display device.

Figure 3:
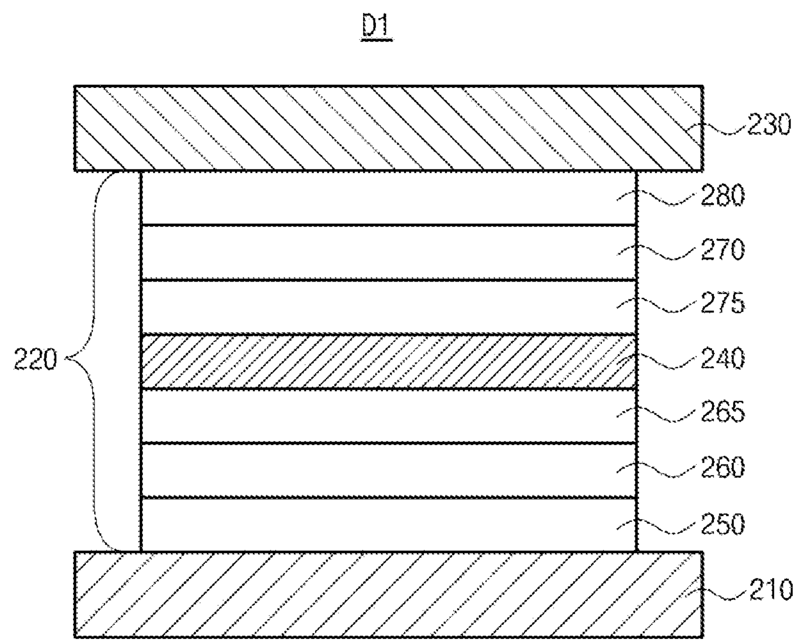
FIG. 3 illustrates a schematic a cross-sectional view of an organic light emitting diode in accordance with an example embodiment of the present disclosure.

The OLED D which can be applied into the organic light emitting device in accordance with a first embodiment of the present disclosure is described in more detail. FIG. 3 illustrates a schematic cross-sectional view of an organic light emitting diode in accordance with an example embodiment of the present disclosure. As illustrated in FIG. 3, the organic light emitting diode (OLED) D1 in accordance with the first embodiment of the present disclosure includes first and second electrodes 210 and 230 facing each other and an emissive layer 220 disposed between the first and second electrodes 210 and 230. The organic light emitting display device 100 (FIG. 2) includes a red pixel region, a green pixel region and a blue pixel region, and the OLED D1 may be disposed in the blue pixel region.

In an example embodiment, the emissive layer 220 includes an emitting material layer (EML) 240 disposed between the first and second electrodes 210 and 230. Also, the emissive layer 220 may include at least one of an HTL 260 disposed between the first electrode 210 and the EML 240 and an ETL 270 disposed between the EML 240 and the second electrode 230. In addition, the emissive layer 220 may further include at least one of an HIL 250 disposed between the first electrode 210 and the HTL 260 and an EIL 280 disposed between the ETL 270 and the second electrode 230. Alternatively, the emissive layer 220 may further comprise an EBL 265 disposed between the EML 240 and the HTL 260 and/or an HBL 275 disposed between the EML 240 and the ETL 270.

The first electrode 210 may be an anode that provides holes into the EML 240. The first electrode 210 may include a conductive material having a relatively high work function value, for example, a transparent conductive oxide (TCO). In an example embodiment, the first electrode 210 may include, but is not limited to, indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and/or the like.

The second electrode 230 may be a cathode that provides electrons into the EML 240. The second electrode 230 may include a conductive material having a relatively low work function values. For example, the second electrode 230 may include, but is not limited to, a highly reflective material such as aluminum (Al), magnesium (Mg), calcium (Ca), silver (Ag), alloy thereof and combinations thereof.

Figure 4:
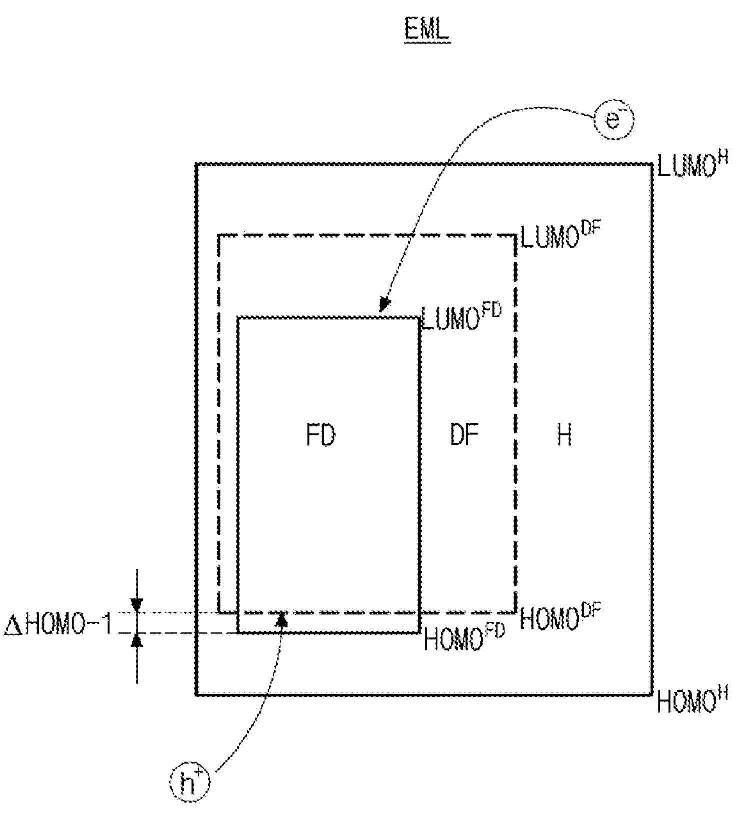
FIG. 4 illustrate a schematic diagram that holes are transferred efficiently to the second compound by adjusting energy levels of luminous materials focusing the first compound and the second compound in an emitting material layer in accordance with an example embodiment of the present disclosure.

The EML 240 may include a first compound DF (FIG. 4), a second compound FD (FIG. 4), and optionally, a third compound H (FIG. 4). For example, the first compound DF may be delayed fluorescent material, the second compound FD may be fluorescent material, and the third compound H may be host.

When holes and electrons meet in the EML 240 to form excitons, single exciton of paired spin form and triplet exciton of unpaired spin form are generated with a ratio of 1:3 by arrangement of the spins. Since related art fluorescent materials can utilize only singlet excitons, its luminous efficiency is low. While phosphorescent materials can utilize both the triplet excitons and the singlet excitons, their luminous lifetimes are too short to be used in commercial levels.

In order to solve the disadvantages of the related art fluorescent materials and phosphorescent materials, the first compound DF may be delayed fluorescent material having a property of thermally activated delayed fluorescence (TADF). The delayed fluorescent material has very narrow bandgap $\Delta E_{ST}$ (FIG. 7) between its excited singlet energy level $S_1^{DF}$ and its excited triplet energy level $T_1^{DF}$. Accordingly, both excitons at excited singlet energy level $S_1^{DF}$ and excitons at excited triplet energy level $T_1^{DF}$ in the first compound DF of the delayed fluorescent material transfers to an intramolecular charge transfer (ICT) state ($S_1 \rightarrow ICT \leftarrow T_1$), and then drops the ground state $S_0$ ($ICT \rightarrow S_0$).

The delayed fluorescent material should have energy bandgap $\Delta E_{ST}$ (FIG. 7) between its excited singlet energy level $S_1^{DF}$ and its excited triplet energy level $T_1^{DF}$ of equal to or less than 0.3 eV, for example, between 0.05 eV and 0.3 eV in order to transfer exciton energy at both the triplet state and the singlet state. The materials having small energy bandgap between its singlet state and its triplet state shows fluorescence with dropping its original singlet sate exciton energies to its ground state and delayed fluorescence by Reverse Inter System Crossing (RISC) with up-converting the triplet state into singlet state of higher energy level by room-temperature thermal energy, and then, dropping the converted singlet state exciton energies to the ground state.

The first compound DF included in the EML 240 in accordance with the present disclosure includes a carbon-carbon bond with high bonding energy between an electron donor moiety and an electron acceptor moiety. The electron acceptor moiety forms a fused ring including a boron atom and an oxygen atom, and the electron donor moiety forms a poly-cyclic ring including at least one nitrogen atom. The first compound DF having the delayed fluorescent property may have the following structure of Formula 1:

[Formula 1]

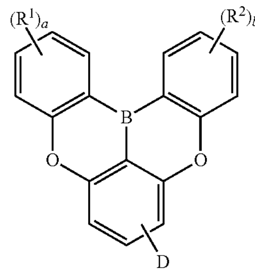

where in the Formula 1, each of $R^1$ and $R^2$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl amino, an unsubstituted or substituted $C_6$-$C_{30}$ aromatic group or an unsubstituted or substituted $C_3$-$C_{30}$ hetero aromatic group, each $R^1$ is different from or identical to each other when a is 2 or more, and each $R^2$ is different from or identical to each other when b is 2 or more, optionally, two adjacent $R^1$ when a is 2 or more and/or two adjacent $R^2$ when b is 2 or more are linked together to form an unsubstituted or substituted $C_6$-$C_{20}$ aromatic ring or an unsubstituted or substituted $C_3$-$C_{20}$ hetero aromatic ring;

D is a moiety having the following structure of Formula 2 or Formula 3; and each of a and b is 4 when each of $R^1$ and $R^2$ is a hydrogen atom, and each of a and b is independently 0, 1, 2, 3 or 4 when each of $R^1$ and $R^2$ is not a hydrogen atom,

[Formula 2]

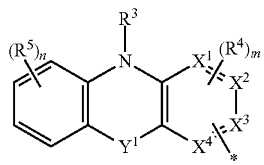

where in the Formula 2, $R^3$ is an unsubstituted $C_6$-$C_{30}$ aromatic group or an unsubstituted or substituted $C_3$-$C_{30}$ hetero aromatic group, each of $R^4$ and $R^5$ is independently a hydrogen atom, a deuterium, a tritium, a halogen atom, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_2$-$C_{20}$ alkynyl, an unsubstituted or substituted $C_2$-$C_{20}$ hetero alkynyl, an unsubstituted or substituted $C_1$-$C_{20}$ alkyl silyl, an unsubstituted or substituted $C_1$-$C_{20}$ hetero alkyl silyl, an unsubstituted or substituted $C_1$-$C_{20}$ alkyl amino, an unsubstituted or substituted $C_1$-$C_{20}$ alkoxy, carboxyl, cyano, sulfanyl, phosphine, an unsubstituted or substituted $C_3$-$C_{20}$ alicyclic group, an unsubstituted or substituted $C_3$-$C_{20}$ hetero alicyclic group, an unsubstituted or substituted $C_6$-$C_{30}$ aromatic group or an unsubstituted or substituted $C_3$-$C_{30}$ hetero aromatic group, each $R^4$ is different from or identical to each other when m is 2 or more, and each $R^5$ is different from or identical to each other when n is 2 or more, optionally, two adjacent $R^4$ when m is 2 or more and/or two adjacent $R^5$ when n is 2 or more are linked together to form an unsubstituted or substituted $C_6$-$C_{20}$ aromatic ring or an unsubstituted or substituted $C_3$-$C_{20}$ hetero aromatic ring;

one of $X^1$ to $X^2$ is a carbon atom linked to a hetero ring including a boron atom and an oxygen atom of Formula 1, and other of $X^1$ to $X^4$ is independently $CR^4$ or a nitrogen atom;

$Y^1$ is a single bond;

m is 0, 1, 2 or 3;

n is 0, 1, 2, 3 or 4; and the asterisk indicates a link position,

[Formula 3]

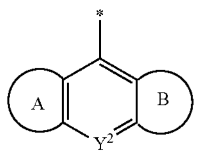

where in the Formula 3, $Y^2$ is $CR^6$ or N, wherein $R^6$ is a hydrogen atom, a deuterium, a tritium or an unsubstituted or substituted $C_1$-$C_{20}$ alkyl;

each of ring A and ring B independently has the following structure of Formula 4; and the asterisk indicated a link position,

[Formula 4]

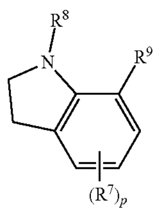

where in the Formula 4, $R^7$ is a deuterium, a tritium, an unsubstituted or substituted $C_1$-$C_{20}$ alkyl, an unsubstituted or substituted $C_1$-$C_{20}$ alkyl amino, an unsubstituted or substituted $C_6$-$C_{30}$ aromatic group or an unsubstituted or substituted $C_3$-$C_{30}$ hetero aromatic group, each $R^7$ is different from or identical to each other when p is 2 or more, optionally, two adjacent $R^7$ when p is 2 or more are linked together to form an unsubstituted or substituted $C_6$-$C_{20}$ aromatic ring or an unsubstituted or substituted $C_3$-$C_{20}$ hetero aromatic ring;

each of $R^8$ and $R^9$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl amino, an unsubstituted or substituted $C_6$-$C_{30}$ aromatic group or an unsubstituted or substituted $C_3$-$C_{30}$ hetero aromatic group, optionally, $R^8$ and $R^9$ are linked together to form an unsubstituted or substituted $C_6$-$C_{20}$ aromatic ring or an unsubstituted or substituted $C_3$-$C_{20}$ hetero aromatic ring; and p is 0, 1, 2, or 3.

As used herein, the term "unsubstituted" means that a hydrogen atom is linked.

As used herein, "substituted" means that the hydrogen is replaced with a substituent. The substituent may comprise, but is not limited to, a deuterium, a tritium, an unsubstituted or hydroxyl-, carbonyl- and/or halogen-substituted $C_1$-$C_{20}$ alkyl, unsubstituted or halogen-substituted $C_1$-$C_{20}$ alkoxy, halogen, cyano, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a $C_6$-$C_{30}$ aryl group, a $C_3$-$C_{30}$ hetero aryl group, a nitro group, a hydrazyl group and a sulfonate group.

As used herein, the term "$C_1$-$C_{20}$ chain-type aliphatic hydrocarbon" may include an alkyl, an alkenyl and alkynyl, each of which is derived from $C_1$-$C_{20}$ alkane, $C_2$-$C_{20}$ alkene and $C_2$-$C_{20}$ alkyne, and $C_1$-$C_{20}$ alkoxy. Such a chain-type aliphatic hydrocarbon may be unsubstituted or substituted.

As used herein, the term "alkyl" refers to a branched or unbranched saturated hydrocarbon group of 1 to 20 carbon atoms, such as methyl, ethyl, or 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, and the like.

As used herein, the term "alkenyl" is a hydrocarbon group of 2 to 20 carbon atoms containing at least one carbon-carbon double bond. As used herein, the term "alkynyl" is a hydrocarbon group of 2 to 20 carbon atoms containing at least one carbon-carbon triple bond.

As used herein, the term "alkoxy" refers to an branched or unbranched alkyl bonded through an ether linkage represented by the formula —O(-alkyl) where alkyl is as defined herein. Examples of alkoxy may include, but is not limited to, methoxy, ethoxy, n-propoxy, isopropoxy, butoxy, and tert-butoxy, and the like.

As used herein, the term "alicyclic" or "cycloalkyl" refers to a non-aromatic carbon-based ring composed of at least three carbon atoms. Examples of alicyclic groups may include, but are not limited to, cyclopropyl, cyclobutyl, cyclopentyl, cyclohexyl, norbornyl, and the like.

As used herein, the term "hetero" in terms such as "hetero aromatic group", "a hetero alicyclic group" means that at least one carbon atom, for example 1- to 5 carbons atoms, constituting an aromatic ring or an alicyclic is substituted with at least one hetero atom selected from the group consisting of N, O, S and P.

As used herein, the term "aromatic group" or "hetero aromatic group" may include monocyclic rings, monocyclic rings linked covalently to each other via a bond, or fused-ring polycyclic groups. As an example, a $C_6$-$C_{30}$ aromatic group may include, but is not limited to, a $C_6$-$C_{30}$ aryl, a $C_7$-$C_{30}$ aryl alkyl, a $C_6$-$C_{30}$ aryloxy, a $C_6$-$C_{30}$ aryl amino, a $C_7$-$C_{30}$ aryl ester and a $C_8$-$C_{30}$ vinyl aryl.

For example, a $C_6$-$C_{30}$ aromatic group or a $C_6$-$C_{30}$ aryl may be, but is not limited to, an unfused or fused aryl group such as phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl or spiro-fluorenyl.

A $C_3$-$C_{30}$ hetero aromatic group may include, but is not limited to, a $C_3$-$C_{30}$ hetero aryl, a $C_4$-$C_{30}$ hetero aryl alkyl, a $C_3$-$C_{30}$ hetero aryloxy, a $C_3$-$C_{30}$ aryl amino, a $C_4$-$C_{30}$ hetero aryl ester and a $C_4$-$C_{30}$ hetero vinyl aryl.

For example, a $C_3$-$C_{30}$ hetero aromatic group or a $C_3$-$C_{30}$ hetero aryl group may include, but is not limited to, an unfused or fused hetero aryl group such as pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzofuro-dibenzo-furanyl, benzothieno-benzo-thiophenyl, benzothieno-dibenzo-thiophenyl, benzothieno-benzo-furanyl, benzothieno-dibenzo-furanyl, xanthene-linked spiro acridinyl, dihydroacridinyl substituted with at least one $C_1$-$C_{10}$ alkyl and N-substituted spiro fluorenyl. The unfused or fused aryl group may be substituted or unsubstituted.

As used herein, the term "alkyl amino", "alicyclic amino", "hetero alicyclic amino", "aromatic amino" and "hetero aromatic amino" refers to a group represented by the formula —NH(-alkyl) or —N(-alkyl)$_2$, —NH(-alicyclic group) or —N(-alicyclic group)$_2$, —NH(-hetero alicyclic group) or —N(-hetero alicyclic group)$_2$, NH(-aromatic group) or —N(-aromatic group)$_2$, —NH(-hetero aromatic group) or —N(-hetero aromatic group)$_2$, As an example, alkyl amino represented by the formula —NH(-alkyl) include, but is not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl)amino group, hexylamino group, and the like. Examples of alkyl amino represented by the formula —N(-alkyl)$_2$ include, but not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N ethyl-N-propylamino group and the like.

The $C_6$-$C_{20}$ aromatic ring and/or the $C_3$-$C_{20}$ hetero aromatic ring, each of which can be formed by two adjacent $R^4$ and/or two adjacent $R^5$ in Formula 2, two adjacent $R^7$, and/or $R^8$ and $R^9$ in Formula 4, is not limited a specific ring. For example, the $C_6$-$C_{20}$ aromatic ring and/or the $C_3$-$C_{20}$ hetero aromatic ring, each of which can be formed by two adjacent $R^4$ and/or two adjacent $R^5$ in Formula 2, two adjacent $R^7$, and/or $R^8$ and $R^9$ in Formula 4 may include a benzene ring, a naphthalene ring, an anthracene ring, a phenanthrene ring, an indene ring, a fluorene ring, a pyridine ring, a pyrimidine ring, a triazine ring, a quinoline ring, an indole ring, a benzo-furan ring, a benzo-thiophene ring, a dibenzo-furan ring, a dibenzo-thiophene ring and/or combination thereof, each of which may be independently unsubstituted or substituted.

In one example embodiment, the $C_6$-$C_{20}$ aromatic ring and/or the $C_3$-$C_{20}$ hetero aromatic ring, each of which can be formed by two adjacent $R^4$ and/or two adjacent $R^5$ in Formula 2, two adjacent $R^7$, and/or $R^8$ and $R^9$ in Formula 4, may be a hetero aromatic ring, for example, a fused hetero aromatic ring with two or more rings unsubstituted or substituted. As an example, the $C_3$-$C_{20}$ hetero aromatic ring which can be formed by two adjacent $R^4$ and/or two adjacent $R^5$ in Formula 2, two adjacent $R^7$, and/or $R^8$ and $R^9$ in Formula 4, may include, but is not limited to, an indole ring, a benzo-furan ring, a benzo-thiophene ring and combination thereof, each of which may be independently unsubstituted or substituted.

As an example, the hetero aromatic moiety having the structure of Formula 2 or Formula 3, which acts as an electron donor, may include, but is not limited to, an indeno-carbazolyl moiety, an indolo-carbazolyl moiety, a benzofuro-carbazolyl moiety and/or a benzothieno-carbazolyl moiety.

For example, the $C_3$-$C_{20}$ alicyclic group, the $C_3$-$C_{20}$ hetero alicyclic group, the $C_6$-$C_{30}$ aromatic group, the $C_3$-$C_{30}$ hetero aromatic group, the $C_6$-$C_{30}$ aromatic ring and the $C_3$-$C_{30}$ hetero aromatic ring, each of which can be $R^1$ to $R^9$ or be formed by $R^1$ to $R^9$ in Formulae 1 to 4, respectively, may be independently unsubstituted or substituted with at least one selected from a group consisting of a $C_1$-$C_{10}$ alkyl (e.g. a $C_1$-$C_5$ alkyl such as t-butyl), a $C_6$-$C_{30}$ aryl (e.g. a $C_6$-$C_{15}$ aryl such as phenyl), a $C_3$-$C_{30}$ hetero aryl (e.g. a $C_3$-$C_{15}$ hetero aryl such as pyridyl) and a $C_6$-$C_{20}$ aryl amino (e.g. diphenyl amino).

The fused ring including the boron atom and the oxygen atom in Formula 1 acts as an electron acceptor moiety, and the fused hetero aromatic ring having at least one nitrogen atom of Formula 2 or Formula 3 acts as an electron donor moiety. Accordingly, the organic compound having the structure of Formula 1 has delayed fluorescent property.

Particularly, since the electron donor moiety and the electron acceptor moiety are linked via a carbon-carbon bond with strong bonding energy, the first compound has beneficial thermal stability. Accordingly, the electron acceptor moiety and the electron donor moiety linked by a carbon-carbon bond with high dissociation energy can maintain its stable molecular conformation when the first compound DF is emitted. In addition, rotation of the electron donor and acceptor moieties is restricted, and a large steric hindrance is induced between the electron donor and electron acceptor moieties owing to the stable carbon-carbon bond, As a result, the triplet excitons can be upwardly converted to its singlet excitons in the first compound DF having the structure of Formula 1 by RISC. The first compound DF with delayed fluorescent properties has beneficial luminous efficiency. Particularly, when the first compound DF and the second compound FD are used together, it is possible to realize hyper-fluorescence with improved luminous properties as the exciton energy is transferred rapidly to the second compound FD from the first compound DF.

In one example embodiment, each of $R^1$ and $R^2$ in Formula 1 may be independently a hydrogen atom, one of $X^1$ $X^4$ in Formula 2 may be a carbon atom linked to the hetero ring having the boron atom and the oxygen atom and other of $X^1$ to $X^4$ in Formula 2 may be independently $CR^4$.

As an example, each of $R^1$ and $R^2$ in Formula 1 may be independently a hydrogen atom and D in Formula 1 may be an moiety having the following moiety of Formula 5:

[Formula 5]

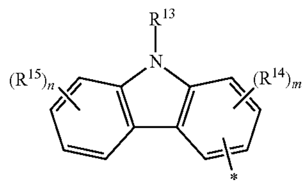

where in the Formula 5, $R^{13}$ is an unsubstituted or substituted $C_6$-$C_{30}$ aryl or an unsubstituted or substituted $C_3$-$C_{30}$ hetero aryl;

each of $R^{14}$ and $R^{15}$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl amino, an unsubstituted or substituted $C_6$-$C_{30}$ aromatic group or an unsubstituted or substituted $C_3$-$C_{30}$ hetero aromatic group, each $R^{14}$ is different from or identical to each other when m is 2 or more, and each $R^{15}$ is different from or identical to each other when n is 2 or more, optionally, two adjacent $R^{14}$ when m is 2 or more and/or two adjacent $R^{15}$ when n is 2 or more are linked together to form an unsubstituted or substituted $C_6$-$C_{20}$ aromatic ring or an unsubstituted or substituted $C_3$-$C_{20}$ hetero aromatic ring;

m is 0, 1, 2 or 3;

n is 0, 1, 2, 3 or 4; and the asterisk indicates a link position.

As an example, each of the $C_6$-$C_{30}$ aryl, the $C_3$-$C_{30}$ hetero aryl, the $C_6$-$C_{20}$ aromatic ring and the $C_3$-$C_{20}$ hetero aromatic ring, each of which can be $R^{13}$ to $R^{15}$ or be formed by $R^{13}$ to $R^{15}$ in Formula 5, may be independently unsubstituted or substituted with at least one of a $C_1$-$C_{20}$ alkyl, a $C_6$-$C_{30}$ aryl, a $C_3$-$C_{30}$ hetero aryl, a $C_6$-$C_{30}$ aryl amino and a $C_3$-$C_{30}$ hetero aryl amino, but is not limited thereto.

When the electron donor moiety of the first compound DF includes the structure of Formula 5, the thermal resistance of the first compound may be further enhanced with the 5-membered ring structure. As an example, the first compound DF having the Formulae 1 to 5 may include, but is not limited to, any organic compound having the following structure of Formula 6:

[Formula 6]

1-1

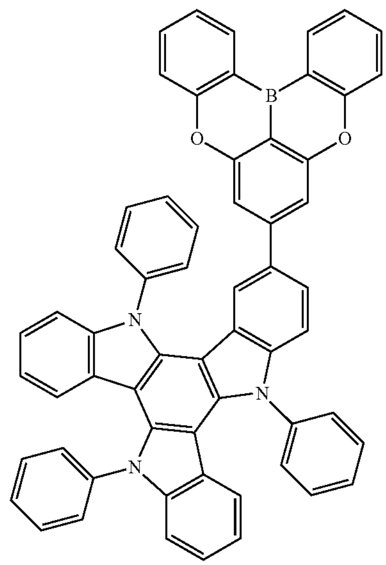

1-2

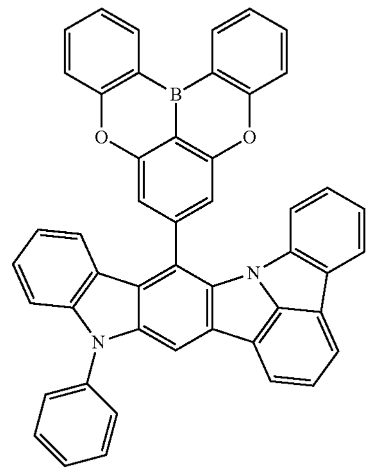

1-3

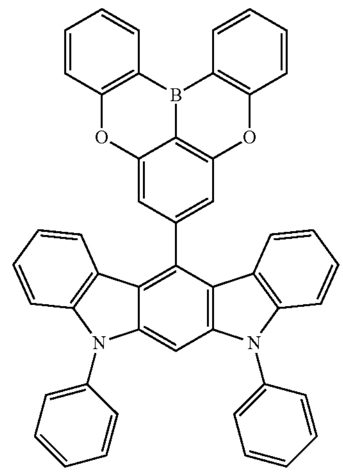

-continued
1-4
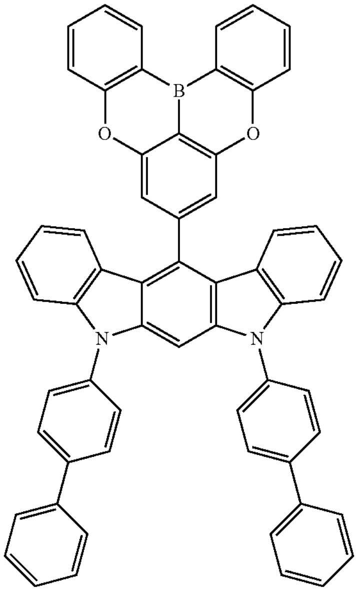
1-5
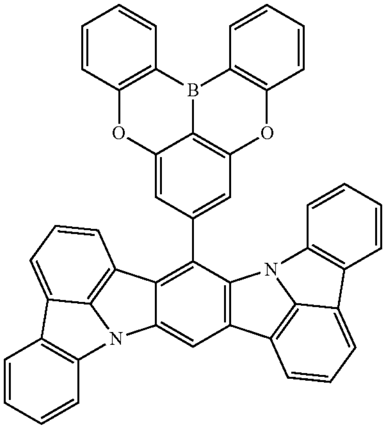
1-6
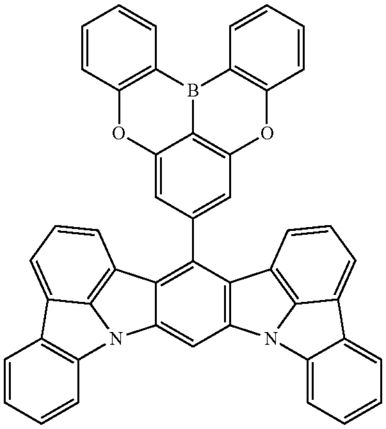
-continued
1-7
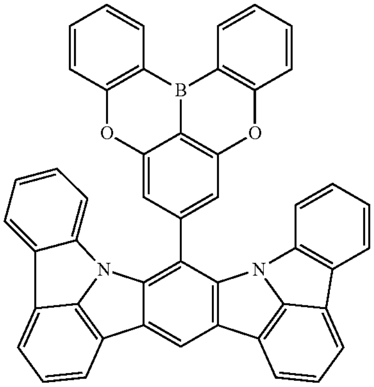
1-8
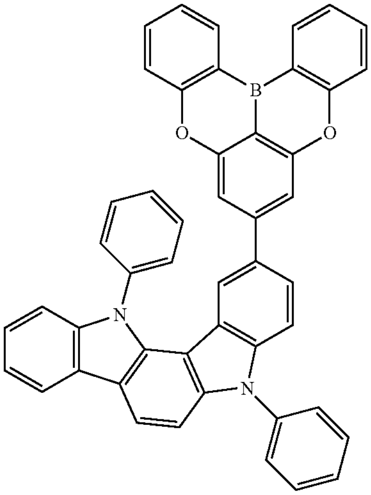
1-9
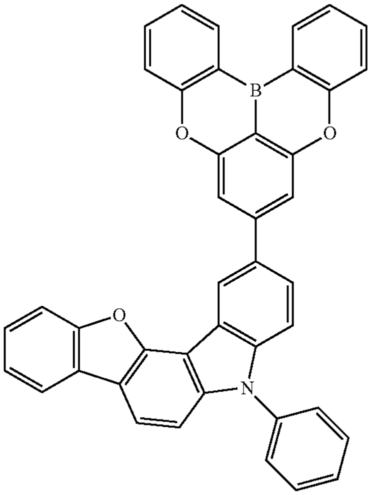

-continued
1-10
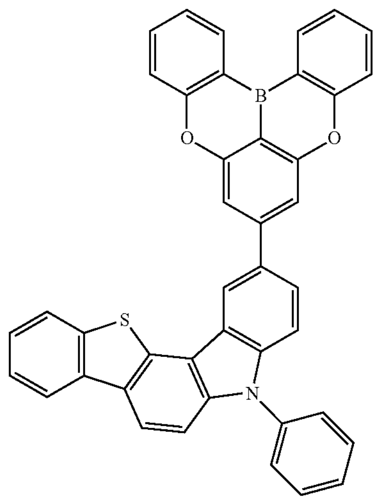
1-11
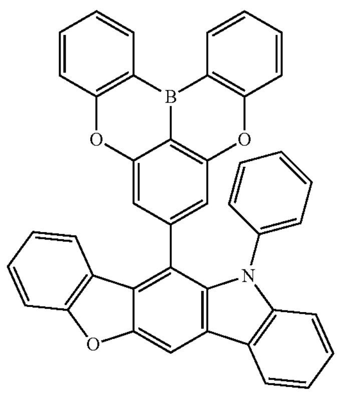
1-12
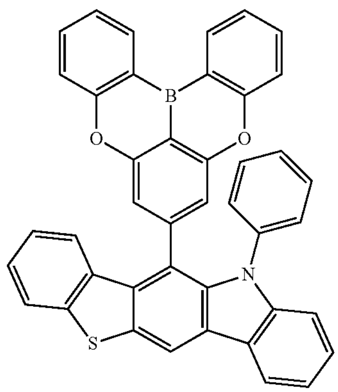
-continued
1-13
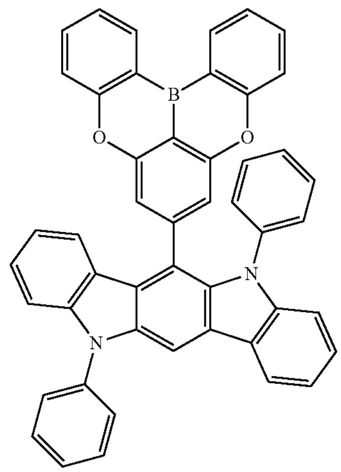
1-14
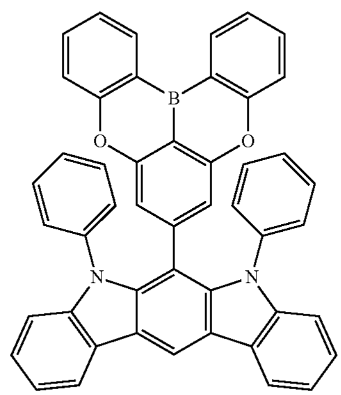
1-15
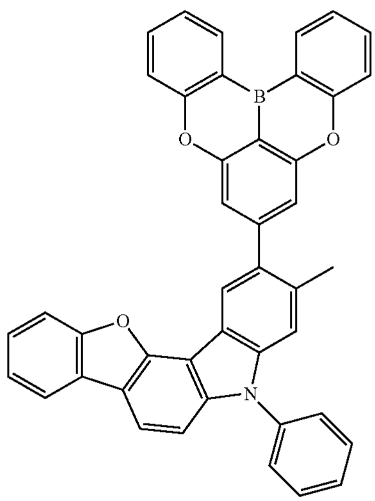

-continued 1-16

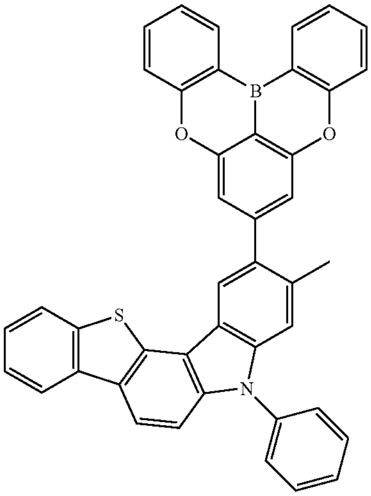

1-17

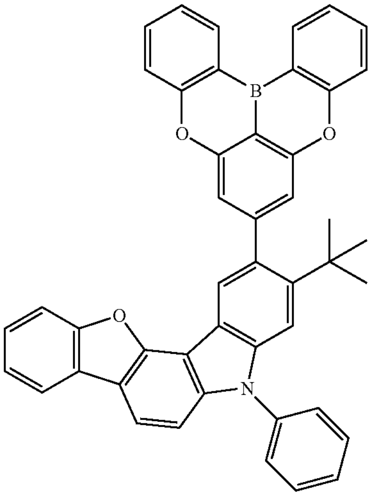

1-18

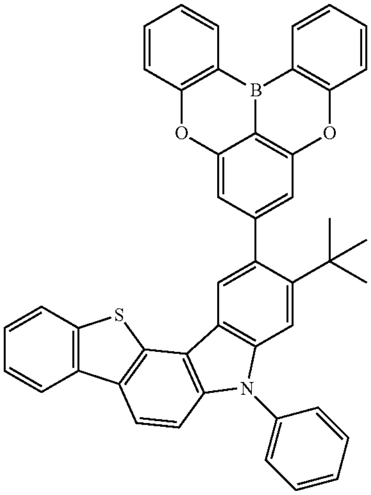

The first compound DF of the delayed fluorescent material has very narrow energy level bandgap $\Delta E_{ST}^{DF}$ (e.g. less than or equal to about 0.3 eV, FIG. 7) between a singlet energy level $S_1^{DF}$ and a triplet energy level $T_1^{DF}$ and has beneficial quantum efficiency because the triplet exciton energy of the first compound DF can be converted to its singlet exciton energy by RISC mechanism.

However, the first compound DF having the structure of Formulae 1 to 6 has a distorted chemical conformation owing to the electron acceptor moiety and the electron donor moiety. In addition, the first compound DF requires addition charge transfer transition (CT transition) because of utilizing triplet excitons. The first compound DF having the structure of Formulae 1 to 6 has very wide FWHM (full-width at half maximum) owing to the luminescence property caused by the CT luminous mechanism, thus its color purity is very limited.

In addition, a part of exciton energy at the singlet energy level $S_1^{DF}$ of the first compound DF is converted to its triplet energy level $T_1^{DF}$ by ISC (Inter System Crossing), and as a result, triplet excitons that are not converted upwardly to its singlet energy level $S_1^{DF}$ and resident at the triplet energy level $T_1^{DF}$ are generated. As those triplet excitons interact with peripheral triplet excitons and/or polarons, they are quenched by TTA (triplet-triplet annihilation) or TPA (triplet-polaron annihilation). In other words, when the EML 240 only includes the first compound DF, the triplet exciton energy of the first compound DF cannot contribute to the emissions. In addition, the luminous lifespan of the OLED D1 may be reduced owing to the quenching such as TTA and/or TPA.

The EML 240 includes the second compound FD of the fluorescent material in order to maximize the luminous property of the first compound DF of the delayed fluorescent material and to implement hyper fluorescence. As described above, the first compound DF of the delayed fluorescent material can utilize the triplet exciton energy as well as the singlet exciton energy. When the EML 240 includes the second compound FD of the fluorescent material having proper energy levels compared to the first compound DF of the delayed fluorescent material, the exciton energy emitted from the first compound DF is absorbed by the second compound FD, and then the exciton energy absorbed by the second compound FD generates 100% singlet exciton with maximizing its luminous efficiency.

The singlet exciton energy of the first compound DF of the delayed fluorescent material, which includes the singlet exciton energy of the first compound DF up-converted from its own triplet exciton energy as well as initial singlet exciton energy in the EML 240, is transferred to the second compound FD of the fluorescent material in the same EML 240 via Forster resonance energy transfer (FRET) mechanism, and the ultimate emission is occurred at the second compound FD. A compound having an absorption spectrum widely overlapped with a photoluminescence (PL) spectrum of the first compound DF may be used as the second compound FD so that the exciton energy generated at the first compound DF may be efficiently transferred to the second compound FD. The second compound FD, which emits ultimately, has narrow FWHM and beneficial luminous lifetime, and thus the color purity and the luminous lifetime of the luminescent diode can be improved.

The second compound FD in the EML 240 may be blue fluorescent material. For example, the second compound FD in the EML 240 may be a boron-based compound with its FWHM equal to or less than about 35 nm. As an example, the second compound FD of the boron-based fluorescent material may have the following structure of Formula 6:

[Formula 7]

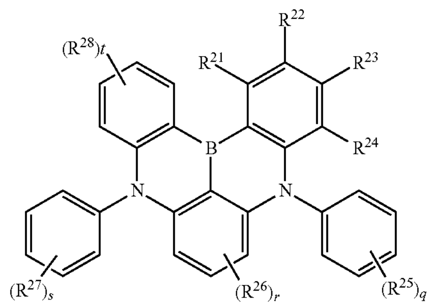

where in the Formula 7, each of $R^{21}$ to $R^{24}$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl silyl, an unsubstituted or substituted $C_1$-$C_{20}$ alkyl amino, an unsubstituted or substituted $C_6$-$C_{30}$ aromatic group or an unsubstituted or substituted $C_3$-$C_{20}$ hetero aromatic group, optionally, two adjacent groups among $R^{21}$ to $R^{24}$ are linked together to form an unsubstituted or substituted fused ring having a boron atom and a nitrogen atom;

each of $R^{25}$ to $R^{28}$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl silyl, an unsubstituted or substituted $C_1$-$C_{20}$ alkyl amino, an unsubstituted or substituted $C_6$-$C_{30}$ aromatic group or an unsubstituted or substituted $C_3$-$C_{20}$ hetero aromatic group, each $R^{25}$ is different from or identical to each other when q is 2 or more, each $R^{26}$ is different from or identical to each other when r is 2 or more, each $R^{27}$ is different from or identical to each other when s is 2 or more and each $R^{28}$ is different from or identical to each other when t is 2 or more;

each of q and s is independently 0, 1, 2, 3, 4 or 5;

r is 0, 1, 2 or 3; and t is 0, 1, 2, 3 or 4.

As an example, each of the $C_6$-$C_{30}$ aromatic group and the $C_3$-$C_{30}$ hetero aromatic group each of which can be $R^{21}$ to $R^{28}$ in Formula 7, and the fused ring formed by two adjacent groups among $R^{21}$ to $R^{24}$ in Formula 7 may be independently unsubstituted or substituted with at least one of a deuterium, a tritium, a $C_1$-$C_{20}$ alkyl, a $C_6$-$C_{30}$ aryl, a $C_3$-$C_{30}$ hetero aryl, a $C_6$-$C_{30}$ aryl amino and a $C_3$-$C_{30}$ hetero aryl amino, but is not limited thereto.

Similarly to Formulae 1 to 4, the $C_6$-$C_{30}$ aromatic group, each of which can be $R^{21}$ to $R^{28}$ in Formula 7, may include, but is not limited to, a $C_6$-$C_{30}$ aryl, a $C_7$-$C_{30}$ aryl alkyl, a $C_6$-$C_{30}$ aryloxy and a $C_6$-$C_{30}$ aryl amino group. In addition, the $C_3$-$C_{30}$ hetero aromatic group, each of which can be $R^{21}$ to $R^{28}$ in Formula 7 may include, but is not limited to, a $C_3$-$C_{30}$ hetero aryl, a $C_4$-$C_{30}$ hetero aryl alkyl, a $C_6$-$C_{30}$ hetero aryloxy and a $C_6$-$C_{30}$ hetero aryl amino group.

The boron-based compound having the structure of Formula 7 has very beneficial luminous property. The boron-based compound having the structure of Formula 7 has a very wide plate-like structure so that it can receive efficiently the exciton energy emitted from the first compound DF, and therefore, can maximize the luminous efficiency in the EML 240.

In one example embodiment, $R^{21}$ to $R^{24}$ in Formula 7 may not be linked to each other. Alternatively, $R^{22}$ and $R^{23}$ in Formula 7 are linked together to form a fused ring with at least one boron atom and at least one nitrogen atom. For example, the second compound FD may include a boron-based compound having the following structure of Formula 8A, Formula 8B or Formula 8C:

[Formula 8A]

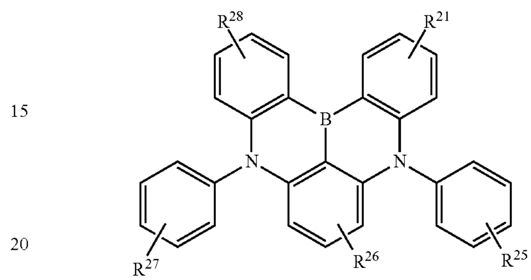

[Formula 8B]

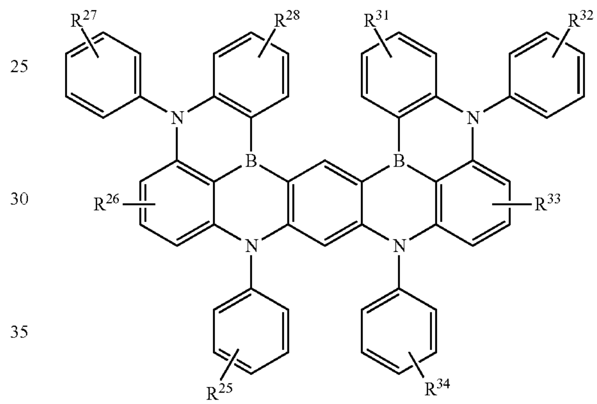

[Formula 8C]

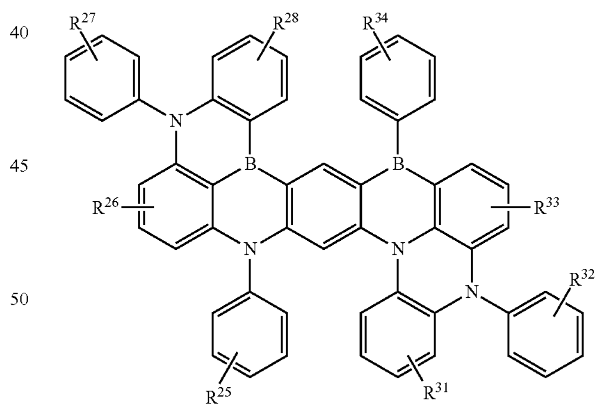

where in the Formulae 8A to 8C, each of $R^{21}$, $R^{25}$ to $R^{28}$ and $R^{31}$ to $R^{34}$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl silyl, an unsubstituted or substituted $C_1$-$C_{20}$ alkyl amino, an unsubstituted or substituted $C_6$-$C_{30}$ aryl or an unsubstituted or substituted $C_3$-$C_{20}$ hetero aryl.

For example, each of the $C_6$-$C_{30}$ aryl and the $C_3$-$C_{30}$ hetero aryl, each of which can be independently each of $R^{21}$, $R^{25}$ to $R^{28}$ and $R^{31}$ to $R^{34}$ in Formulae 8A to 8C, may be independently unsubstituted or substituted with at least one of a deuterium, a tritium, a $C_1$-$C_{20}$ alkyl, a $C_6$-$C_{30}$ aryl, a $C_3$-$C_{30}$ hetero aryl, a $C_6$-$C_{30}$ aryl amino and a $C_3$-$C_{30}$ hetero aryl amino, but is not limited thereto.

In another example embodiment, the second compound DF of the boron-based organic compound may include, but is not limited to, the following organic compounds of Formula 9:

[Formula 9]

2-1

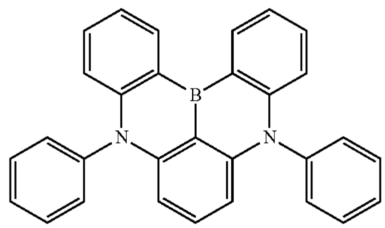

2-2

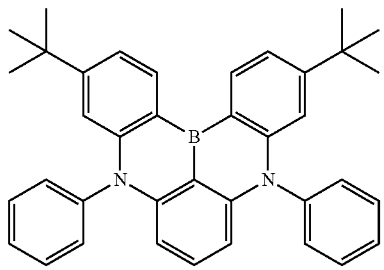

2-3

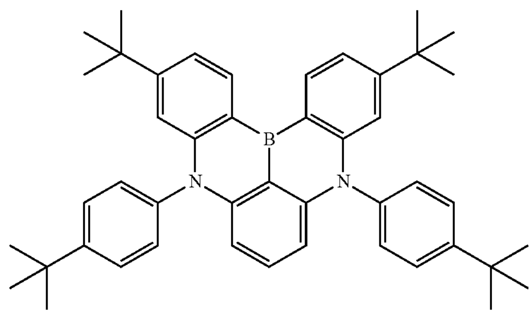

2-4

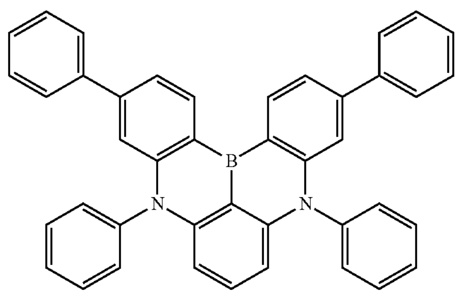

2-5

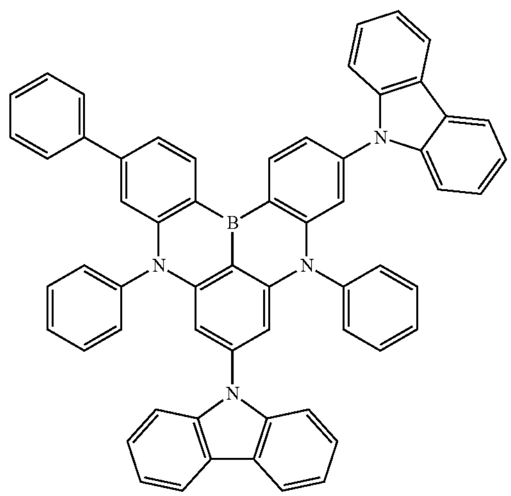

2-6

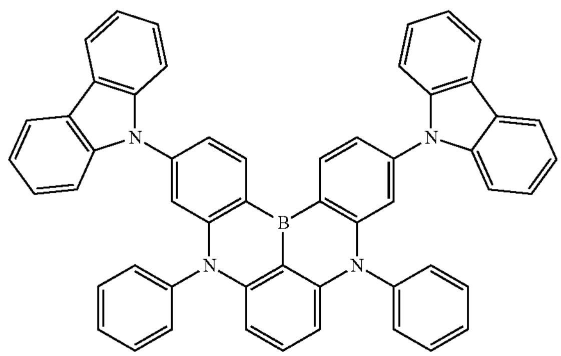

-continued
2-7
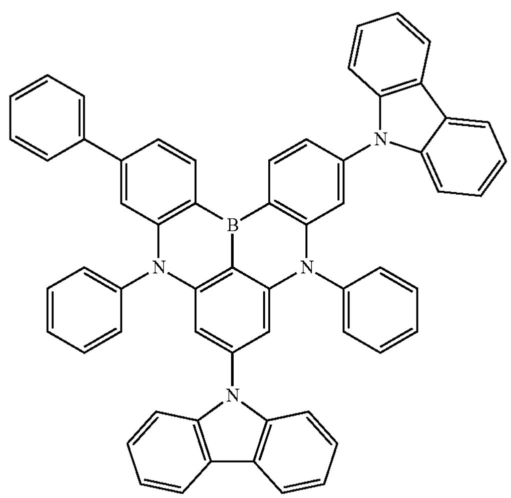
2-8
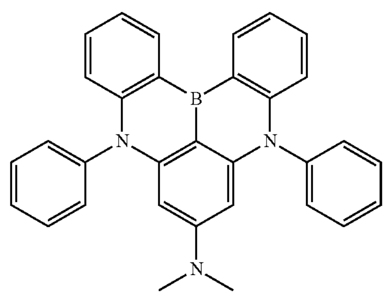
2-9
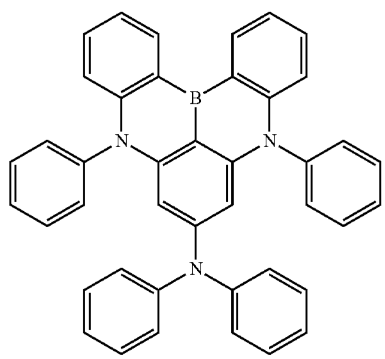
2-10
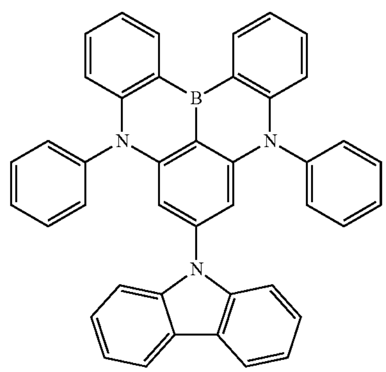
2-11
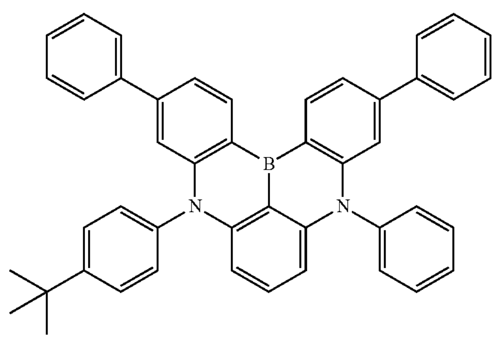
2-12
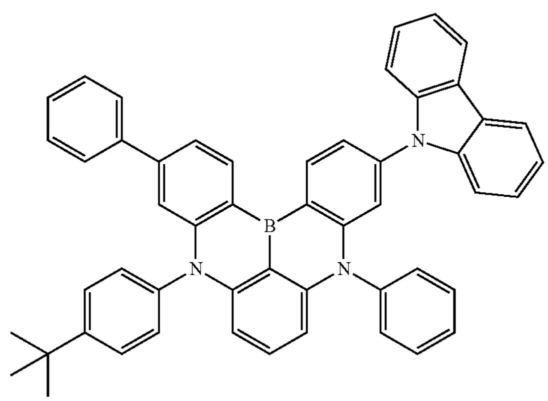

-continued
2-13
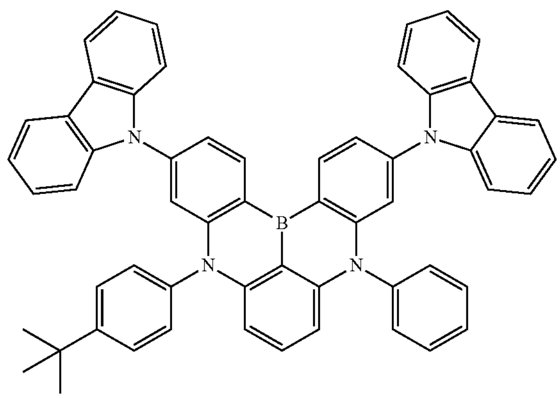
2-14
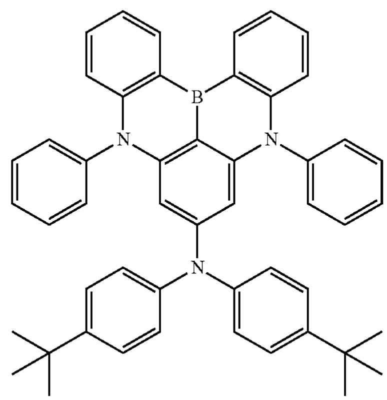
2-15
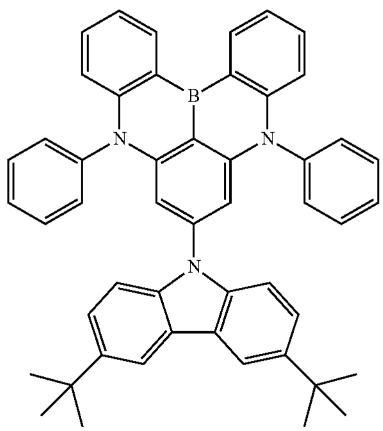
2-16
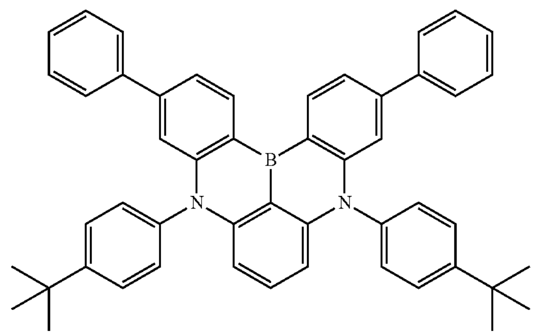
2-17
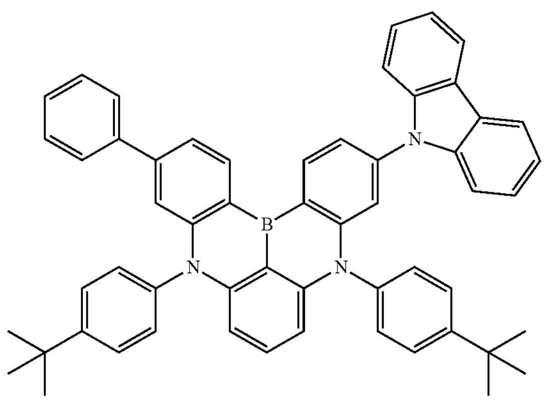
2-18
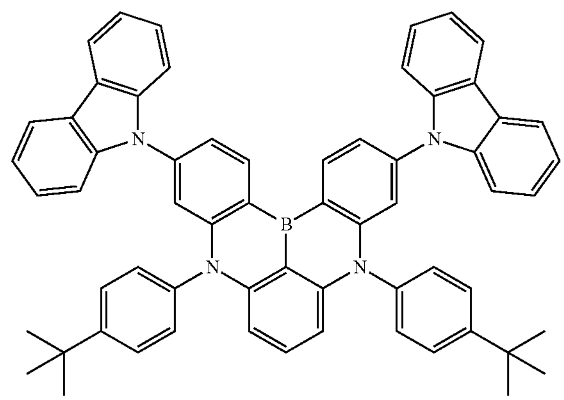
2-19
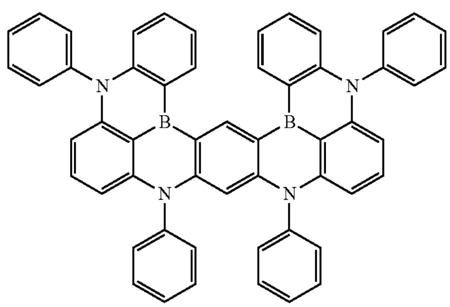
2-20
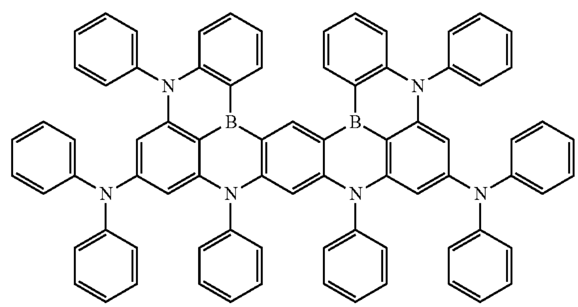

-continued
2-21
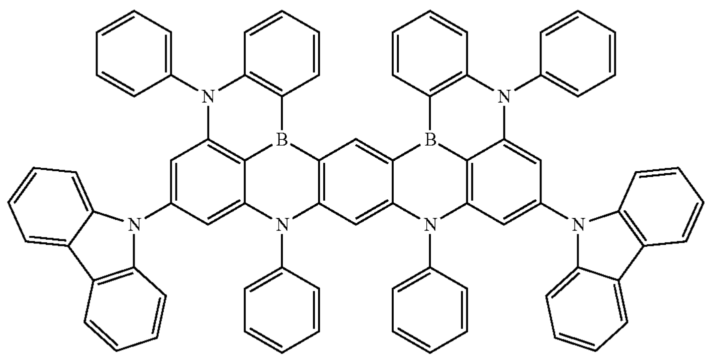
2-22
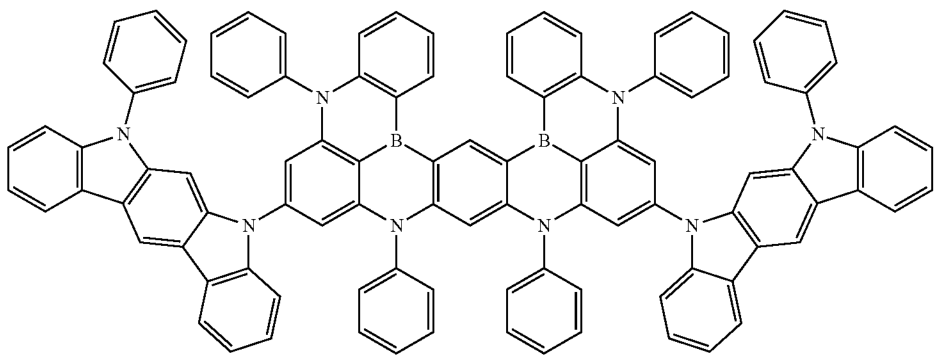
2-23
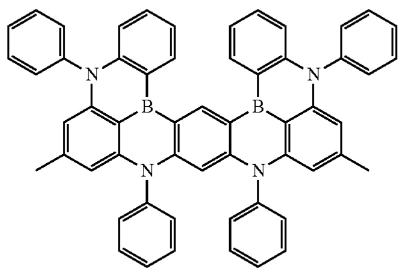
2-24
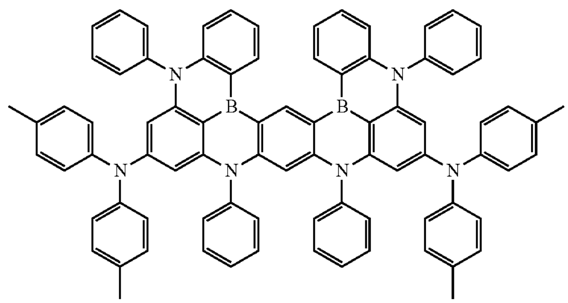
2-25
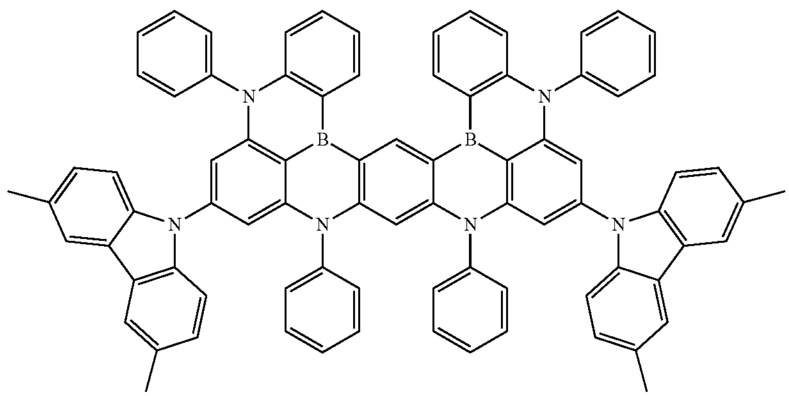

-continued
2-26
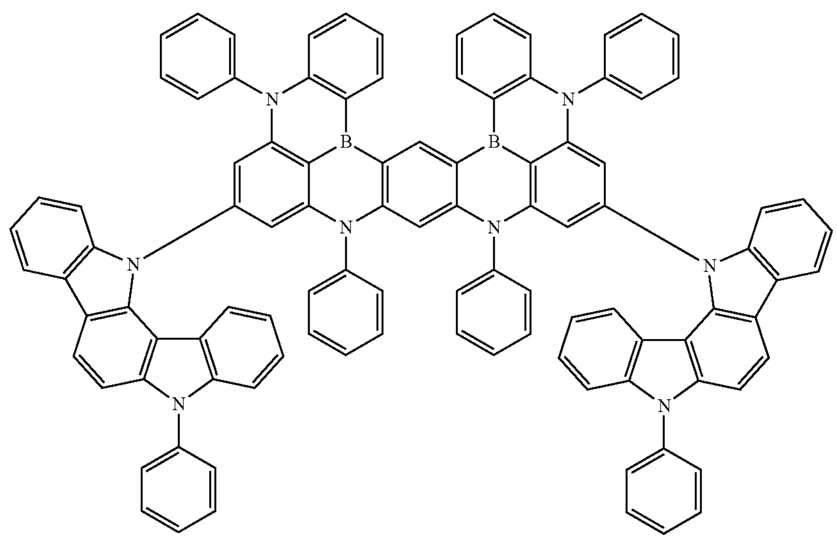
2-27
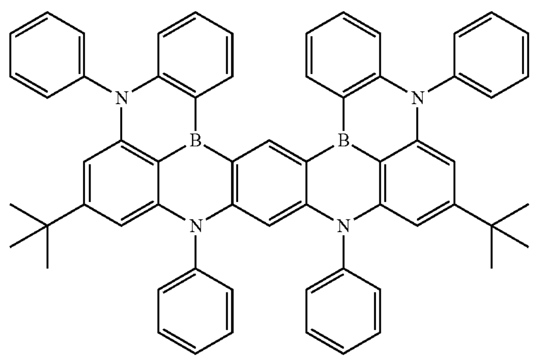
2-28
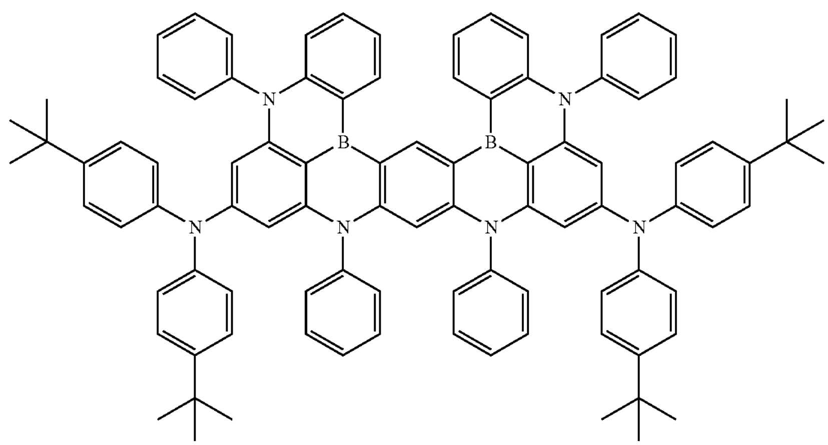

-continued
2-29
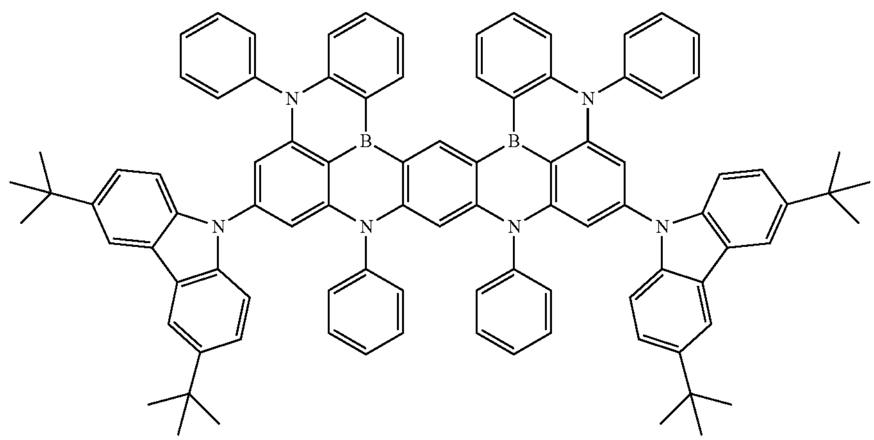
2-30
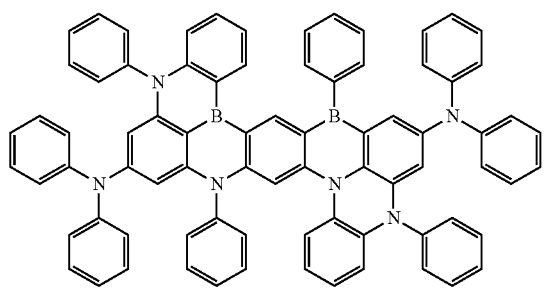
2-31
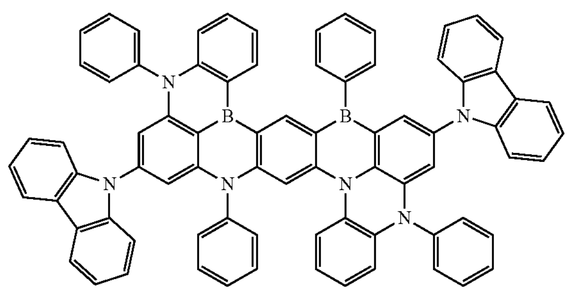
2-32
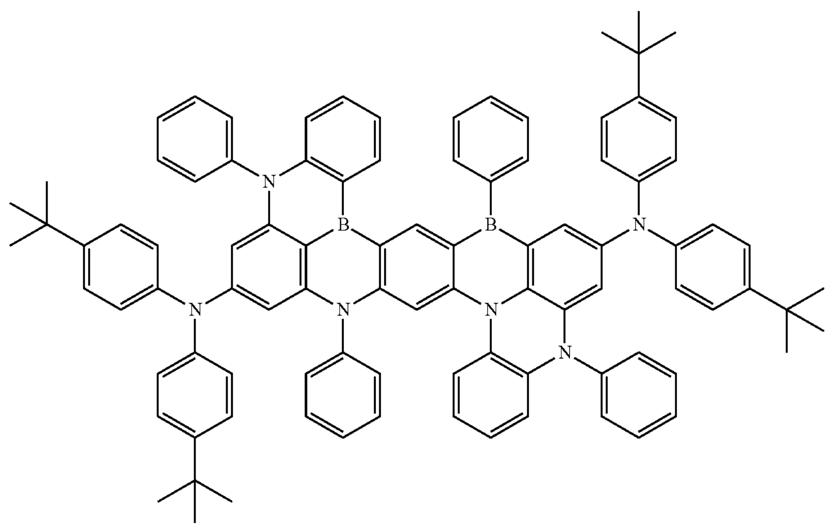

-continued 2-33

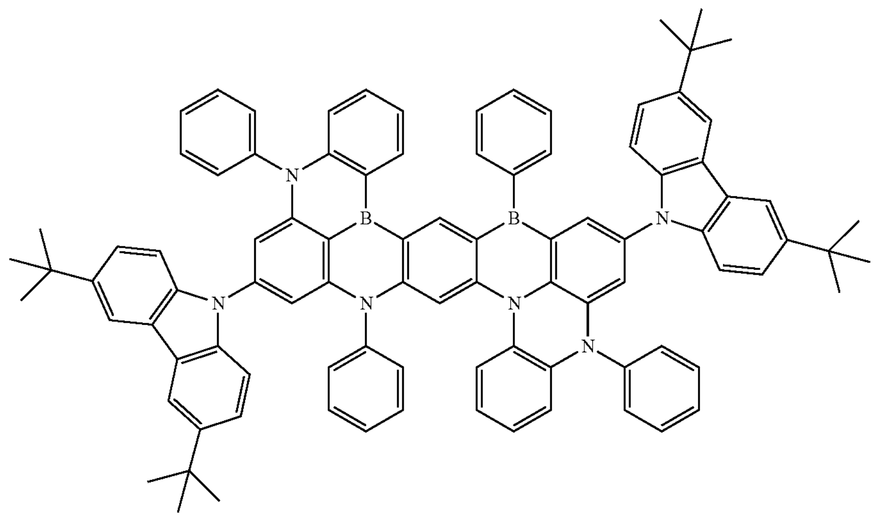

The third compound H, which can be included in the EML 240, may include any organic compound having wider energy level bandgap $E_g$ between HOMO energy level and LUMO energy level compared to the first compound DF and/or the second compound FD. When the EML 240 includes the third compound H of the host, the first compound DF may be a first dopant and the second compound FD may be a second dopant.

In an example embodiment, the third compound in the EML 240 may comprise, but is not limited to, 4,4'-bis(N-carbazolyl)-1,1'-biphenyl (CBP), 3,3'-bis(N-carbazolyl)-1,1'-biphenyl (mCBP), 1,3-Bis(carbazol-9-yl)benzene (mCP), 9-(3-(9H-carbazol-9-yl)phenyl)-9H-carbazole-3-carbonitrile (mCP-CN), Bis[2-(diphenylphosphino)phenyl] ether oxide (DPEPO), 2,8-bis(diphenylphosphoryl)dibenzothiophene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3',5'-Di(carbazol-9-yl)-[1,1'-bipheyl]-3,5-dicarbonitrile (DCzTPA), 4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), Diphenyl-4-triphenylsilylphenyl-phosphine oxide (TSPO1), 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole 9-(6-(9H-carbazol-9-yl)pyridin-3-yl)-9H-3,9'-bicabazole) and combination thereof.

In an example embodiment, when the EML 240 includes the first compound DF, the second compound FD and the third compound H, the contents of the third compound H may be larger than the contents of the first compound DF in the EML 240, and the contents of the first compound DF may be larger than the contents of the second compound FD in the EML 240. When the contents of the first compound DF is larger than the contents of the second compound FD, exciton energy can be effectively transferred from the first compound DF to the second compound FD via FRET mechanism. For example, the contents of the third compound H in the EML 240 may be about 55 wt % to about 85 wt %, the contents of the first compound DF in the EML 240 may be about 10 wt % to about 40 wt %, for example, about 10 wt % to about 30 wt %, and the contents of the second compound FD in the EML 240 may be about 0.1 wt 5% to about 5 wt %, for example, about 0.1 wt % to about 2 wt %, but is not limited thereto.

In an example embodiment, HOMO energy levels and/or LUMO energy levels among the third compound H of the host, the first compound DF of the delayed fluorescent material and the second compound FD of the fluorescent material must be properly adjusted. For example, the host must induce the triplet excitons generated at the delayed fluorescent material to be involved in the luminescence process without quenching as non-radiative recombination in order to implement hyper fluorescence. To this end, the energy levels among the third compound H of the host, the first compound DF of the delayed fluorescent material and the second compound FD of the fluorescent material should be adjusted.

FIG. 4 illustrate a schematic diagram that holes are transferred efficiently to the second compound by adjusting energy levels of luminous materials focusing the first compound and the second compound in the EML in accordance with an example embodiment of the present disclosure.

As illustrated in FIG. 4, the third compound H of the host may be designed to have the HOMO energy level $HOMO^H$ lower than the HOMO energy level $HOMO^{DF}$ of the first compound DF of the delayed fluorescent material, and to have the LUMO energy level $LUMO^H$ higher than the LUMO energy level $LUMO^{DF}$ of the first compound DF. In other words, the energy level bandgap between the HOMO energy level $HOMO^H$ and the LUMO energy level $LUMO^H$ of the third compound H may be wider than the energy level bandgap between the HOMO energy level $HOMO^{DF}$ and the LUMO energy level $LUMO^{DF}$ of the first compound DF.

As an example, an energy level bandgap ($|HOMO^H-HOMO^{DF}|$) between the HOMO energy level ($HOMO^H$) of the third compound H of the host and the HOMO energy level ($HOMO^{DF}$) of the first compound DF of the delayed fluorescent material, or an energy level bandgap ($|LUMO^H-LUMO^{DF}|$) between the LUMO energy level ($LUMO^H$) of the third compound H and the LUMO energy level ($LUMO^{DF}$) of the first compound DF may be equal to or less than about 0.5 eV, for example, between about 0.1 eV to about 0.5 eV. In this case, the charges can be transported efficiently from the third compound H to the first compound DF and thereby enhancing the ultimate luminous efficiency in the OLED D1.

In one example embodiment, the energy level bandgap ΔHOMO-1 between the HOMO energy level $HOMO^{DF}$ of the first compound DF and the HOMO energy level $HOMO^{FD}$ of the second compound FD satisfies the following relationship in Equation (1):

$$|HOMO^{FD} - HOMO^{DF}| < 0.3\ \text{eV} \tag{1}$$

When the energy level bandgap ΔHOMO-1 between the HOMO energy level $HOMO^{DF}$ of the first compound DF and the HOMO energy level $HOMO^{FD}$ of the second compound FD satisfies the relationship in Equation (1), holes injected into the EML 240 may be transferred rapidly to the first compound DF. Accordingly, the first compound DF can utilize both the initial singlet exciton energy and the singlet exciton energy up-converted from its triplet exciton energy by RISC mechanism so that it can implement 100% of internal quantum efficiency and can transfer efficiently its exciton energy to the second compound FD. As an example, the HOMO energy level $HOMO^{DF}$ of the first compound DF and the HOMO energy level $HOMO^{FD}$ of the second compound FD may satisfy the following relationship in Equation (2):

$$|HOMO^{FD} - HOMO^{DF}| \leq 0.2\ \text{eV} \tag{2}$$

In another example embodiment, the LUMO energy level $LUMO^{DF}$ of the first compound DF may be higher than or equal to the LUMO energy level $LUMO^{FD}$ of the second compound FD. As an example, the LUMO energy level $LUMO^{DF}$ of the first compound DF and the LUMO energy level $LUMO^{FD}$ of the second compound FD may satisfy the following relationship in Equation (3):

$$0 \leq LUMO^{DF} - LUMO^{FD} \leq 0.5\ \text{eV} \tag{3}$$

When the LUMO energy level $LUMO^{DF}$ of the first compound DF and the LUMO energy level $LUMO^{FD}$ of the second compound FD satisfy the relationship in Equation (3), electrons injected into the EML 240 can be transferred rapidly to the first compound DF. As an example, the LUMO energy level $LUMO^{DF}$ of the first compound DF and the LUMO energy level $LUMO^{FD}$ of the second compound FD may satisfy the following relationship in Equation (4):

$$0 \leq LUMO^{DF} - LUMO^{FD} \leq 0.2\ \text{eV} \tag{4}$$

As excitons can be recombined in the first compound DF of the delayed fluorescent material, the first compound DF can implement 100% of internal quantum efficiency using RISC mechanism. The singlet exciton energy including the initial singlet exciton energy and the up-converted singlet exciton energy generated at the first compound DF can be transferred to the second compound FD of the fluorescent material via FRET, and therefore, the second compound FD can realize efficient light emission.

As an example, the first compound DF may be designed, but is not limited to, to have the HOMO energy level $HOMO^{DF}$ between about −5.4 eV and −5.7 eV and to have the LUMO energy level $LUMO^{DF}$ between about −2.7 eV and −3.0 eV. The second compound FD may be designed, but is not limited to, to have the HOMO energy level $HOMO^{FD}$ between about −5.3 eV and about −5.7 eV and to have the LUMO energy level $LUMO^{FD}$ between about −2.7 eV and about −3.0 eV.

The energy level bandgap between the HOMO energy level $HOMO^{DF}$ and the LUMO energy level $LUMO^{DF}$ of the first compound DF may be wider than the energy level bandgap between the HOMO energy level $HOMO^{FD}$ and the LUMO energy level $LUMO^{FD}$ of the second compound FD. In an example embodiment, the first compound DF may have the energy level bandgap between the HOMO energy level $HOMO^{DF}$ and the LUMO energy level $LUMO^{DF}$ between about 2.6 eV and about 3.1 eV, for example, about 2.7 eV and about 3.0 eV. The second compound FD may have the energy level bandgap between the HOMO energy level $HOMO^{FD}$ and the LUMO energy level $LUMO^{FD}$ between about 2.4 eV and about 2.9 eV, for example, about 2.5 eV and about 2.8 eV. In this case, the exciton energy generated at the first compound DF can be transferred efficiently to the second compound FD, and then the second compound FD can emit light sufficiently.

Figure 5:
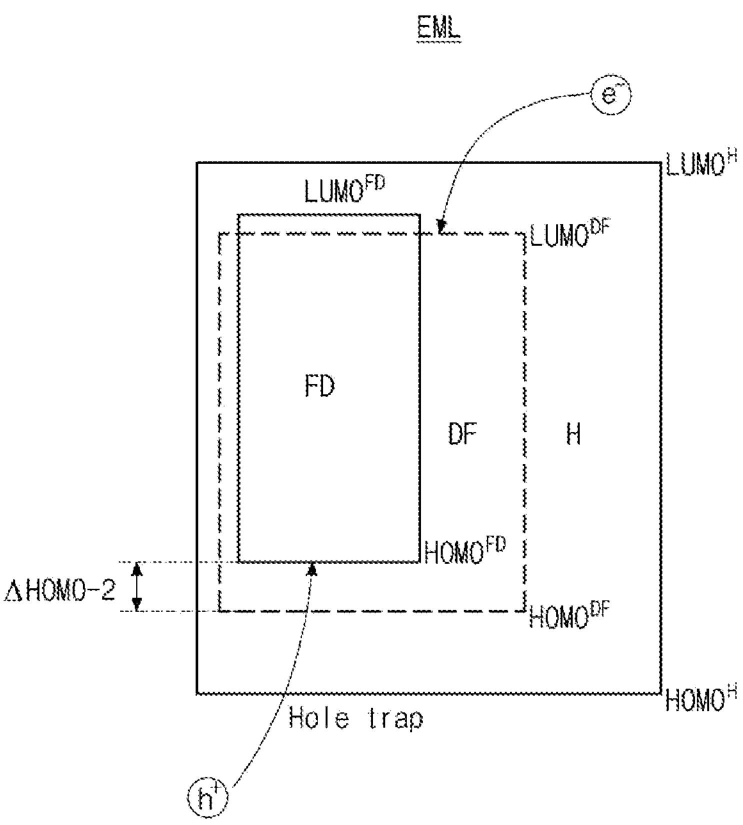
FIG. 5 illustrates a schematic diagram that holes are trapped at the second compound when HOMO energy levels of the first compound and the second compound in an emitting material layer are not adjusted.

FIG. 5 illustrates a schematic diagram that holes are trapped at the second compound when HOMO energy levels of the first compound and the second compound in an emitting material layer are not adjusted. As illustrated in FIG. 5, when an energy level bandgap ΔHOMO-2 between the HOMO energy level $HOMO^{DF}$ of the first compound DF and the HOMO energy level $HOMO^{FD}$ of the second compound FD is equal to or more than 0.3 eV, holes injected into the EML 240 are trapped at the second compound FD of the fluorescent material. In other words, holes injected into the EML 240 are not transferred to the first compound DF of the delayed fluorescent material from the third compound H of the host. Excitons are not formed in the first compound DF having beneficial luminous efficiency, but holes trapped at the second compound FD are directly recombined to form excitons and to emit light. Triplet exciton energy of the first compound DF cannot be involved in the luminous process, but is quenched as non-radiative recombination, thus causes the EML to decrease its luminous efficiency.

Figure 6:
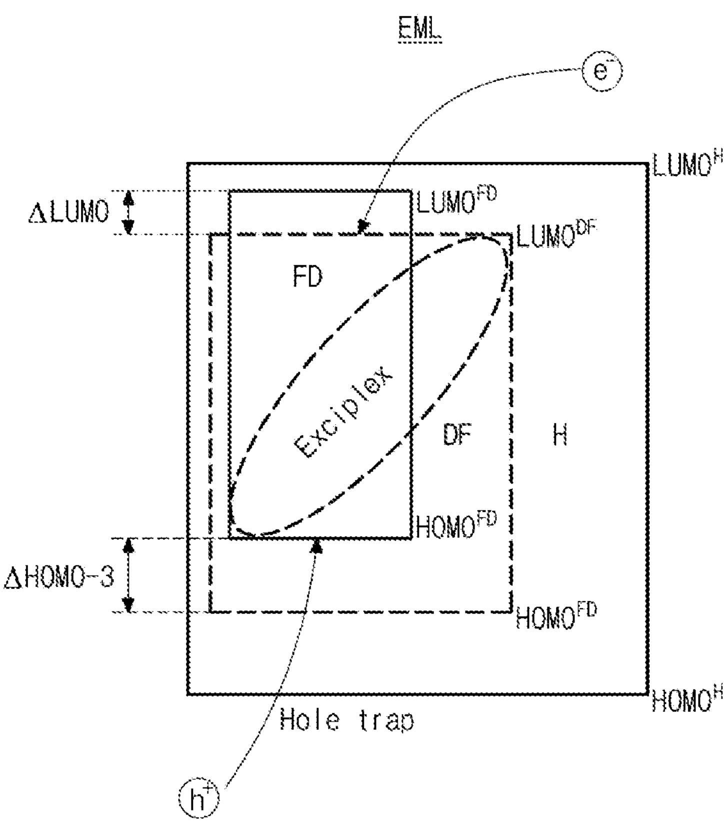
FIG. 6 illustrate a schematic diagram that hole are trapped at the second compound and exciplex between the first compound and the second compound is generated when HOMO energy levels and LUMO energy levels of the first compound and the second compound in an emitting material layers are not adjusted.

FIG. 6 illustrate a schematic diagram that hole are trapped at the second compound and exciplex between the first compound and the second compound is generated when HOMO energy levels and LUMO energy levels of the first compound and the second compound in an emitting material layers are not adjusted. As illustrated in FIG. 6, when an energy level bandgap ΔHOMO-3 between the HOMO energy level $HOMO^{DF}$ of the first compound DF and the HOMO energy level $HOMO^{FD}$ of the second compound FD is equal to or more than 0.5 eV, holes injected into the EML 240 are trapped at the second compound FD of the fluorescent material.

In addition, when the LUMO energy level $LUMO^{DF}$ of the first compound DF is lower than the LUMO energy level $LUMO^{FD}$ of the second compound FD (i.e., $LUMO^{FD}>LUMO^{DF}$), holes trapped at the second compound FD and electrons transferred to the first compound DF form an exciplex. Triplet exciton energy of the first compound DF is quenched as a non-radiative recombination, which causes the EML to decrease its luminous efficiency. In addition, as the energy level bandgap between the LUMO energy level and HOMO energy level forming the exciplex is too narrow, the EML emits light having longer wavelength. As both the first compound DF and the second compound FD emit simultaneously, the light emitted from the EML has wide FWHM and bad color purity.

Figure 7:
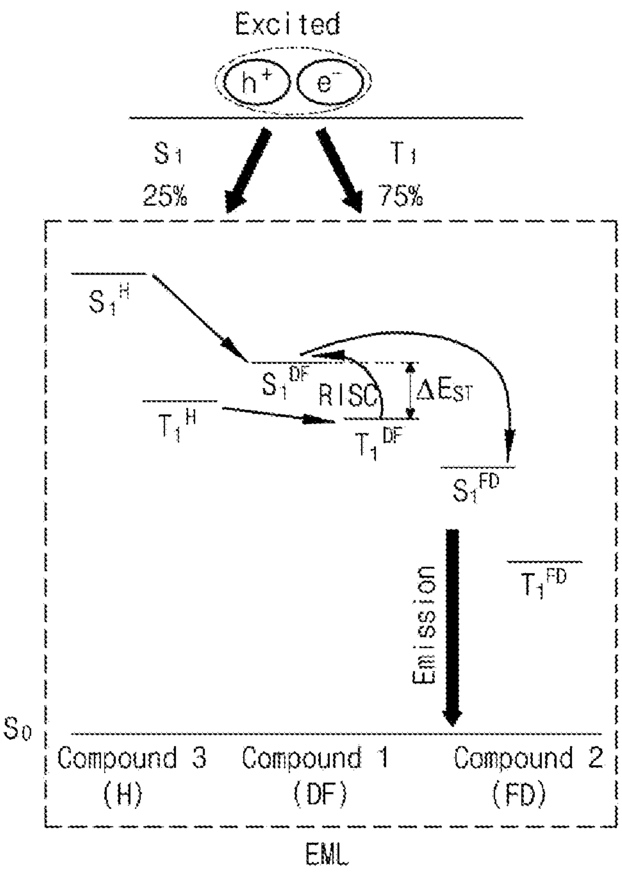
FIG. 7 illustrates a schematic diagram of luminous mechanism by singlet energy levels and triplet energy levels among luminous materials in the emitting material layer of the organic light emitting diode in accordance with an example embodiment of the present disclosure.

The luminous mechanism in the EML 240 in accordance with one example embodiment will be described in more detail. FIG. 7 illustrates a schematic diagram of luminous mechanism by singlet energy levels and triplet energy levels among luminous materials in the emitting material layer of the organic light emitting diode in accordance with an example embodiment of the present disclosure. As illustrated in FIG. 7, the singlet energy level $S_1^H$ of the third compound H, which can be the host in the EML 240, is higher than the singlet energy level $S_1^{DF}$ of the first compound DF having the delayed fluorescent property. In addition, the triplet energy level TH of the third compound H may be higher than the triplet energy level $T_1^{DF}$ of the first compound DF. As an example, the triplet energy level $T_1^H$ of the third compound H may be higher than the triplet energy level $T_1^{DF}$ of the first compound DF by at least about 0.2 eV, for example, at least about 0.3 eV such as at least about 0.5 eV.

When the triplet energy level $T_1^H$ and/or the singlet energy level $S_1^H$ of the third compound H is not high enough than the triplet energy level $T_1^{DF}$ and/or the singlet energy level $S_1^{DF}$ of the first compound DF, the exciton at the excited triplet energy level $T_1^{DF}$ of the first compound DF may be reversely transferred to the triplet energy level $T_1^H$ of the third compound H. In this case, the triplet exciton reversely transferred to the third compound H where the triplet exciton cannot be emitted is quenched as non-emission so that the triplet exciton energy of the first compound DF having the delayed fluorescent property cannot contribute to luminescence. The first compound DF having the delayed fluorescent property may have the energy level bandgap $\Delta E_{ST}^{DF}$ between the singlet energy level $S_1^{DF}$ and the triplet energy level $T_1^{DF}$ equal to or less than about 0.3 eV, for example, between about 0.05 eV and about 0.3 eV.

In addition, the singlet exciton energy, which is generated at the first compound DF of the delayed fluorescent material that is converted to ICT complex by RISC in the EML 240, should be efficiently transferred to the second compound FD of the fluorescent material so as to implement OLED D1 having high luminous efficiency and high color purity. To this end, the singlet energy level $S_1^{DF}$ of the first compound DF of the delayed fluorescent material is higher than the singlet energy level $S_1^{FD}$ of the second compound FD of the fluorescent material. Optionally, the triplet energy level $T_1^{DF}$ of the first compound DF may be higher than the triplet energy level $T_1^{FD}$ of the second compound FD.

Since the second compound FD can utilize both the singlet exciton energy and the triplet exciton energy of the first compound DF in the luminous process, the luminous efficiency of the OLED D1 can be maximized. In addition, since the quenching phenomena such as TTA or TTP is minimized in the luminous process, the luminous lifetime of the OLED D1 can be extremely improved.

Returning to FIG. 3, the HIL 250 is disposed between the first electrode 210 and the HTL 260 and improves an interface property between the inorganic first electrode 210 and the organic HTL 260. In one example embodiment, the HIL 250 may include, but is not limited to, 4,4'4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (IT-NATA), 4,4',4"-Tris(N-(naphthalene-2-yl)-N-phenyl-amino)triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl]benzene (TDAPB), poly(3,4-ethylenedioxythiphene)polystyrene sulfonate (PEDOT/PSS), N-(biphenyl-4-yl)-9,9-dimethyl-N-(4-(9-phenyl-9H-carbazol-3-yl)phenyl)-9H-fluoren-2-amine and combination thereof. The HIL 250 may be omitted in compliance with a structure of the OLED D1.

The HTL 260 is disposed between the HIL 250 and the EML 240. In one example embodiment, the HTL 260 may include, but is not limited to, N,N'-Diphenyl-N,N'-bis(3-methylphenyl)-1,1'-biphenyl-4,4'-diamine (TPD), NPB (NPD), CBP, Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-sec-butylphenyl)diphenylamine))] (TFB), Di-[4-(N,N-di-p-tolyl-amino)-phenyl]cyclohexane (TAPC), 3,5-Di(9H-carbazol-9-yl)-N, N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine and combination thereof.

The ETL 270 and the EIL 280 may be laminated sequentially between the EML 240 and the second electrode 230. The ETL 270 includes material having high electron mobility so as to provide electrons stably with the EML 240 by fast electron transportation. In one example embodiment, the ETL 270 may comprise, but is not limited to, any one of oxadiazole-based compounds, triazole-based compounds, phenanthroline-based compounds, benzoxazole-based compounds, benzothiazole-based compounds, benzimidazole-based compounds, triazine-based compounds, and the like.

More particularly, the ETL 270 may comprise, but is not limited to, tris-(8-hydroxyquinoline aluminum) ($Alq_3$), 2-biphenyl-4-yl-5-(4-t-butylphenyl)-1,3,4-oxadiazole (PBD), spiro-PBD, lithium quinolate (Liq), 1,3,5-Tris(N-phenylbenzimidazol-2-yl)benzene (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenanthroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ), TSPO1 and combination thereof.

The EIL 280 is disposed between the second electrode 230 and the ETL 270, and can improve physical properties of the second electrode 230 and therefore, can enhance the luminous lifespan of the OLED D1. In one example embodiment, the EIL 280 may comprise, but is not limited to, an alkali metal halide or an alkaline earth metal halide such as LiF, CsF, NaF, $BaF_2$ and the like, and/or an organic metal compound such as lithium quinolate, lithium benzoate, sodium stearate, and the like.

When holes are transferred to the second electrode 230 via the EML 240 and/or electrons are transferred to the first electrode 210 via the EML 240, the OLED D1 may have short lifetime and reduced luminous efficiency. In order to prevent these phenomena, the OLED D1 in accordance with this embodiment of the present disclosure may have an exciton blocking layer adjacent to the EML 240.

For example, the OLED D1 of the example embodiment includes the EBL 265 between the HTL 260 and the EML 240 so as to control and prevent electron transfers. In one example embodiment, the EBL 265 may comprise, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, N,N'-bis[4-(bis(3-methylphenyl)amino)phenyl]-N,N'-diphenyl-[1,1'-biphenyl]-4,4'-diamine (DNTPD), TDAPB, 3,6-bis(N-carbazolyl)-N-phenyl-carbazole and combination thereof.

In addition, the OLED D1 may further include the HBL 275 as a second exciton blocking layer between the EML 240 and the ETL 270 so that holes cannot be transferred from the EML 240 to the ETL 270. In one example embodiment, the HBL 275 may comprise, but is not limited to, any one of oxadiazole-based compounds, triazole-based compounds, phenanthroline-based compounds, benzoxazole-based compounds, benzothiazole-based compounds, benzimidazole-based compounds, and triazine-based compounds each of which can be used in the ETL 270.

For example, the HBL 275 may comprise a compound having a relatively low HOMO energy level compared to the HOMO energy level of the luminescent materials in EML 240. The HBL 275 may comprise, but is not limited to, BCP, BAlq, $Alq_3$, PBD, spiro-PBD, Liq, Bis-4,5-(3,5-di-3-pyridylphenyl)-2-methylpyrimidine (B3PYMPM), DPEPO, 9-(6-(9H-carbazol-9-yl)pyridine-3-yl)-9H-3,9'-bicarbazole and combination thereof.

Figure 8:
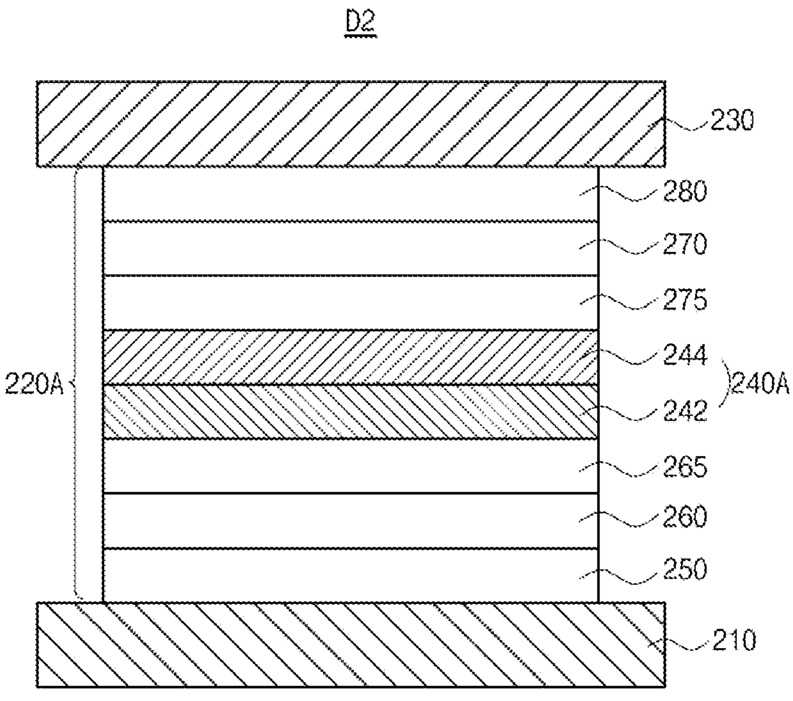
FIG. 8 illustrates a schematic cross-sectional view of an organic light emitting diode in accordance with another example embodiment of the present disclosure.
Figure 9:
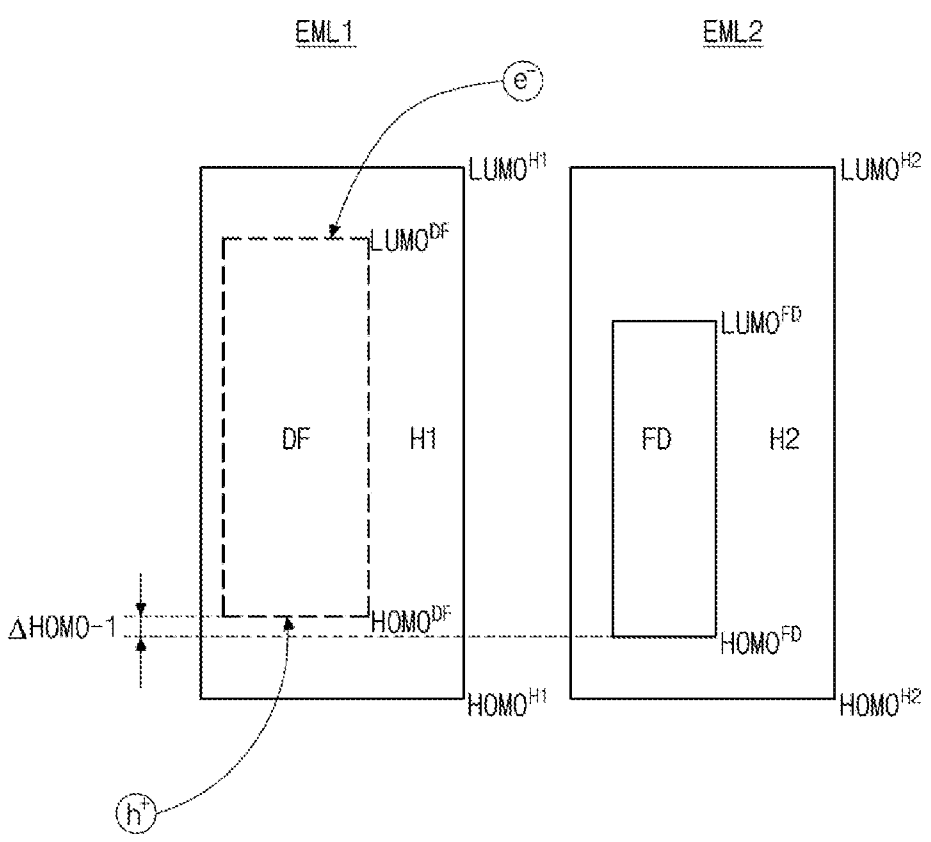
FIG. 9 illustrate a schematic diagram that holes are transferred efficiently to the second compound by adjusting energy levels of luminous materials focusing the first compound and the second compound in an emitting material layer in accordance with another example embodiment of the present disclosure.
Figure 10:
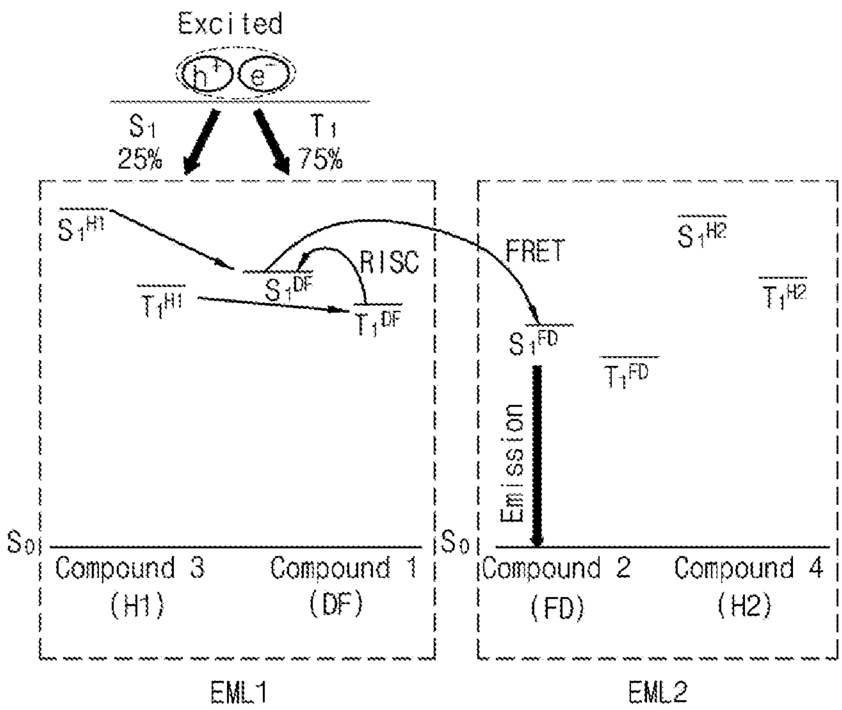
FIG. 10 illustrates a schematic diagram of luminous mechanism by singlet energy levels and triplet energy levels among luminous materials in the emitting material layer of the organic light emitting diode in accordance with another example embodiment of the present disclosure.

In the above first embodiment, the first compound having the delayed fluorescent property and the second compound having the fluorescent property are included within the same EML. Unlike the first embodiment, the first compound and the second compound are included in separate EMLs. FIG. 8 illustrates a schematic cross-sectional view of an organic light emitting diode in accordance with another example embodiment of the present disclosure. FIG. 9 illustrate a schematic diagram that holes are transferred efficiently to the second compound by adjusting energy levels of luminous materials focusing the first compound and the second compound in an emitting material layer in accordance with another example embodiment of the present disclosure. FIG. 10 illustrates a schematic diagram of luminous mechanism by singlet energy levels and triplet energy levels among luminous materials in the emitting material layer of the organic light emitting diode in accordance with another example embodiment of the present disclosure.

As illustrated in FIG. 8, the OLED D2 includes first and second electrodes 210 and 230 facing each other and an emissive layer 220A disposed between the first and second electrodes 210 and 230. The organic light emitting display device 100 (FIG. 2) includes a red pixel region, a green pixel region and a blue pixel region, and the OLED D2 may be disposed in the blue pixel region.

In one example embodiment, the emissive layer 220A comprises an EML 240A. The emissive layer 220A may comprise at least one of an HTL 260 disposed between the first electrode 210 and the EML 240A and an ETL 270 disposed between the second electrode 230 and the EML 240A.

Also, the emissive layer 220A may further comprise at least one of an HIL 250 disposed between the first electrode 210 and the HTL 260 and an EIL 280 disposed between the ETL 270 and the second electrode 230. Alternatively, the emissive layer 220A may further comprise an EBL 265 disposed between the HTL 260 and the EML 240A and/or an HBL 275 disposed between the EML 240A and the ETL 270. The configuration of the first and second electrodes 210 and 230 as well as other layers except the EML 240A in the emissive layer 220A may be substantially identical to the corresponding electrodes and layers in the OLED D1.

The EML 240A comprises a first EML (EML1, lower EML, first layer) 242 disposed between the EBL 265 and the HBL 275 and a second EML (EML2, upper EML, second layer) 244 disposed between the EML1 242 and the HBL 275. Alternatively, the EML2 244 may be disposed between the EBL 265 and the EML1 242.

One of the EML1 242 and the EML2 244 includes the first compound (first dopant) DF of the delayed fluorescent material, and the other of the EML1 242 and the EML2 244 includes the second compound (second dopant) FD of the fluorescent material. Also, each of the EML1 242 and the EML2 244 may include a third compound (Compound 3) H1 of a first host and a fourth compound (Compound 4) H2 of a second host. As an example, the EML1 242 may include the first compound DF and the third compound H1 and the EML2 244 may include the second compound FD and the fourth compound H2.

The first compound DF in the EML1 242 may be delayed fluorescent material having the structure of Formulae 1 to 6. The triplet exciton energy of the first compound DF having delayed fluorescent property can be converted upwardly to its own singlet exciton energy via RISC mechanism. While the first compound DF has high internal quantum efficiency, but it has poor color purity due to its wide FWHM.

On the other hand, the EML2 244 comprises the second compound FD of the florescent material. The second compound FD includes any organic compound having the structure of Formulae 7 to 9. While the second compound FD of the fluorescent material having the structure of Formulae 6 to 8 has an advantage in terms of color purity due to its narrow FWHM (e.g. ≤35 nm).

In this example embodiment, the singlet exciton energy as well as the triplet exciton energy of the first compound DF having the delayed fluorescent property in the EML1 242 can be transferred to the second compound FD in the EML2 244 disposed adjacently to the EML1 242 by FRET mechanism, and the ultimate light emission occurs in the second compound FD within the EML2 244.

The triplet exciton energy of the first compound DF is converted upwardly to its own singlet exciton energy in the EML1 242 by RISC mechanism. Then, both the initial singlet exciton energy and the converted singlet exciton energy of the first compound DF is transferred to the singlet exciton energy of the second compound FD in the EML2 244. The second compound FD in the EML2 244 can emit light utilizing the triplet exciton energy as well as the singlet exciton energy.

As the exciton energy generated at the first compound DF of the delayed fluorescent material in the EML1 242 is efficiently transferred to the second compound FD of the fluorescent material in the EML2 244, the OLED D2 can implement hyper fluorescence. In this case, substantial light emission is occurred in the EML2 244 including the second compound FD of the fluorescent material. The OLED D2 can enhance quantum efficiency and color purity owing to narrow FWHM.

Each of the EML1 242 and the EML2 244 further includes the third compound H1 and the fourth compound H2, respectively. The third compound HI may be identical to or different from the fourth compound H2. For example, each of the third compound H1 and the fourth compound H2 may independently include, but is not limited to, the third compound H described above, respectively.

The energy level bandgap ΔHOMO-1 between the HOMO energy level $HOMO^{DF}$ of the first compound DF and the HOMO energy level $HOMO^{FD}$ of the second compound FD may satisfy the relationship in Equation (1) or (2), as illustrated in FIG. 9. Accordingly, holes injected into the EML 240A are transferred efficiently to the first compound DF so that the first compound DF can utilize both the singlet and triplet exciton energies and transfer the exciton energies to the second compound FD. In addition, the LUMO energy level $LUMO^{DF}$ of the first compound DF may be higher than or equal to the LUMO energy level $LUMO^{FD}$ of the second compound FD, and may satisfy the relationship in Equation (3) or (4).

Also, an energy level bandgap ($|HOMO^{H}-HOMO^{DF}|$) between the HOMO energy levels ($HOMO^{H1}$ and $HOMO^{H2}$) of the third and fourth compounds H1 and H2 and the HOMO energy level ($HOMO^{DF}$) of the first compound DF, or an energy level bandgap ($|LUMO^{H}-LUMO^{DF}|$) between the LUMO energy levels ($LUMO^{H1}$ and $LUMO^{H2}$) of the third and fourth compounds H1 and H2 and the LUMO energy level ($LUMO^{DF}$) of the first compound DF may be equal to or less than about 0.5 eV. When the HOMO or LUMO energy level bandgap between the third and fourth compounds H1 and H2, and the first compound DF does not satisfy that condition, the exciton energy at the first compound DF may be quenched as a non-radiative recombination, or exciton energies may not be transferred efficiently to the first compound DF and/or the second compound FD from the third compound H1 and the fourth compound H2, thus the internal quantum efficiency in the OLED D2 may be reduced.

Also, each of the exciton energies generated in each of the third compound H1 in the EML1 242 and the fourth compound H2 in the EML2 244 should be transferred primarily to the first compound DF of the delayed florescent material and then to the second compound FD of the fluorescent material. As illustrated in FIG. 10, each of the singlet energy level $S_1^{H1}$ of the third compound H1 and the single energy level $S_1^{H2}$ of the fourth compound H2 is higher than the singlet energy level $S_1^{DF}$ of the first compound DF of the delayed fluorescent material. Also, each of the triplet energy level $T_1^{H1}$ of the third compound H1 and the triplet energy level $T_1^{H2}$ of the fourth compound H2 is higher than the triplet energy level $T_1^{DF}$ of the first compound DF. For example, the triplet energy levels $T_1^{H1}$ and $T_1^{H2}$ of the third and fourth compound H1 and H2 may be higher than the triplet energy level $T_1^{DF}$ of the first compound DF by at least about 0.2 eV, for example, by at least about 0.3 eV or by at least about 0.5 eV.

Also, the singlet energy level $S_1^{H2}$ of the fourth compound H2 of the second host is higher than the singlet energy level $S_1^{FD}$ of the second compound FD of the fluorescent material. Optionally, the triplet energy level $T_1^{H2}$ of the fourth compound H2 may be higher than the triplet energy level $T_1^{FD}$ of the second compound FD. Accordingly, the singlet exciton energy generated at the fourth compound H2 may be transferred to the singlet exciton energy of the second compound FD.

In addition, the singlet exciton energy, which is generated at the first compound DF of the delayed fluorescent material that is converted to ICT complex by RISC in the EML1 242, should be efficiently transferred to the second compound FD of the fluorescent material in the EML2 244. To this end, the singlet energy level $S_1^{DF}$ of the first compound DF of the delayed fluorescent material in the EML1 242 is higher than the singlet energy level $S_1^{FD}$ of the second compound FD of the fluorescent material in the EML2 244. Optionally, the triplet energy level $T_1^{DF}$ of the first compound DF may be higher than the triplet energy level $T_1^{FD}$ of the second compound FD.

Each of the contents of the third and fourth compounds H1 and H2 in the EML1 242 and the EML2 244 may be larger than or identical to each of the contents of the first and second compounds DF and FD in the same layer, respectively. Also, the contents of the first compound DF in the EML1 242 may be larger than the contents of the second compound FD in the EML2 244. Accordingly, exciton energy is sufficiently transferred from the first compound DF to the second compound FD via FRET mechanism.

For example, the EML1 242 may comprise the first compound DF between about 1 wt % and about 50 wt %, for example, about 10 wt % and about 40 wt % or about 20 wt % and about 40 wt %. The EML2 244 may comprise the second compound FD between about 1 wt % and about 10 wt %, for example, about 1 wt % and 5 wt %.

In an alternative embodiment, when the EML2 244 is disposed adjacently to the HBL 275, the fourth compound H2 in the EML2 244 may be the same material as the HBL 275. In this case, the EML2 244 may have a hole blocking function as well as an emission function. In other words, the EML2 244 can act as a buffer layer for blocking holes. In one embodiment, the HBL 275 may be omitted where the EML2 244 may be a hole blocking layer as well as an emitting material layer.

In another example embodiment, when the EML2 244 is disposed adjacently to the EBL 265, the fourth compound H2 in the EML2 244 may be the same material as the EBL 265. In this case, the EML2 244 may have an electron blocking function as well as an emission function. In other words, the EML2 244 can act as a buffer layer for blocking electrons. In one embodiment, the EBL 265 may be omitted where the EML2 244 may be an electron blocking layer as well as an emitting material layer.

Figure 11:
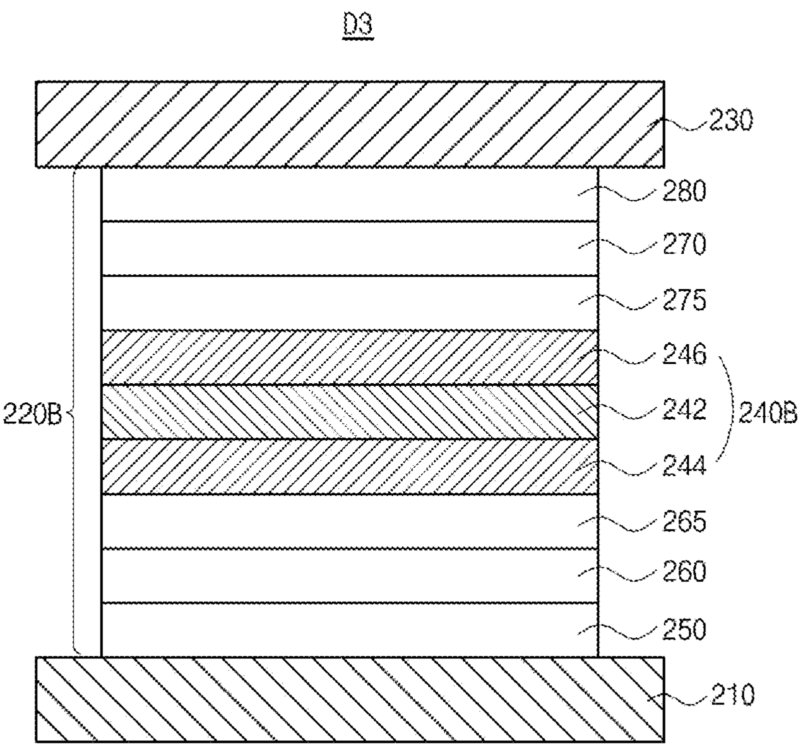
FIG. 11 illustrates a schematic cross-sectional view of an organic light emitting diode in accordance with another example embodiment of the present disclosure.
Figure 12:
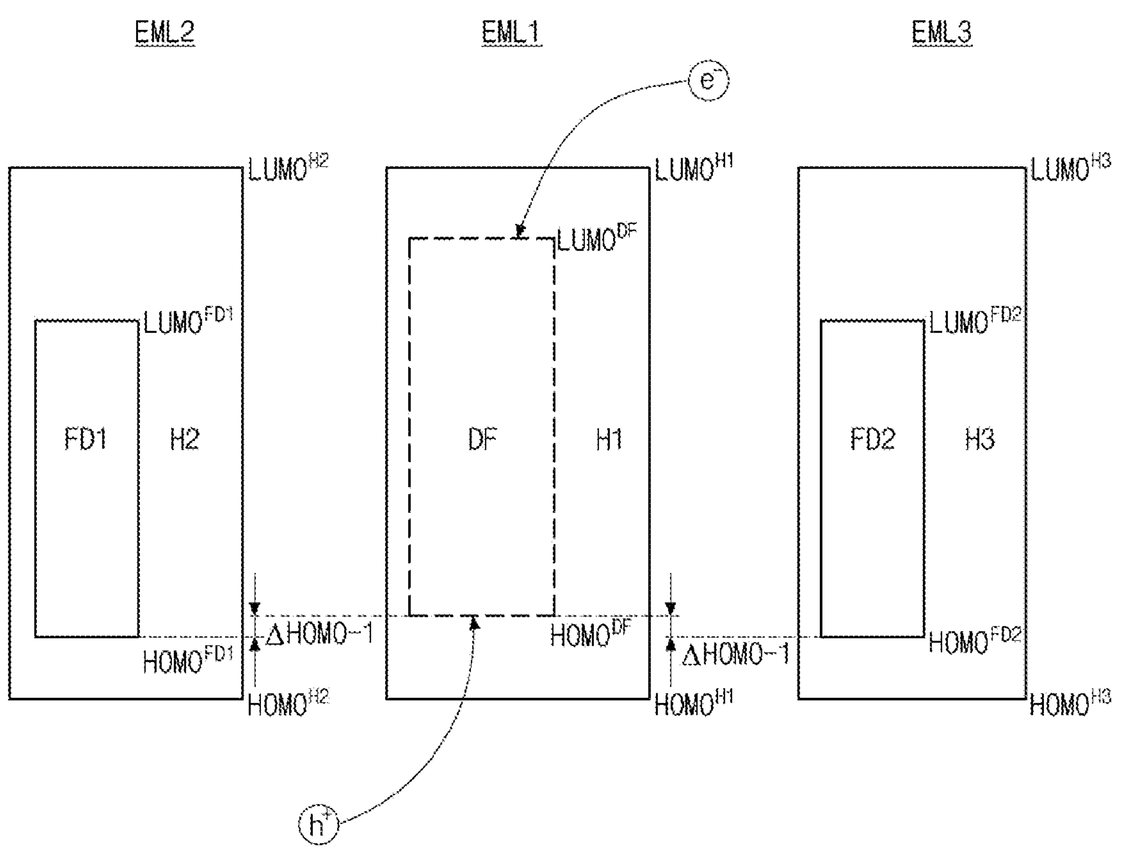
FIG. 12 illustrate a schematic diagram that holes are transferred efficiently to the second compound by adjusting energy levels of luminous materials focusing the first compound and the second compound in an emitting material layer in accordance with another example embodiment of the present disclosure.
Figure 13:
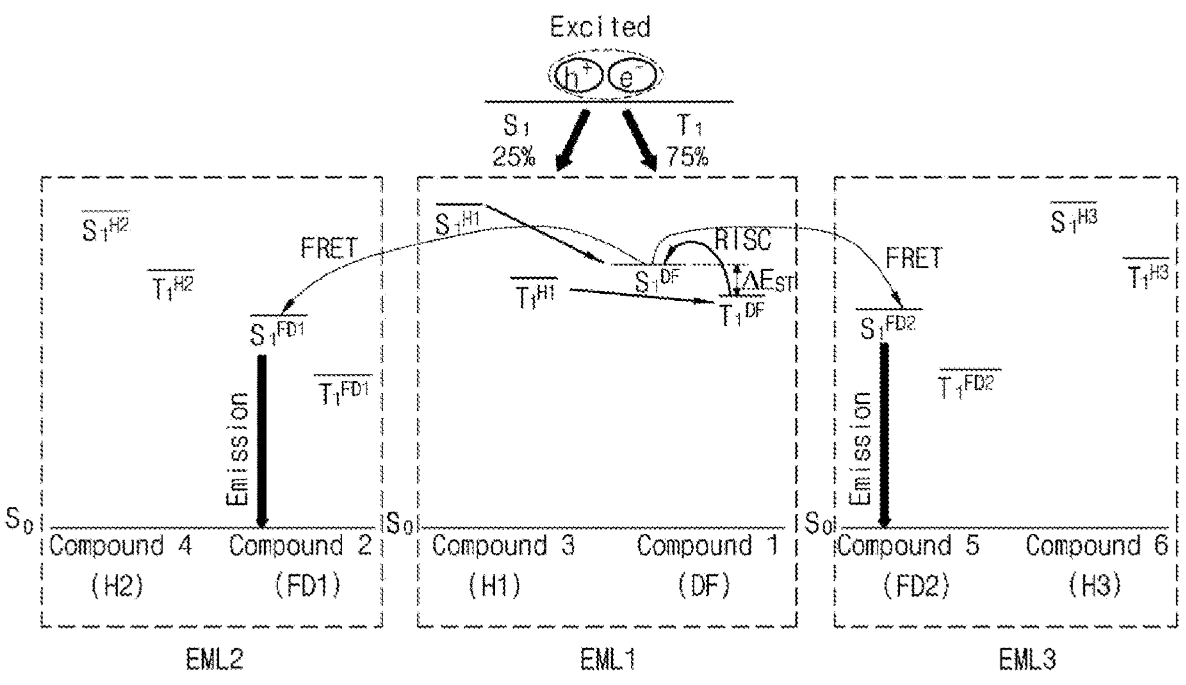
FIG. 13 illustrates a schematic diagram of luminous mechanism by singlet energy levels and triplet energy levels among luminous materials in the emitting material layer of the organic light emitting diode in accordance with another example embodiment of the present disclosure.

An OLED having a triple-layered EML will be described. FIG. 11 illustrates a schematic cross-sectional view of an organic light emitting diode in accordance with another example embodiment of the present disclosure. FIG. 12 illustrate a schematic diagram that holes are transferred efficiently to the second compound by adjusting energy levels of luminous materials focusing the first compound and the second compound in an emitting material layer in accordance with another example embodiment of the present disclosure. FIG. 13 illustrates a schematic diagram of luminous mechanism by singlet energy levels and triplet energy levels among luminous materials in the emitting material layer of the organic light emitting diode in accordance with another example embodiment of the present disclosure.

As illustrated in FIG. 11, the OLED D3 comprises first and second electrodes 210 and 230 facing each other and an emissive layer 220B disposed between the first and second electrodes 210 and 230. The organic light emitting display device 100 (FIG. 2) includes a red pixel region, a green pixel region and a blue pixel region, and the OLED D3 may be disposed in the blue pixel region.

In one example embodiment, the emissive layer 220B comprises a triple-layered EML 240B. The emissive layer 220B may comprise at least one of an HTL 260 disposed between the first electrode 210 and the EML 240B and an ETL 470 disposed between the EML 240B and the second electrode 430. Also, the emissive layer 220B may further comprise at least one of an HIL 250 disposed between the first electrode 210 and the HTL 260 and an EIL 280 disposed between the ETL 270 and the second electrode 230. Alternatively, the emissive layer 220B may further comprise an EBL 265 disposed between the HTL 260 and the EML 240B and/or an HBL 275 disposed between the EML 240B and the ETL 270. The configurations of the first and second electrodes 210 and 230 as well as other layers except the EML 240B in the emissive layer 220B is substantially identical to the corresponding electrodes and layers in the OLEDs D1 and D2.

The EML 240B comprises a first EML (EML1, middle EML, first layer) 242 disposed between the EBL 265 and the HBL 275, a second EML (EML2, lower EML, second layer) 244 disposed between the EBL 265 and the EML1 242, and a third EML (EML3, upper EML, third layer) 246 disposed between the EML1 242 and the HBL 275.

The EML1 242 includes the first compound (first dopant) DF of the delayed fluorescent material and each of the EML2 244 and the EML3 246 includes the second compound (second dopant) FD1 and a fifth compound (third dopant) FD2 each of which is the fluorescent material, respectively. Each of the EML1 242, the EML2 244 and the EML3 246 includes the third compound H1 of the first host, the fourth compound H2 of the second host and a sixth compound H3 of a third host, respectively.

In accordance with example embodiment, both the singlet exciton energy as well as the triplet exciton energy of the first compound DF of the delayed fluorescent material in the EML1 242 can be transferred to the second and fifth compounds FD1 and FD2 of the fluorescent materials each of which is included in the EML2 244 and EML3 246 disposed adjacently to the EML1 242 by FRET energy transfer mechanism. Accordingly, the ultimate emission occurs in the second and fifth compounds FD1 and FD2 in the EML2 244 and the EML3 246.

The triplet exciton energy of the first compound DF in the EML1 242 is converted upwardly to its own singlet exciton energy by RISC mechanism, and then the singlet exciton energy including the initial and converted singlet exciton energy of the first compound DF is transferred to the singlet exciton energy of the second and fifth compounds FD1 and FD2. The first compound DF has the singlet energy level $S_1^{DF}$ higher than each of the singlet energy levels $S_1^{FD1}$ and $S_1^{FD2}$ of the second and fifth compounds FD1 and FD2. The singlet exciton energy of the first compound DF in the EML1 242 is transferred to the second and fifth compounds FD1 and FD2 in the EML2 244 and the EML3 246 which are disposed adjacently to the EML1 242 by FRET mechanism.

Accordingly, the second and fifth compounds FD1 and FD2 in the EML2 244 and EML3 246 can emit light using both the singlet exciton energy and the triplet exciton energy derived from the first compound DF. Each of the second and fifth compounds FD1 and FD2 has a relatively narrow FWHM (e.g. ≤35 nm) compared to the first compound DF. Therefore, the OLED D3 can improve its quantum efficiency and color purity owing to narrow FWHM, and the ultimate emission occurs in the second and fifth compounds FD1 and FD2 within the EML2 244 and the EML3 246.

The first compound DF of the delayed fluorescent material comprises any organic compound having the structure of Formulae 1 to 6. Each of the second and fifth compounds FD1 and FD2 of the fluorescent materials comprises independently any boron-based compound having the structure of Formulae 7 to 9. The third compound H1, the fourth compound H2 and the sixth compound H3 may be identical to or different from each other. For example, each of the third compound H1, the fourth compound H2 and the sixth compound H3 may include, but is not limited to, the third compound H described above, respectively.

Similar to the first and second embodiments, the energy level bandgap ΔHOMO-1 between the HOMO energy level $HOMO^{DF}$ of the first compound DF and each of the HOMO energy levels $HOMO^{FD1}$ and $HOMO^{FD2}$ of the second compound FD1 and the fifth compound FD2 may satisfy the relationship in Equation (1) or (2) as illustrated in FIG. 12. Accordingly, holes injected into the EML 240 are transferred efficiently to the first compound DF so that the first compound DF can utilize both the singlet and triplet exciton energies and transfer the exciton energies to both the second compound FD1 and the fifth compound FD2. In addition, the LUMO energy level $LUMO^{DF}$ of the first compound DF may be higher than or equal to each of the LUMO energy levels $LUMO^{FD1}$ and $LUMO^{FD2}$ of the second compound FD1 and the fifth compound FD2, and may satisfy the relationship in Equation (3) or (4).

Also, an energy level bandgap ($|HOMO^{H}-HOMO^{DF}|$) between the HOMO energy levels ($HOMO^{H1}$, $HOMO^{H2}$ and $HOMO^{H3}$) of the third, fourth and sixth compounds H1, H2 and H3 and the HOMO energy level ($HOMO^{DF}$) of the first compound DF, or an energy level bandgap ($|LUMO^{H}-LUMO^{DF}|$) between the LUMO energy levels ($LUMO^{H1}$, $LUMO^{H2}$ and $LUMO^{H3}$) of the third, fourth and sixth compounds H1, H2 and H3 and the LUMO energy level ($LUMO^{DF}$) of the first compound DF may be equal to or less than about 0.5 eV.

Also, the singlet and triplet energy levels among the luminous materials introduced in the EML1 242, EML2 244 and EML3 246 should be properly adjusted in order to implement efficient luminescence. Referring to FIG. 13, each of the singlet energy level $S_1^{H1}$ of the third compound H1 as the first host, the singlet energy level $S_1^{H2}$ of the fourth compound H2 as the second host and the singlet energy level $S_1^{H3}$ of the sixth compounds H3 as the third host is higher than the singlet energy level $S_1^{DF}$ of the first compound DF of the delayed fluorescent material. Also, each of the triplet energy level $T_1^{H1}$ of the third compound H1, the triplet energy level $T_1^{H2}$ of the fourth compound H2 and the triplet energy level $T_1^{H3}$ of the sixth compound H3 may be higher than the triplet energy level $T_1^{DF}$ of the first compound DF.

The singlet exciton energy, which is generated at the first compound DF of the delayed fluorescent material that is converted to ICT complex by RISC in the EML1 242, should be efficiently transferred to each of second and fifth compounds FD1 and FD2 of the fluorescent materials in the EML2 244 and the EML3 246. To this end, the singlet energy level $S_1^{DF}$ of the first compound DF of the delayed fluorescent material in the EML1 242 is higher than each of the singlet energy levels $S_1^{FD1}$ and $S_1^{FD2}$ of the second and fifth compounds FD1 and FD2 of the fluorescent material in the EML2 244 and the EML3 246. Optionally, the triplet energy level $T_1^{DF}$ of the first compound DF may be higher than each of the triplet energy levels $T_1^{FD1}$ and $T_1^{FD2}$ of the second and fifth compounds FD1 and FD2.

In addition, exciton energy transferred to each of the second and fifth compounds FD1 and FD2 from the first compound DF should not transferred to each of the fourth and sixth compounds H2 and H3 in order to realize efficient luminescence. To this end, each of the singlet energy levels $S_1^{H2}$ and $S_1^{H3}$ of the fourth and sixth compounds H2 and H3, each of which may be the second host and the third host, is higher than each of the singlet energy levels cand $S_1^{FD2}$ of the second and fifth compounds FD1 and FD2 of the fluorescent material, respectively. Optionally, each of the triplet energy level $T_1^{H2}$ and $T_1^{H3}$ of the fourth and sixth compounds H2 and H3 is higher than each of the triplet energy levels $T_1^{FD1}$ and $T_1^{FD2}$ of the second and fifth compounds FD1 and FD2, respectively.

The contents of the first compound DF in the EML1 242 may be larger than each of the contents of the second and fifth compounds FD1 and FD2 in the EML2 244 or the EML3 246. In this case, exciton energy can be transferred sufficiently from the first compound DF in the EML1 242 to each of the second and fifth compounds FD1 and FD2 in the EML2 244 and the EML3 246 via FRET mechanism.

For example, the EML1 242 may comprise the first compound DF between about 1 wt % and about 50 wt %, for example, about 10 wt % and about 40 wt % or about 20 wt % and about 40 wt %. Each of the EML2 244 and the EML3 246 may comprise the second and fifth compounds FD1 and FD2 between about 1 wt % and about 10 wt %, for example, about 1 wt % and 5 wt %, respectively.

In an alternative embodiment, when the EML2 244 is disposed adjacently to the EBL 265, the fourth compound H2 in the EML2 244 may be the same material as the EBL 265. In this case, the EML2 244 may have an electron blocking function as well as an emission function. In other words, the EML2 244 can act as a buffer layer for blocking electrons. In one embodiment, the EBL 265 may be omitted where the EML2 244 may be an electron blocking layer as well as an emitting material layer.

When the EML3 246 is disposed adjacently to the HBL 275, the sixth compound H3 in the EML3 246 may be the same material as the HBL 275. In this case, the EML3 246 may have a hole blocking function as well as an emission function. In other words, the EML3 246 can act as a buffer layer for blocking holes. In one embodiment, the HBL 275 may be omitted where the EML3 246 may be a hole blocking layer as well as an emitting material layer.

In another example embodiment, the fourth compound H2 in the EML2 244 may be the same material as the EBL 265 and the sixth compound H3 in the EML3 246 may be the same material as the HBL 275. In this aspect, the EML2 244 may have an electron blocking function as well as an emission function, and the EML3 246 may have a hole blocking function as well as an emission function. In other words, each of the EML2 244 and the EML3 246 can act as a buffer layer for blocking electrons or hole, respectively. In one embodiment, the EBL 265 and the HBL 275 may be omitted where the EML2 244 may be an electron blocking layer as well as an emitting material layer and the EML3 246 may be a hole blocking layer as well as an emitting material layer.

Figure 14:
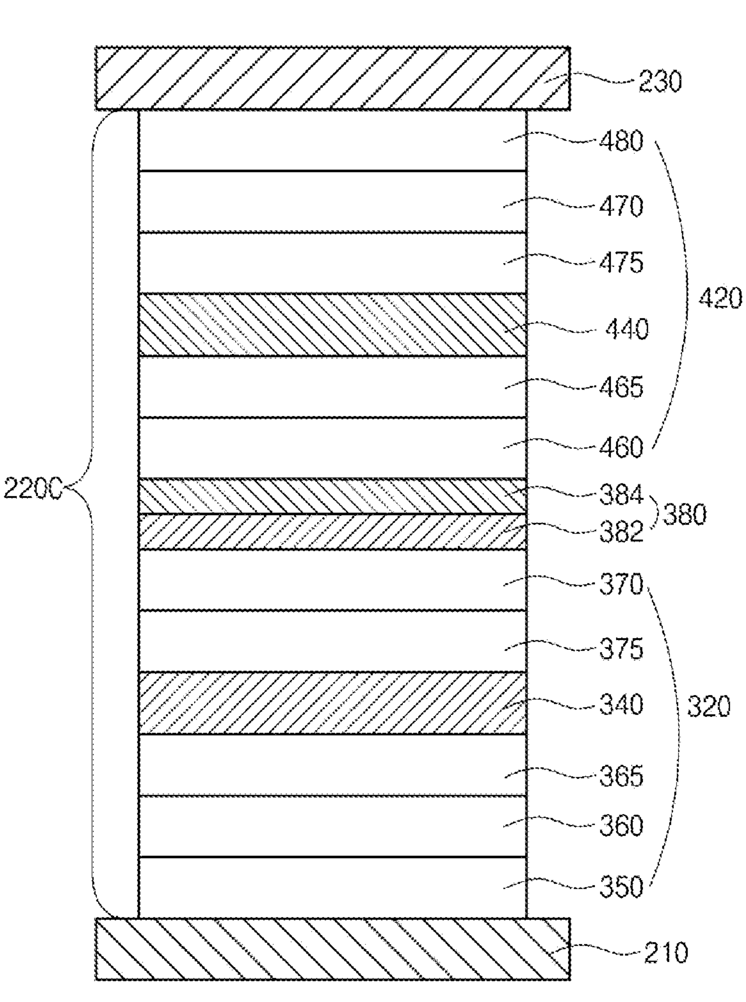
FIG. 14 illustrates a schematic cross-sectional view of an organic light emitting diode in accordance with another example embodiment of the present disclosure.

In an alternative embodiment, an OLED may include multiple emitting parts. FIG. 14 illustrates a schematic cross-sectional view of an organic light emitting diode in accordance with another example embodiment of the present disclosure.

As illustrated in FIG. 14, the OLED D4 comprises first and second electrodes 210 and 230 facing each other and an emissive layer 220C disposed between the first and second electrodes 210 and 230. The organic light emitting display device 100 (FIG. 2) includes a red pixel region, a green pixel region and a blue pixel region, and the OLED D4 may be disposed in the blue pixel region. The first electrode 210 may be an anode and the second electrode 230 may be a cathode.

The emissive layer 220C includes a first emitting part 320 that includes a first EML (EML1) 340 and a second emitting part 420 that includes a second EML (EML2) 440. Also, the emissive layer 220C may further comprise a charge generation layer (CGL) 380 disposed between the first emitting part 320 and the second emitting part 420.

The CGL 380 is disposed between the first and second emitting parts 320 and 420 so that the first emitting part 320, the CGL 380 and the second emitting part 420 are sequentially disposed on the first electrode 210. In other words, the first emitting part 320 is disposed between the first electrode 210 and the CGL 380 and the second emitting part 420 is disposed between the second electrode 230 and the CGL 380.

The first emitting part 320 comprises the EML1(lower EML) 340. The first emitting part 320 may further comprise at least one of an HIL 350 disposed between the first electrode 210 and the EML1 340, a first HTL (HTL1) 360 disposed between the EML1 340 and the HIL 350, and a first ETL (ETL1) 370 disposed between the EML1 340 and the CGL 380. Alternatively, the first emitting part 320 may further comprise a first EBL (EBL1) 365 disposed between the HTL1 360 and the EML1 340 and/or a first HBL (HBL1) 375 disposed between the EML1 340 and the ETL1 370.

The second emitting part 420 comprises the EML2 (upper EML) 440. The second emitting part 420 may further comprise at least one of a second HTL (HTL2) 460 disposed between the CGL 380 and the EML2 440, a second ETL (ETL2) 470 disposed between the EML2 440 and the second electrode 230 and an EIL 480 disposed between the ETL2 470 and the second electrode 230. Alternatively, the second emitting part 420 may further comprise a second EBL (EBL2) 465 disposed between the HTL2 460 and the EML2 440 and/or a second HBL (HBL2) 475 disposed between the EML2 440 and the ETL2 470.

The CGL 380 is disposed between the first emitting part 320 and the second emitting part 420. In other words, the first emitting part 320 and the second emitting part 420 are connected via the CGL 380. The CGL 380 may be a PN-junction CGL that junctions an N-type CGL (N-CGL) 382 with a P-type CGL (P-CGL) 384.

The N-CGL 382 is disposed between the ETL1 370 and the HTL2 460 and the P-CGL 384 is disposed between the N-CGL 382 and the HTL2 460. The N-CGL 382 transports electrons to the EML1 340 of the first emitting part 320 and the P-CGL 384 transports holes to the EML2 440 of the second emitting part 420.

In another example embodiment, each of the EML1 340 and the EML2 440 may be a blue emitting material layer. For example, at least one of the EML1 340 and the EML2 440 comprise the first compound DF of the delayed fluorescent material, the second compound FD of the fluorescent material, and optionally, the third compound H of the host.

When the EML1 340 and/or the EML2 440 include the first compound DF, the second compound FD and the third compound H, the contents of the third compound H may be larger than the contents of the first compound DF, and the contents of the first compound DF is larger than the contents of the second compound FD in the EML1 340 and/or the EML2 440. In this case, exciton energy can be transferred efficiently from the first compound DF to the second compound FD.

In an example embodiment, the EML2 440 may include the first compound DF, the second compound FD, and optionally, the third compound H, similar to the EML1 340. Alternatively, the EML2 440 may include another compound that is different from at least one of the first compound DF and the second compound FD in the EML1 340, and thus the EML2 440 may emit light different from the light emitted from the EML1 340 or may have different luminous efficiency from the luminous efficiency of the EML1 340.

In FIG. 14, each of the EML1 340 and the EML2 440 has a single-layered structure. Alternatively, each of the EML1 340 and the EML2 440, each of which may include the first compound DF, the second compound FD, and optionally, the third compound H, may have a double-layered structure (FIG. 8) or a triple-layered structure (FIG. 111), respectively.

In the OLED D4 in accordance with an example embodiment, the singlet exciton energy of the first compound DF of the delayed fluorescent material is transferred to the second compound FD of the fluorescent material, and the final emission is occurred at the second compound FD. Accordingly, the OLED D4 can have excellent luminous efficiency and color purity. In addition, the OLED D4 includes at least one EML including the first compound DF having the structure of Formulae 1 to 6 and the second compound FD having the structure of Formulae 7 to 9 so that the OLED D4 can enhance further its luminous efficiency and color purity. Moreover, since the OLED D4 has a double stack structure of a blue emitting material layer, the OLED D4 can improve its color sense or optimize its luminous efficiency.

FIG. 15 illustrates a schematic cross-sectional view of an organic light emitting display device as an organic light emitting device in accordance with another example embodiment of the present disclosure. As illustrated in FIG. 15, an organic light emitting display device 500 includes a substrate 510 that defines first to third pixel regions P1, P2 and P3, a thin film transistor Tr disposed over the substrate 510 and an OLED D disposed over the thin film transistor Tr and connected to the thin film transistor Tr. As an example, the first pixel region P1 may be a blue pixel region, the second pixel region P2 may be a green pixel region and the third pixel region P3 may be a red pixel region.

The substrate 510 may be a glass substrate or a flexible substrate. For example, the flexible substrate may be any one of a PI substrate, a PES substrate, a PEN substrate, a PET substrate and a PC substrate. A buffer layer 512 is disposed over the substrate 510 and the thin film transistor Tr is disposed over the buffer layer 512. The buffer layer 512 may be omitted. As illustrated in FIG. 2, the thin film transistor Tr includes a semiconductor layer, a gate electrode, a source electrode and a drain electrode and acts as a driving element.

A passivation layer 550 is disposed over the thin film transistor Tr. The passivation layer 550 has a flat top surface and a drain contact hole 552 that exposes a drain electrode of the thin film transistor Tr.

The OLED D is disposed over the passivation layer 550, and includes a first electrode 610 that is connected to the drain electrode of the thin film transistor Tr, and an emissive layer 620 and a second electrode 630 each of which is disposed sequentially on the first electrode 610. The OLED D is disposed in each of the first to third pixel regions P1, P2 and P3 and emits different color light in each pixel region. For example, the OLED D in the first pixel region P1 may emit blue light, the OLED D in the second pixel region P2 may emit green light and the OLED D in the third pixel region P3 may emit red light.

The first electrode 610 is separately formed for each of the first to third pixel regions P1, P2 and P3, and the second electrode 630 corresponds to the first to third pixel regions P1, P2 and P3 and is formed integrally. The first electrode 610 may be one of an anode and a cathode, and the second electrode 630 may be the other of the anode and the cathode. Also, one of the first electrode 610 and the second electrode 630 is a transmissive (or semi-transmissive) electrode and the other of the first electrode 610 and the second electrode 630 is a reflective electrode.

For example, the first electrode 610 may be an anode and may include conductive material having a relatively high work function value, i.e., a transparent conductive oxide layer of transparent conductive oxide (TCO). The second electrode 630 may be a cathode and may include conductive material having relatively low work function value, i.e., a metal material layer of low-resistant metal. For example, the first electrode 610 may include any one of ITO, IZO, ITZO, SnO, ZnO, ICO and AZO, and the second electrode 630 may include Al, Mg, Ca, Ag, alloy thereof (e.g. Mg—Ag) or combination thereof.

When the organic light emitting display device 500 is a bottom-emission type, the first electrode 610 may have a single-layered structure of a transparent conductive oxide layer. Alternatively, when the organic light emitting display device 500 is a top-emission type, a reflective electrode or a reflective layer may be disposed under the first electrode 610. For example, the reflective electrode or the reflective layer may include, but is not limited to, Ag or APC alloy. In the OLED D of the top-emission type, the first electrode 610 may have a triple-layered structure of ITO/Ag/ITO or ITO/APC/ITO. Also, the second electrode 630 is thin so as to have light-transmissive (or semi-transmissive) property.

A bank layer 560 is disposed on the passivation layer 550 in order to cover edges of the first electrode 610. The bank layer 560 corresponds to each of the first to third pixel regions P1, P2 and P3 and exposes a center of the first electrode 610.

An emissive layer 620 is disposed on the first electrode 610. The emissive layer 620 may have a single-layered structure of an EML. Alternatively, the emissive layer 620 may include at least one of an HIL, an HTL, and an EBL disposed sequentially between the first electrode 610 and the EML and/or an HBL, an ETL and an EIL disposed sequentially between the EML and the second electrode 630.

The EML of the emissive layer 620 in the first pixel region P1 of the blue pixel region may comprise the first compound DF of the delayed fluorescent material having the structure of Formulae 1 to 6, the second compound FD of the fluorescent material having the structure of Formula 7 to 9, and optionally, the third compound H of the host.

An encapsulation film 570 is disposed over the second electrode 630 in order to prevent outer moisture from penetrating into the OLED D. The encapsulation film 570 may have, but is not limited to, a triple-layered structure of a first inorganic insulating film, an organic insulating film and a second inorganic insulating film.

The organic light emitting display device 500 may have a polarizing plate in order to decrease external light reflection. For example, the polarizing plate may be a circular polarizer. When the organic light emitting display device 500 is a bottom-emission type, the polarizing plate may be disposed under the substrate 510. Alternatively, when the organic light emitting display device 500 is a top emission type, the polarizing plate may be disposed over the encapsulation film 570.

Figure 16:
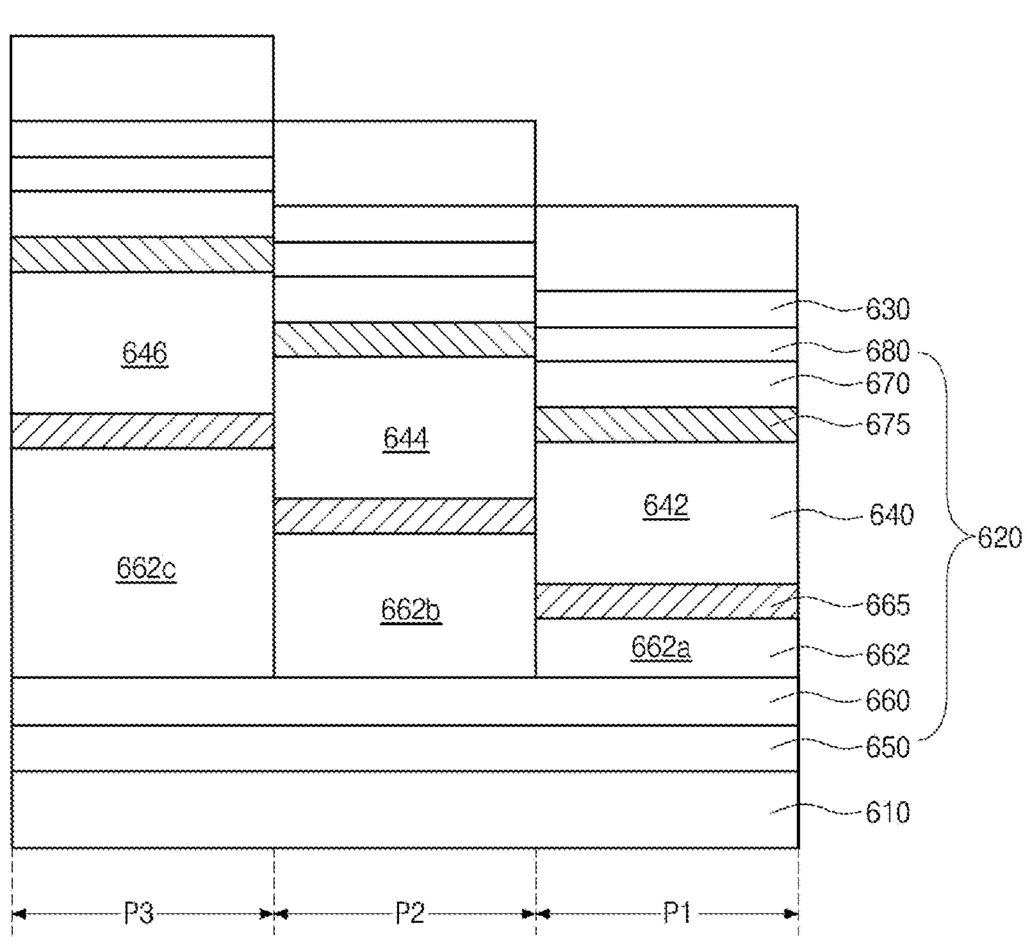
FIG. 16 illustrates a schematic cross-sectional view of an organic light emitting diode in accordance with another example embodiment of the present disclosure.

FIG. 16 illustrates a schematic cross-sectional view of an organic light emitting diode in accordance with another example embodiment of the present disclosure. As illustrated in FIG. 16, the OLED D5 comprises a first electrode 610, a second electrode 630 facing the first electrode 610 and an emissive layer 620 disposed between the first and second electrodes 610 and 630.

The first electrode 610 may be an anode and the second electrode 630 may be a cathode. As an example, the first electrode 610 may be a reflective electrode and the second electrode 630 may be a transmissive (or semi-transmissive) electrode.

The emissive layer 620 comprises an EML 640. The emissive layer 620 may comprise at least one of an HTL 660 disposed between the first electrode 610 and the EML 640 and an ETL 670 disposed between the EML 640 and the second electrode 630. Also, the emissive layer 620 may further comprise at least one of an HIL 650 disposed between the first electrode 610 and the HTL 660 and an EIL 680 disposed between the ETL 670 and the second electrode 630. In addition, the emissive layer 620 may further comprise at least one of an EBL 665 disposed between the HTL 660 and the EML 640 and/or an HBL 675 disposed between the EML 640 and the ETL 670.

In addition, the emissive layer 620 may further comprise an auxiliary hole transport layer (auxiliary HTL) 662 disposed between the HTL 660 and the EBL 665. The auxiliary HTL 662 may comprise a first auxiliary HTL **662*a* located in the first pixel region P1, a second auxiliary HTL 662*b* located in the second pixel region P2 and a third auxiliary HTL 662*c* located in the third pixel region P3**.

The first auxiliary HTL **662*a* has a first thickness, the second auxiliary HTL 662*b* has a second thickness and the third auxiliary HTL 662*c* has a third thickness. The first thickness is less than the second thickness and the second thickness is less than the third thickness. Accordingly, the OLED D5** has a micro-cavity structure.

Owing to the first to third auxiliary HTLs **662*a*, 662*b* and 662*c* having different thickness to each other, the distance between the first electrode 610 and the second electrode 630 in the first pixel region P1 emitting light in the first wavelength range (blue light) is smaller than the distance between the first electrode 610 and the second electrode 630 in the second pixel region P2 emitting light in the second wavelength range (green light), which is longer than the first wavelength range. Also, the distance between the first electrode 610 and the second electrode 630 in the second pixel region P2 is smaller than the distance between the first electrode 610 and the second electrode 630 in the third pixel region P3 emitting light in the third wavelength range (red light), which is longer than the second wavelength range. Accordingly, the OLED D5** has improved luminous efficiency.

In FIG. 16, the first auxiliary HTL **662*a* is located in the first pixel region P1. Alternatively, the OLED D5 may implement the micro-cavity structure without the first auxiliary HTL 662*a*. In addition, a capping layer may be disposed over the second electrode 630 in order to improve out-coupling of the light emitted from the OLED D5**.

The EML 640 comprises a first EML (EML1) 642 located in the first pixel region P1, a second EML (EML2) 644 located in the second pixel region P2 and a third EML (EML3) 646 located in the third pixel region P3. Each of the EML1 642, the EML2 644 and the EML3 646 may be a blue EML, a green EML and a red EML, respectively.

The EML1 642 located in the first pixel region P1 may comprise the first compound DF of the delayed fluorescent material having the structure of Formulae 1 to 6, the second compound FD of the fluorescent material having the structure of Formulae 7 to 9, and optionally, the third compound H of the host. The EML1 642 may have a single-layered structure, a double-layered structure (FIG. 8) or a triple-layered structure (FIG. 11).

In this case, the contents of the third compound H may be larger than the contents of the first compound DF, and the contents of the first compound DF is larger than the contents of the second compound FD in the EML1 642. In this case, exciton energy can be transferred efficiently from the first compound DF to the second compound FD.

The EML2 644 located in the second pixel region P2 may comprise a host and green dopant and the EML3 646 located in the third pixel region P3 may comprise a host and red dopant. For example, the host in the EML2 644 and the EML3 646 may comprise the third compound H, and each of the green dopant and the red dopant may comprise at least one of green or red phosphorescent material, green or red fluorescent material and green or red delayed fluorescent material.

The OLED D5 in FIG. 16 emits blue light, green light and red light in each of the first to third pixel regions P1, P2 and P3 so that the organic light emitting display device 500 (FIG. 15) can implement a full-color image.

The organic light emitting display device 500 may further comprise a color filter layer corresponding to the first to third pixel regions P1, P2 and P3 for improving color purity of the light emitted from the OLED D. As an example, the color filter layer may comprise a first color filter layer (blue color filter layer) corresponding to the first pixel region P1, the second color filter layer (green color filter layer) corresponding to the second pixel region P2 and the third color filter layer (red color filter layer) corresponding to the third pixel region P3.

When the organic light emitting display device 500 is a bottom-emission type, the color filter layer may be disposed between the OLED D and the substrate 510. Alternatively, when the organic light emitting display device 500 is a top-emission type, the color filter layer may be disposed over the OLED D.

Figure 17:
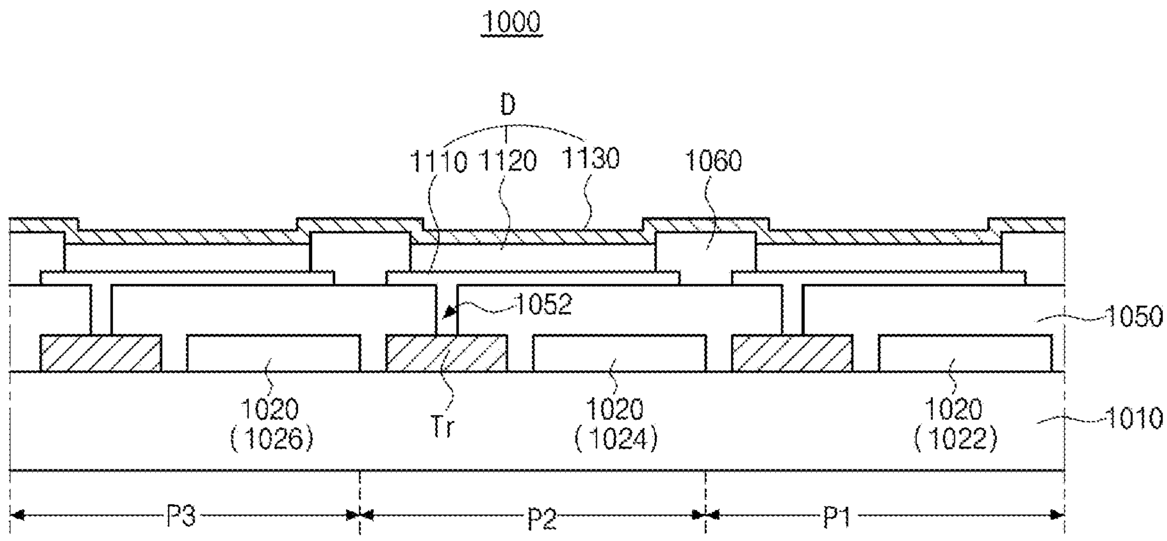
FIG. 17 illustrates a schematic cross-sectional view of an organic light emitting display device as an organic light emitting device in accordance with another example embodiment of the present disclosure.

FIG. 17 illustrates a schematic cross-sectional view of an organic light emitting display device as an organic light emitting device in accordance with another example embodiment of the present disclosure. As illustrated in FIG. 17, the organic light emitting display device 1000 comprise a substrate 1010 defining a first pixel region P1, a second pixel region P2 and a third pixel region P3, a thin film transistor Tr disposed over the substrate 1010, an OLED D disposed over the thin film transistor Tr and connected to the thin film transistor Tr, and a color filter layer 1020 corresponding to the first to third pixel regions P1, P2 and P3. As an example, the first pixel region P1 may be a blue pixel region, the second pixel region P2 may be a green pixel region and the third pixel region P3 may be a red pixel region.

The substrate 1010 may be a glass substrate or a flexible substrate. For example, the flexible substrate may be any one of a P1 substrate, a PES substrate, a PEN substrate, a PET substrate and a PC substrate. The thin film transistor Tr is located over the substrate 1010. Alternatively, a buffer layer may be disposed over the substrate 1010 and the thin film transistor Tr may be disposed on the buffer layer. As illustrated in FIG. 2, the thin film transistor Tr includes a semiconductor layer, a gate electrode, a source electrode and a drain electrode and acts as a driving element.

The color filter layer 1020 is located on the substrate 1010. As an example, the color filter layer 1020 may comprise a first color filter layer 1022 corresponding to the first pixel region P1, a second color filter layer 1024 corresponding to the second pixel region P2 and a third color filter layer 1026 corresponding to the third pixel region P3. The first color filter layer 1022 may be a blue color filter layer, the second color filter layer 1024 may be a green color filter layer and the third color filter layer 1026 may be a red color filter layer. For example, the first color filter layer 1022 may comprise at least one of blue dye or blue pigment, the second color filter layer 1024 may comprise at least one of green dye or green pigment and the third color filter layer 1026 may comprise at least one of red dye or red pigment.

A passivation layer 1050 is disposed on the thin film transistor Tr and the color filter layer 1020. The passivation layer 1050 has a flat top surface and a drain contact hole 1052 that exposes a drain electrode of the thin film transistor Tr.

The OLED D is disposed on the passivation layer 1050 and corresponds to the color filter layer 1020. The OLED D includes a first electrode 1110 that is connected to the drain electrode of the thin film transistor Tr, and an emissive layer 1120 and a second electrode 1130 each of which is disposed sequentially on the first electrode 1110. The OLED D emits white light in the first to third pixel regions P1, P2 and P3.

The first electrode 1110 is separately formed for each of the first to third pixel regions P1, P2 and P3, and the second electrode 1130 corresponds to the first to third pixel regions P1, P2 and P3 and is formed integrally. The first electrode 1110 may be one of an anode and a cathode, and the second electrode 1130 may be the other of the anode and the cathode. Also, the first electrode 1110 may be a transmissive electrode and the second electrode 1130 may be a reflective electrode.

For example, the first electrode 1110 may be an anode and may include conductive material having a relatively high work function value, i.e., a transparent conductive oxide layer of transparent conductive oxide (TCO). The second electrode 1130 may be a cathode and may include conductive material having relatively low work function value, i.e., a metal material layer of low-resistant metal. For example, the transparent conductive oxide layer of the first electrode 1110 may include any one of ITO, IZO, ITZO, SnO, ZnO, ICO and AZO, and the second electrode 1130 may include Al, Mg, Ca, Ag, alloy thereof (e.g. Mg—Ag) or combination thereof.

The emissive layer 1120 is disposed on the first electrode 1110. The emissive layer 1120 includes at least two emitting parts emitting different colors. Each of the emitting parts may have a single-layered structure of an EML. Alternatively, each of the emitting parts may include at least one of an HIL, an HTL, an EBL, an HBL, an ETL and an EIL. In addition, the emissive layer 1120 may further comprise a CGL disposed between the emitting parts.

At least one of the at least two emitting parts may comprise the first compound DF of the delayed fluorescent material having the structure of Formulae 1 to 6, the second compound FD of the fluorescent material having the structure of Formulae 7 to 9, and optionally, the third compound H of the host.

A bank layer 1060 is disposed on passivation layer 1050 in order to cover edges of the first electrode 1110. The bank layer 1060 corresponds to each of the first to third pixel regions P1, P2 and P3 and exposes a center of the first electrode 1110. As described above, since the OLED D emits white light in the first to third pixel regions P1, P2 and P3, the emissive layer 1120 may be formed as a common layer without being separated in the first to third pixel regions P1, P2 and P3. The bank layer 1060 is formed to prevent current leakage from the edges of the first electrode 1110, and the bank layer 1060 may be omitted.

Moreover, the organic light emitting display device 1000 may further comprise an encapsulation film disposed on the second electrode 1130 in order to prevent outer moisture from penetrating into the OLED D. In addition, the organic light emitting display device 1000 may further comprise a polarizing plate disposed under the substrate 1010 in order to decrease external light reflection.

In the organic light emitting display device 1000 in FIG. 17, the first electrode 1110 is a transmissive electrode, the second electrode 1130 is a reflective electrode, and the color filter layer 1020 is disposed between the substrate 1010 and the OLED D. That is, the organic light emitting display device 1000 is a bottom-emission type. Alternatively, the first electrode 1110 may be a reflective electrode, the second electrode 1130 may be a transmissive electrode (or semi-transmissive electrode) and the color filter layer 1020 may be disposed on the OLED D in the organic light emitting display device 1000.

In the organic light emitting display device 1000, the OLED D located in the first to third pixel regions P1, P2 and P3 emits white light, and the white light passes through each of the first to third color filter layers 1022, 1024 and 1026 so that each of a blue color, a green color and a red color is displayed in the first to third pixel regions P1, P2 and P3, respectively.

A color conversion film may be disposed between the OLED D and the color filter layer 1020. The color conversion film corresponds to the first to third pixel regions P1, P2 and P3, and comprises a blue color conversion film, a green color conversion film and a red color conversion film each of which can convert the white light emitted from the OLED D into blue light, green light and red light, respectively. For example, the color conversion film may comprise quantum dots. Accordingly, the organic light emitting display device 1000 may further enhance its color purity. Alternatively, the color conversion film may displace the color filter layer 1020.

Figure 18:
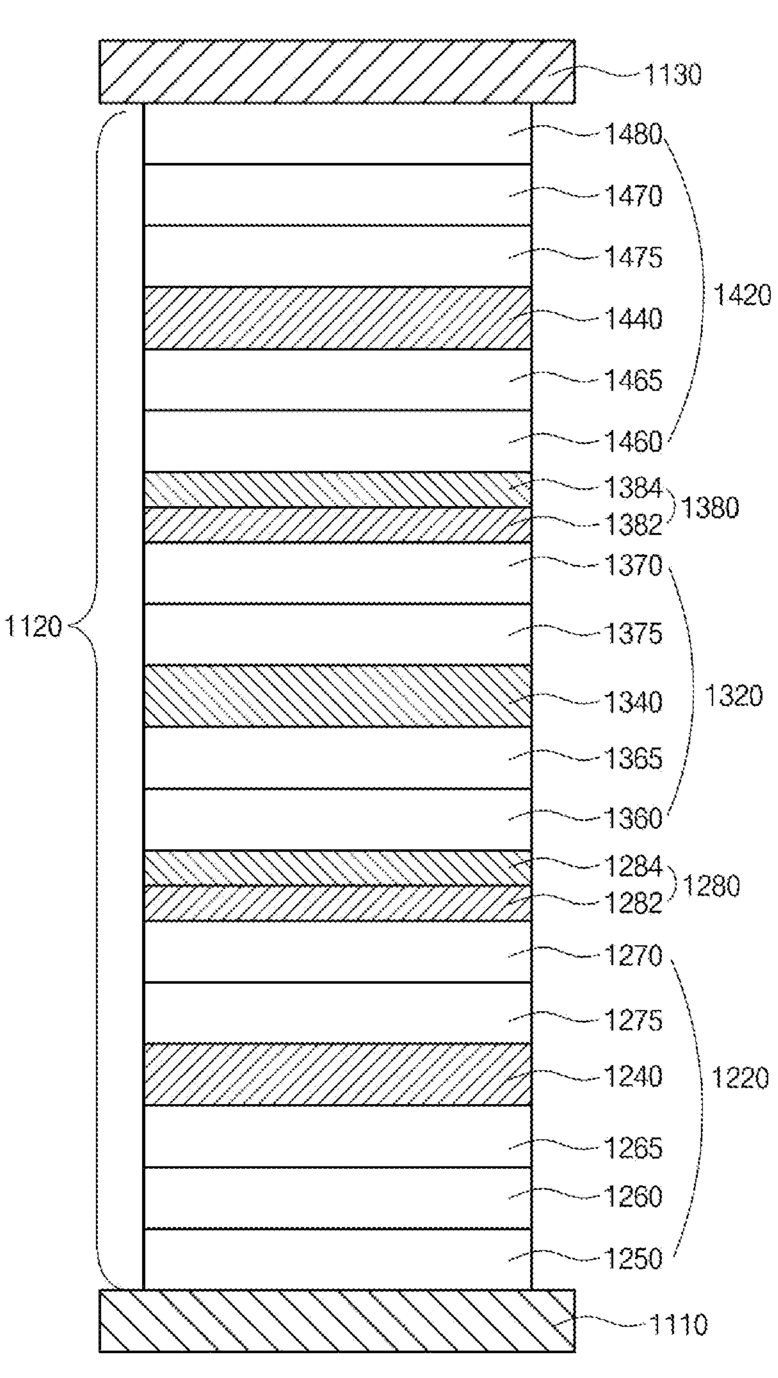
FIG. 18 illustrates a schematic cross-sectional view of an organic light emitting diode in accordance with another example embodiment of the present disclosure.

FIG. 18 illustrates a schematic cross-sectional view of an organic light emitting diode in accordance with another example embodiment of the present disclosure. As illustrated in FIG. 18, the OLED D6 comprises first and second electrodes 1110 and 1130 facing each other and an emissive layer 1120 disposed between the first and second electrodes 1110 and 1130. The first electrode 1110 may be an anode and the second electrode 1130 may be a cathode. For example, the first electrode 1110 may be a transmissive electrode and the second electrode 1130 may be a reflective electrode.

The emissive layer 1120 includes a first emitting part 1220 comprising a first EML (EML1, lower EML) 1240, a second emitting part 1320 comprising a second EML (EML2, middle EML) 1340 and a third emitting part 1420 comprising a third EML (EML3, upper EML) 1440. In addition, the emissive layer 1120 may further comprise a first charge generation layer (CGL1) 1280 disposed between the first emitting part 1220 and the second emitting part 1320 and a second charge generation layer (CGL2) 1380 disposed between the second emitting part 1320 and the third emitting part 1420. Accordingly, the first emitting part 1220, the CGL1 1280, the second emitting part 1320, the CGL2 1380 and the third emitting part 1420 are disposed sequentially on the first electrode 1110.

The first emitting part 1220 may further comprise at least one of an HIL 1250 disposed between the first electrode 1110 and the EML1 1240, a first HTL (HTL1) 1260 disposed between the EML1 1240 and the HIL 1250 and a first ETL (ETL1) 1270 disposed between the EML1 1240 and the CGL1 1280. Alternatively, the first emitting part 1220 may further comprise at least one of a first EBL (EBL1) 1265 disposed between the HTL1 1260 and the EML1 1240 and a first HBL (HBL1) 1275 disposed between the EML1 1240 and the ETL1 1270.

The second emitting part 1320 may further comprise at least one of a second HTL (HTL2) 1360 disposed between the CGL1 1280 and the EML2 1340, a second ETL (ETL2) 1370 disposed between the EML2 1340 and the CGL2 1380. Alternatively, the second emitting part 1320 may further comprise at least one of a second EBL (EBL2) 1365 disposed between the HTL2 1360 and the EML2 1340 and a second HBL (HBL2) 1375 disposed between the EML2 1340 and the ETL2 1370.

The third emitting part 1420 may further comprise at least one of a third HTL (HTL3) 1460 disposed between the CGL2 1380 and the EML3 1440, a third ETL (ETL3) 1470 disposed between the EML3 1440 and the second electrode 1130 and an EIL 1480 disposed between the ETL3 1470 and the second electrode 1130. Alternatively, the third emitting part 1420 may further comprise at least one of a third EBL (EBL3) 1465 disposed between the HTL3 1460 and the EML3 1440 and a third HBL (HBL3) 1475 disposed between the EML3 1440 and the ETL3 1470.

The CGL1 1280 is disposed between the first emitting part 1220 and the second emitting part 1320. That is, the first emitting part 1220 and the second emitting part 1320 are connected via the CGL1 1280. The CGL1 1280 may be a PN-junction CGL that junctions a first N-type CGL (N-CGL1) 1282 with a first P-type CGL (P-CGL1) 1284.

The N-CGL1 1282 is disposed between the ETL1 1270 and the HTL2 1360 and the P-CGL1 1284 is disposed between the N-CGL1 1282 and the HTL2 1360. The N-CGL1 1282 transports electrons to the EML1 1240 of the first emitting part 1220 and the P-CGL1 1284 transport holes to the EML2 1340 of the second emitting part 1320.

The CGL2 1380 is disposed between the second emitting part 1320 and the third emitting part 1420. That is, the second emitting part 1320 and the third emitting part 1420 are connected via the CGL2 1380. The CGL2 1380 may be a PN-junction CGL that junctions a second N-type CGL (N-CGL2) 1382 with a second P-type CGL (P-CGL2) 1384.

The N-CGL2 1382 is disposed between the ETL2 1370 and the HTL3 1460 and the P-CGL2 1384 is disposed between the N-CGL2 1382 and the HTL3 1460. The N-CGL2 1382 transports electrons to the EML2 1340 of the second emitting part 1320 and the P-CGL2 1384 transport holes to the EML3 1440 of the third emitting part 1420.

In an example embodiment, one of the first to third EMLs 1240, 1340 and 1440 may be a blue EML, another of the first to third EMLs 1240, 1340 and 1440 may be a green EML and the third of the first to third EMLs 1240, 1340 and 1440 may be a red EML.

As an example, the EML1 1240 may be a blue EML, the EML2 1340 may be a green EML and the EML3 1440 may be a red EML. Alternatively, the EML1 1240 may be a red EML, the EML2 1340 may be a green EML and the EML3 1440 may be a blue EML. Hereinafter, the OLED D6 where the EML1 1240 is the blue EML, the EML2 1340 is the green EML and the EML3 1440 is the red EML will be described.

The EML1 1240 may comprise the first compound DF of the delayed fluorescent material having the structure of Formulae 1 to 6, the second compound FD of the fluorescent material having the structure of Formulae 7 to 9, and optionally, the third compound H of the host. The EML1 1240 may have a single-layered structure, a double-layered structure (FIG. 8) or a triple-layered structure (FIG. 11).

In the EML1 1240, the contents of the third compound H may be larger than the contents of the first compound DF, and the contents of the first compound DF is larger than the contents of the second compound FD. In this case, exciton energy can be transferred efficiently from the first compound DF to the second compound FD.

The EML2 1340 may include a host and a green dopant and the EML3 1440 may include a host and a red dopant. As an example, the host in the EML2 1340 and the EML3 1440 may comprise the third compound H, and each of the green dopant and the red dopant may comprise at least one of green or red phosphorescent material, green or red fluorescent material and green or red delayed fluorescent material.

The OLED D6 emits white light in each of the first to third pixel regions P1, P2 and P3 and the white light passes though the color filter layer 1020 (FIG. 17) correspondingly disposed in the first to third pixel regions P1, P2 and P3. Accordingly, the organic light emitting display device 1000 (FIG. 170) can implement a full-color image.

Figure 19:
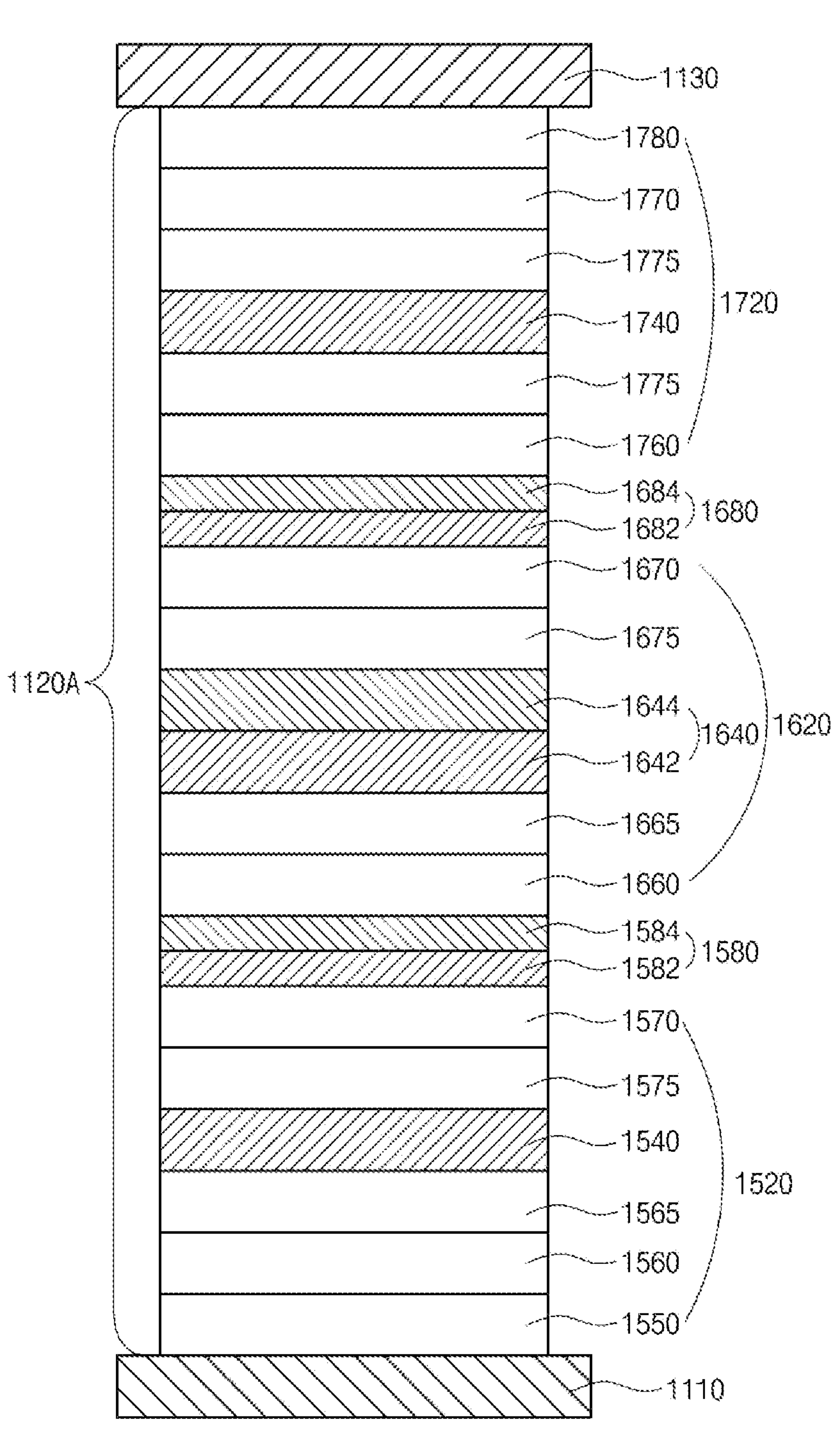
FIG. 19 illustrates a schematic cross-sectional view of an organic light emitting diode in accordance with another example embodiment of the present disclosure.

FIG. 19 illustrates a schematic cross-sectional view of an organic light emitting diode in accordance with another example embodiment of the present disclosure. As illustrated in FIG. 19, the OLED D7 comprises first and second electrodes 1110 and 1130 facing each other and an emissive layer 1120A disposed between the first and second electrodes 1110 and 1130.

The first electrode 1110 may be an anode and the second electrode 1130 may be a cathode. For example, the first electrode 1110 may be a transmissive electrode and the second electrode 1130 may be a reflective electrode.

The emissive layer 1120A includes a first emitting part 1520 comprising an EML1(lower EML) 1540, a second emitting part 1620 comprising an EML2 (middle EML) 1640 and a third emitting part 1720 comprising an EML3 (upper EML) 1740. In addition, the emissive layer 1120A may further comprise a CGL1 1580 disposed between the first emitting part 1520 and the second emitting part 1620 and a CGL2 1680 disposed between the second emitting part 1620 and the third emitting part 1720. Accordingly, the first emitting part 1520, the CGL1 1580, the second emitting part 1620, the CGL2 1680 and the third emitting part 1720 are disposed sequentially on the first electrode 1110.

The first emitting part 1520 may further comprise at least one of an HIL 1550 disposed between the first electrode 1110 and the EML1 1540, an HTL1 1560 disposed between the EML1 1540 and the HIL 1550 and an ETL1 1570 disposed between the EML1 1540 and the CGL1 1580. Alternatively, the first emitting part 1520 may further comprise at least one of an EBL1 1565 disposed between the HTL1 1560 and the EML1 1540 and an HBL1 1575 disposed between the EML1 1540 and the ETL1 1570.

The EML2 1640 of the second emitting part 1620 comprises a middle lower EML (first layer) 1642 and a middle upper EML (second layer) 1644. The middle lower EML1 642 is located adjacently to the first electrode 1110 and the middle upper EML1 644 is located adjacently to the second electrode 1130. In addition, the second emitting part 1620 may further comprise at least one of an HTL2 1660 disposed between the CGL1 1580 and the EML2 1640, and an ETL2 1670 disposed between the EML2 1640 and the CGL2 1680. Alternatively, the second emitting part 1620 may further comprise at least one of an EBL2 1665 disposed between the HTL2 1660 and the EML2 1640 and an HBL2 1675 disposed between the EML2 1640 and the ETL2 1670.

The third emitting part 1720 may further comprise at least one of an HTL3 1760 disposed between the CGL2 1680 and the EML3 1740, an ETL3 1770 disposed between the EML3 1740 and the second electrode 1130 and an EIL 1780 disposed between the ETL3 1770 and the second electrode 1130. Alternatively, the third emitting part 1720 may further comprise at least one of an EBL3 1765 disposed between the HTL3 1760 and the EML3 1740 and an HBL3 1775 disposed between the EML3 1740 and the ETL3 1770.

The CGL1 1580 is disposed between the first emitting part 1520 and the second emitting part 1620. That is, the first emitting part 1520 and the second emitting part 1620 are connected via the CGL1 1580. The CGL1 1580 may be a PN-junction CGL that junctions an N-CGL1 1582 with a P-CGL1 1584. The N-CGL1 1582 is disposed between the ETL1 1570 and the HTL2 1660 and the P-CGL1 1584 is disposed between the N-CGL1 1582 and the HTL2 1660.

The CGL2 1680 is disposed between the second emitting part 1620 and the third emitting part 1720. That is, the second emitting part 1620 and the third emitting part 1720 are connected via the CGL2 1680. The CGL2 1680 may be a PN-junction CGL that junctions an N-CGL2 1682 with a P-CGL2 1684. The N-CGL2 1682 is disposed between the ETL2 1670 and the HTL3 1760 and the P-CGL2 1684 is disposed between the N-CGL2 1682 and the HTL3 1760.

In an example embodiment, each of the EML1 1540 and the EML3 1740 may be a blue EML. In an example embodiment, each of the EML1 1540 and the EML3 1740 may comprise the first compound DF of the delayed fluorescent material having the structure of Formulae 1 to 6, the second compound FD of the fluorescent material having the structure of Formulae 7 to 9, and optionally, the third compound H of the host. Each of the first compound DF, the second compound FD and the third compound H in the EML1 1540 may be identical to or different from each of the first compound DF, the second compound FD and the third compound H in the EML3 1740, respectively. Alternatively, the EML3 1740 may include another compound that is different from at least one of the first compound DF and the second compound FD in the EML1 1540, and thus the EML3 1740 may emit light different from the light emitted from the EML1 1540 or may have different luminous efficiency from the luminous efficiency of the EML1 1540.

As an example, when each of the EML1 1540 and the EML3 1740 includes the first compound DF, the second compound FD and the third compound H, the contents of the third compound H may be larger than the contents of the first compound DF, and the contents of the first compound DF is larger than the contents of the second compound FD in each of the EML1 1540 and the EML3 1740. In this case, exciton energy can be transferred efficiently from the first compound DF to the second compound FD.

One of the middle lower EML (first layer) 1642 and the middle upper EML (second layer) 1644 in the EML2 1640 may be a green EML and the other of the lower EML1 642 and the upper EML1 644 in the EML2 1640 may be a red EML. The green EML and the red EML is sequentially disposed to form the EML2 1640.

For example, the middle lower EML1 642 of the green EML may comprise a host and a red dopant and the middle upper EML1 644 of the red EML may comprise a host and a green dopant. As an example, the host may include the third compound H, and each of the green dopant and the red dopant may comprise at least one of green or red phosphorescent material, green or red fluorescent material and green or red delayed fluorescent material.

The OLED D7 emits white light in each of the first to third pixel regions P1, P2 and P3 and the white light passes though the color filter layer 1020 (FIG. 17) correspondingly disposed in the first to third pixel regions P1, P2 and P3. Accordingly, the organic light emitting display device 1000 (FIG. 17) can implement a full-color image.

In FIG. 19, the OLED D7 has a three-stack structure including the first to three emitting parts 1520, 1620 and 1720 which includes the EML1 1540 and the EML3 1740 as a blue EML. Alternatively, the OLED D7 may have a two-stack structure where one of the first emitting part 1520 and the third emitting part 1720 each of which includes the EML1 1540 and the EML3 1740 as a blue EML is omitted.

Hereinafter, while the present disclosure will be described by exemplary examples, the present disclosure is not limited to the following examples.

Example 1 (Ex. 1): Fabrication of OLED

An OLED comprising an EML into which Compound 1-1 of Formula 6 (HOMO: −5.6 eV, LUMO: −2.9 eV as the first compound DF, Compound 2-1 of Formula 9 (HOMO: −5.6 eV, LUMO: −2.9 eV) as the second compound FD and mCBP (HOMO: −6.0 eV, LUMO: −2.5 eV) as the third compound H was introduced was fabricated.

An ITO-attached substrate was washed by UV-Ozone treatment before using, and was transferred to a vacuum chamber for depositing emission layer. Subsequently, an anode, an emission layer and a cathode were deposited by evaporation from a heating boat under $10^{-7}$ torr vacuum condition with setting deposition rate of 1 Å/s in the following order:

An anode (ITO, 50 nm); an HIL (HAT-CN, 7 nm); an HTL (NPB, 45 nm); an EBL (TAPC, 10 nm), an EML (mCBP (69 wt %), Compound 1-1 (30 wt %) and Compound 2-1 (1 wt %), 35 nm); an HBL (B3PYMPM, 10 nm); an ETL (TPBi, 25 nm), an EIL (LiF); and a cathode (Al).

After laminating the CPL (capping layer), the OLED was encapsulated with glass. After depositing the emissive layer and the cathode, the OLED was transferred from the deposition chamber to a dry box for forming films, and finally encapsulated using UV curable epoxy and getter. Structures of organic compounds used in the emissive layer are shown below.

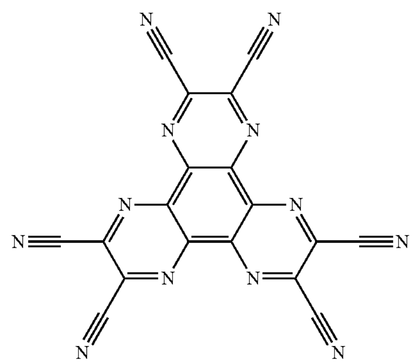

HIL:HAT-CN

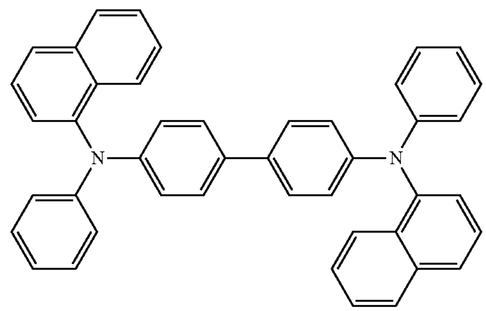

HTL:NPB

-continued

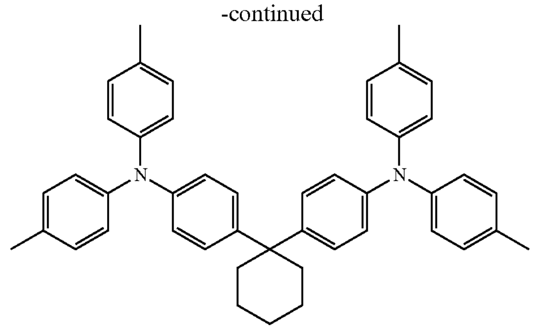

EBL:TAPC

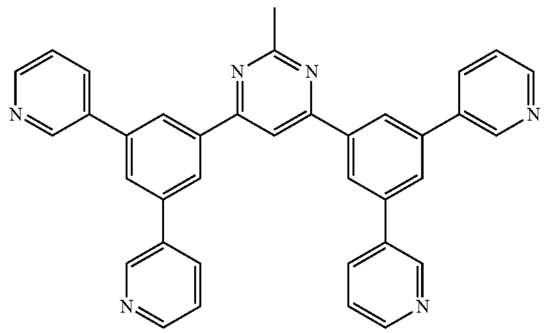

HBL:B3PYMPM

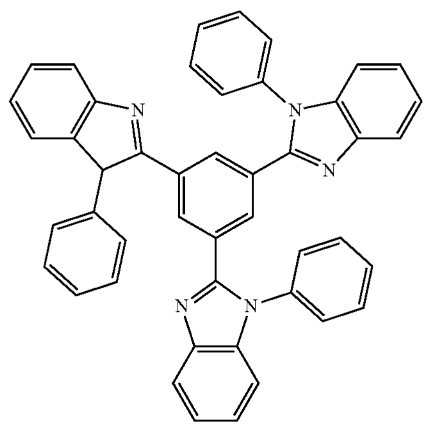

ETL:TPBi

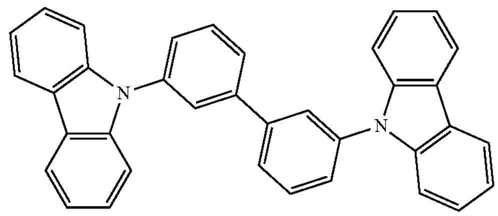

Host:mCBP

Example 2 (Ex. 2): Fabrication of OLED

An OLED was fabricated using the same materials as Example 1, except that Compound 1-13 (HOMO: −5.5 eV, LUMO: −2.8 eV) of Formula 6 instead of Compound 1-1 as the first compound in the EML was used.

Example 3 (Ex. 3): Fabrication of OLED

An OLED was fabricated using the same materials as Example 1, except that Compound 2-20 (HOMO: −5.5 eV, LUMO: −2.8 eV) of Formula 9 instead of Compound 2-1 as the second compound in the EML was used.

Example 4 (Ex. 4): Fabrication of OLED

An OLED was fabricated using the same materials as Example 1, except that Compound 1-13 (HOMO: −5.5 eV, LUMO: −2.8 eV) of Formula 6 instead of Compound 1-1 as the first compound and Compound 2-20 instead of Compound 2-1 as the second compound in the EML were used.

Example 5 (Ex. 5): Fabrication of OLED

An OLED was fabricated using the same materials as Example 1, except that Compound 1-8 (HOMO: −5.5 eV, LUMO: −2.9 eV) of Formula 6 instead of Compound 1-1 as the first compound in the EML was used.

Example 6 (Ex. 6): Fabrication of OLED

An OLED was fabricated using the same materials as Example 1, except that Compound 1-9 (HOMO: −5.6 eV, LUMO: −2.8 eV) of Formula 6 instead of Compound 1-1 as the first compound in the EML was used.

Example 7 (Ex. 7): Fabrication of OLED

An OLED was fabricated using the same materials as Example 1, except that Compound 1-8 of Formula 6 instead of Compound 1-1 as the first compound and Compound 2-20 of Formula 9 instead of Compound 2-1 as the second compound in the EML were used.

Example 8 (Ex. 8): Fabrication of OLED

An OLED was fabricated using the same materials as Example 1, except that Compound 1-9 of Formula 6 instead of Compound 1-1 as the first compound and Compound 2-20 of Formula 9 instead of Compound 2-1 as the second compound in the EML were used.

Example 9 (Ex. 9): Fabrication of OLED

An OLED was fabricated using the same materials as Example 1, except that mCBP and Compound 1-1 was admixed with a weight ratio of 70:30 without the second compound in the EML.

Examples 10-12 (Ex. 10-12): Fabrication of OLED

An OLED was fabricated using the same materials as Example 9, except that each of Compound 1-13 (Ex. 10), Compound 1-8 (Ex. 11) and Compound 1-9 (Ex. 12) instead of Compound 1-1 as the first compound without the second compound in the EML was used.

Comparative Examples 1-5 (Ref. 1-5): Fabrication of OLED

An OLED was fabricated using the same materials as Example 1, except that mCBP and the below Compound Ref. 1-1 (HOMO: −5.2 eV, LUMO: −1.9 eV) were admixed with a weight ratio of 80:20 in the EML (Ref. 1), mCBP and the below Compound Ref. 1-2 (HOMO: −5.2 eV, LUMO: −1.9 eV) were admixed with a weight ratio of 80:20 in the EML (Ref. 2), mCBP and the below Compound Ref. 1-3 (HOMO: −5.1 eV, LUMO: −1.9 eV) were admixed with a weight ratio of 80:20 in the EML (Ref. 3), mCBP and the following Compound Ref. 1-4 (HOMO: −5.2 eV, LUMO: −1.9 eV) were admixed with a weight ratio of 80:20, and mCBP and the following Compound Ref. 1-5 (HOMO: −5.5 eV, LUMO: −2.7 eV) were admixed with a weight ratio of 80:20 in the EML.

Comparative Example 6 (Ref. 6): Fabrication of OLED

An OLED was fabricated using the same materials as Example 1, except that below Compound Ref. 1-5 instead of Compound 1-1 as the first compound in the EML was used.

Comparative Example 7 (Ref. 7): Fabrication of OLED

An OLED was fabricated using the same materials as Example 1, except that below Compound Ref. 2-1 (HOMO: −5.2 eV, LUMO: −2.7 eV) instead of Compound 2-1 as the second compound in the EML was used.

Comparative Example 8 (Ref. 8): Fabrication of OLED

An OLED was fabricated using the same materials as Example 1, except that below Compound Ref. 2-2 (HOMO: −5.2 eV, LUMO: −2.6 eV) instead of Compound 2-1 as the second compound in the EML was used.

Comparative Example 9 (Ref. 9): Fabrication of OLED

An OLED was fabricated using the same materials as Example 1, except that Compound 1-1 of Formula 6 instead of Compound 1-1 as the first compound and below Compound Ref. 2-1 instead of Compound 2-1 as the second compound in the EML were used.

Comparative Example 10 (Ref. 10): Fabrication of OLED

An OLED was fabricated using the same materials as Example 1, except that Compound 1-13 of Formula 6 instead of Compound 1-1 as the first compound and below Compound Ref. 2-2 instead of Compound 2-1 as the second compound in the EML were used.

Comparative Example 11 (Ref. 11): Fabrication of OLED

An OLED was fabricated using the same materials as Example 1, except that below Compound Ref. 1-6 (HOMO: −5.9 eV, LUMO: −2.8 eV) instead of Compound 1-1 as the first compound in the EML was used.

Comparative Example 12 (Ref. 12): Fabrication of OLED

An OLED was fabricated using the same materials as Example 1, except that below Compound Ref. 1-6 instead of Compound 1-1 as the first compound and Compound 2-20 of Formula 9 instead of Compound 2-1 as the second compound in the EML were used.

Comparative Example 13 (Ref. 13): Fabrication of OLED

An OLED was fabricated using the same materials as Example 1, except that below Compound Ref. 1-6 instead of Compound 1-1 as the first compound and below Compound Ref. 2-1 instead of Compound 2-1 as the second compound in the EML were used.

Comparative Example 14 (Ref. 14): Fabrication of OLED

An OLED was fabricated using the same materials as Example 1, except that below Compound Ref. 1-6 instead of Compound 1-1 as the first compound and below Compound Ref. 2-2 instead of Compound 2-1 as the second compound in the EML were used.

[Reference Compounds]

Ref.1-1

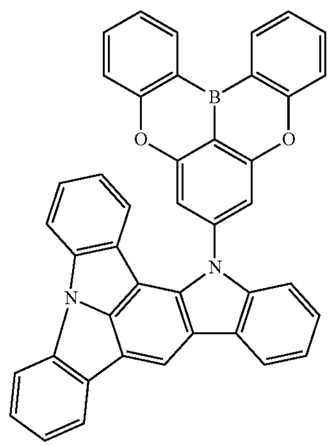

Ref.1-2

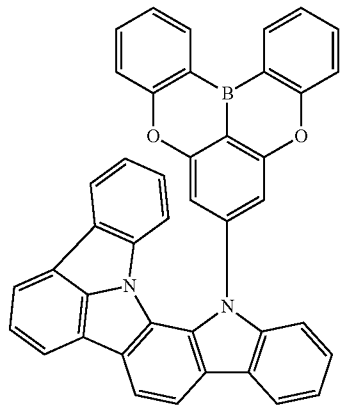

-continued

Ref.1-3

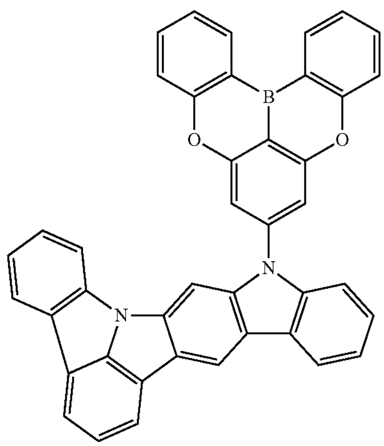

Ref.1-4

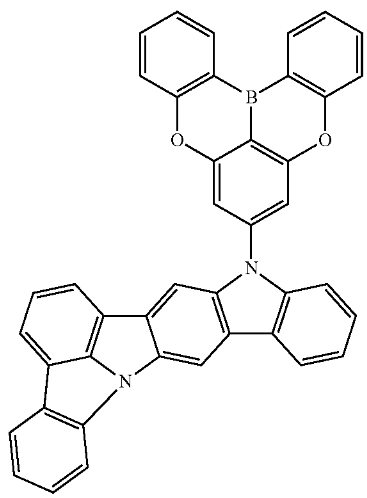

Ref.1-5

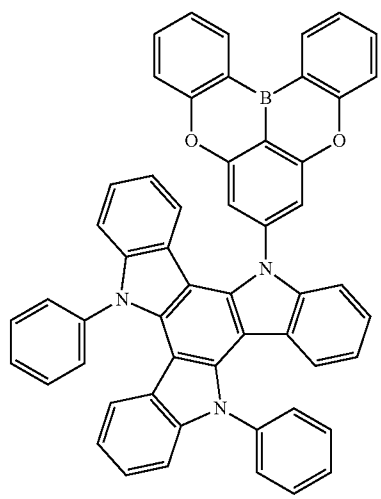

-continued

Ref.1-6

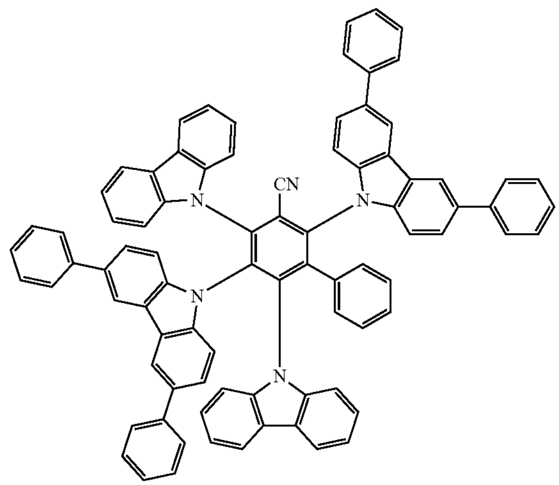

Ref.2-1

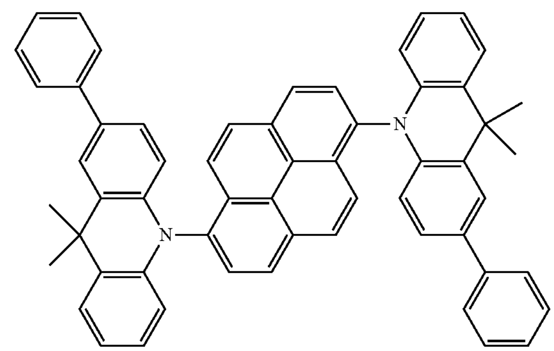

Ref.2-2

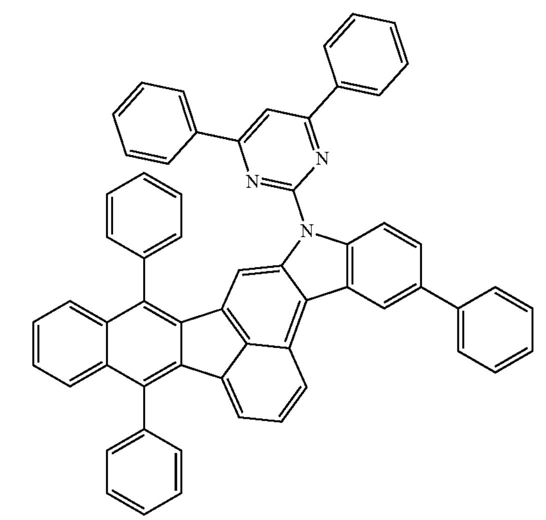

Table 1 shows measurement results of bonding dissociation energies (BOE) between an electron donor moiety and an electron acceptor moiety in a neutral state, an anion state and a cation state in the Compound 1-1 (boron ring moiety as the electron donor and fused carbazole moiety as the electron donor are linked via C—C bond), which was used as the first compound in Ex. 1, and Compound Ref. 1-5 (boron ring moiety as the electron donor and fused carbazole moiety as the electron donor are linked via C—N bond), which was used as the first compound in Ref. 1. It can be seen that bonding dissociation energy of Compound 1-1 was greatly increased.

TABLE 1

| BOE of Compound 1-1 and Compound Ref. 1-5 | | | |
|---|---|---|---|
| | Neutral | Anion | Cation |
| Compound 1-1 | | | |
| Electron donor Radical(eV) | 4.85 | 4.88 | 5.57 |
| Electron Acceptor Radical(eV) | 4.85 | 4.38 | 6.51 |
| Compound Ref. 1-5 | | | |
| Electron donor Radical(eV) | 3.00 | 1.54 | 3.15 |
| Electron Acceptor Radical (eV) | 3.00 | 2.63 | 4.65 |

Tables 2 and 3 shows HOMO energy level, LUMO energy level of the first compound and the second compound and energy bandgap (ΔHOMO) between the first compound and the second compound used in Ex. 1 to Ex. 12 and Ref. 1 to Ref. 14.

TABLE 2

| First and Second Compound in the EML | | | | | | | | |
|---|---|---|---|---|---|---|---|---|
| | First Compound | | | Second Compound | | | | |
| Sample | Compound | HOMO (eV) | LUMO (eV) | Compound | HOMO (eV) | LUMO (eV) | ΔHOMO (eV) | ΔLUMO (eV) |
| Ex. 1 | 1-1 | −5.6 | −2.9 | 2-1 | −5.6 | −2.9 | 0.0 | 0.0 |
| Ex. 2 | 1-13 | −5.5 | −2.8 | 2-1 | −5.6 | −2.9 | 0.1 | 0.1 |
| Ex. 3 | 1-1 | −5.6 | −2.9 | 2-20 | −5.4 | −2.8 | 0.2 | 0.1 |
| Ex. 4 | 1-13 | −5.5 | −2.8 | 2-20 | −5.4 | −2.8 | 0.2 | 0.0 |
| Ex. 5 | 1-8 | −5.5 | −2.9 | 2-1 | −5.6 | −2.9 | 0.1 | 0.0 |
| Ex. 6 | 1-9 | −5.6 | −2.8 | 2-1 | −5.6 | −2.9 | 0.0 | 0.1 |
| Ex. 7 | 1-8 | −5.5 | −2.9 | 2-20 | −5.4 | −2.8 | 0.1 | 0.1 |
| Ex. 8 | 1-9 | −5.6 | −2.8 | 2-20 | −5.4 | −2.8 | 0.2 | 0.0 |
| Ex. 9 | 1-1 | −5.6 | −2.9 | — | — | — | — | — |
| Ex. 10 | 1-2 | −5.5 | −2.8 | — | — | — | — | — |
| Ex. 11 | 1-3 | −5.5 | −2.9 | — | — | — | — | — |
| Ex. 12 | 1-3 | −5.6 | −2.8 | — | — | — | — | — |

TABLE 3

| First and Second Compound in the EML | | | | | | | | |
|---|---|---|---|---|---|---|---|---|
| | First Compound | | | Second Compound | | | | |
| Sample | Compound | HOMO (eV) | LUMO (eV) | Compound | HOMO (eV) | LUMO (eV) | ΔHOMO (eV) | ΔLUMO (eV) |
| Ref. 1 | Ref. 1-1 | −5.2 | −1.9 | — | — | | — | |
| Ref. 2 | Ref. 1-2 | −5.2 | −1.9 | — | — | | — | |
| Ref. 3 | Ref. 1-3 | −5.1 | −1.9 | — | — | | — | |
| Ref. 4 | Ref. 1-4 | −5.2 | −1.9 | — | — | | — | |
| Ref. 5 | Ref. 1-5 | −5.5 | −2.7 | — | — | | — | |
| Ref. 6 | Ref. 1-5 | −5.5 | −2.7 | 2-1 | −5.6 | −2.9 | 0.1 | 0.2 |
| Ref. 7 | 1-1 | −5.6 | −2.9 | Ref. 2-1 | −5.2 | −2.7 | 0.4 | 0.2 |
| Ref. 8 | 1-1 | −5.6 | −2.9 | Ref. 2-2 | −5.2 | −2.6 | 0.4 | 0.3 |
| Ref. 9 | 1-13 | −5.5 | −2.8 | Ref. 2-1 | −5.2 | −2.7 | 0.4 | 0.1 |
| Ref. 10 | 1-13 | −5.5 | −2.8 | Ref. 2-2 | −5.2 | −2.6 | 0.4 | 0.2 |
| Ref. 11 | Ref. 1-6 | −5.9 | −2.8 | 2-1 | −5.6 | −2.9 | 0.3 | 0.1 |
| Ref. 12 | Ref. 1-6 | −5.9 | −2.8 | 2-20 | −5.4 | −2.8 | 0.5 | 0.0 |
| Ref. 13 | Ref. 1-6 | −5.9 | −2.8 | Ref. 2-1 | −5.2 | −2.7 | 0.7 | 0.1 |
| Ref. 14 | Ref. 1-6 | −5.9 | −2.8 | Ref. 2-2 | −5.2 | −2.6 | 0.7 | 0.2 |

Experimental Example 1: Measurement of Luminous Properties of OLED

Each of the OLED fabricated in Ex. 1-12 and Ref. 1-14 was connected to an external power source and then luminous properties for all the diodes with an emission area of 9 $mm^2$ were evaluated using a constant current source (KEITHLEY) and a photometer PR650 at room temperature. In particular, driving voltage (V), current efficiency (cd/A), color coordinate (CIEy), external quantum efficiency (EQE, %), $LT_{95}$ (time period from initial luminance to 95%) at 8.6 $mA/m^2$ current density as well as whether or not hole trap and exciplex formation (in case of forming hole trap and/or exciplex, indicates "Y", in case of not forming hole trap and/or exciplex, indicates "N") were measured. The measurement results for the OLEDs in Ex. 1 to Ex. 12 are shown in the table 4 below and the measurement results for the OLEDs in Ref. 1 to Ref. 14 are shown in the table 5 below.

TABLE 4

Luminous Properties of OLED

| Sample | V | cd/A | CIEy | EQE (%) | Hole trap | Exciplex | $LT_{95}$ (%) |
|---|---|---|---|---|---|---|---|
| Ex. 1 | 4.47 | 36.2 | 0.203 | 20.8 | N | N | 100.0% |
| Ex. 2 | 4.52 | 30.5 | 0.203 | 19.4 | N | N | 46.5% |
| Ex. 3 | 3.95 | 33.4 | 0.202 | 19.5 | N | N | 70.9% |
| Ex. 4 | 4.28 | 28.7 | 0.206 | 18.4 | N | N | 36.2% |
| Ex. 5 | 3.73 | 23.1 | 0.199 | 17.4 | N | N | 54.8% |
| Ex. 6 | 3.56 | 23.1 | 0.201 | 17.2 | N | N | 45.8% |
| Ex. 7 | 3.72 | 23.4 | 0.198 | 17.6 | N | N | 47.7% |
| Ex. 8 | 3.85 | 23.2 | 0.206 | 17.6 | N | N | 47.0% |
| Ex. 9 | 3.20 | 30.0 | 0.380 | 13.4 | — | — | 45.8% |
| Ex. 10 | 3.25 | 18.8 | 0.290 | 15.5 | — | — | 33.8% |
| Ex. 11 | 3.45 | 20.1 | 0.270 | 15.8 | — | — | 31.5% |
| Ex. 12 | 3.63 | 20.4 | 0.279 | 15.8 | — | — | 34.0% |

TABLE 5

Luminous Properties of OLED

| Sample | V | cd/A | CIEy | EQE (%) | Hole trap | Exciplex | $LT_{95}$ (%) |
|---|---|---|---|---|---|---|---|
| Ref. 1 | 3.40 | 22.8 | 0.220 | 14.4 | — | — | 32.4% |
| Ref. 2 | 3.40 | 26.9 | 0.285 | 14.3 | — | — | 41.3% |
| Ref. 3 | 3.20 | 25.5 | 0.260 | 14.5 | — | — | 29.6% |
| Ref. 4 | 3.20 | 28.3 | 0.292 | 14.9 | — | — | 44.0% |
| Ref. 5 | 3.36 | 34.2 | 0.437 | 24.8 | — | — | 44.7% |
| Ref. 6 | 3.46 | 30.2 | 0.348 | 12.3 | N | N | 55.4% |
| Ref. 7 | 3.46 | 15.2 | 0.201 | 10.6 | Y | N | 2.4% |
| Ref. 8 | 3.71 | 19.2 | 0.190 | 14.5 | Y | Y | 3.2% |
| Ref. 9 | 3.95 | 19.0 | 0.233 | 12.1 | Y | N | 6.8% |
| Ref. 10 | 3.90 | 21.2 | 0.185 | 16.6 | Y | N | 4.8% |
| Ref. 11 | 4.01 | 20.8 | 0.202 | 15.1 | Y | N | 5.0% |
| Ref. 12 | 4.21 | 20.5 | 0.229 | 13.5 | Y | N | 5.6% |
| Ref. 13 | 4.19 | 15.4 | 0.191 | 11.2 | Y | Y | 1.7% |
| Ref. 14 | 4.36 | 18.4 | 0.199 | 13.1 | Y | Y | 2.1% |

As indicated in Tables 4 and 5, in the OLEDs where the first compound includes the electron donor moiety and the electron acceptor moiety linked via a carbon-carbon bond, the HOMO energy bandgap between the first and second compounds were less than 0.3 eV and the LUMO energy bandgap between the first and second compounds were less than 0.3 eV, luminous properties were much improved. Particularly, compared to the OLED in Ref. 1 to Ref. 5 where the first compound, where the electron donor moiety and the electron acceptor moiety are linked via a carbon-nitrogen bond, were used as single dopant, in the OLED in Ref. 6 to Ref. 14 where the first compound and the second compound are used together, current density, EQE and $LT_{95}$ were not greatly increased or rather greatly decreased.

On the other hand, compared to the OLED in Ex. 9 to Ex. 12 where the first compound, where the electron donor moiety and the electron acceptor moiety are linked via a carbon-carbon bond, were uses as single dopant, in the OLED in Ex. 1 to Ex. 8 where the first compound and the second compound are used together, current density, EQE and $LT_{95}$ were greatly increased.

As shown in Ref. 9 to Ref. 14, when the HOMO energy bandgap between the first compound and the second compound is more than 0.3 eV, holes were trapped. Also, as shown in Ref. 8 and Ref. 13-14, when both the HOMO energy bandgap and the LUMO energy bandgap between the first and second compounds, or the HOMO energy bandgap between the first compound and the second compound is more than 0.5 eV, exciplex was formed.

Compared to the OLEDs fabricated in Ref. 6 to Ref. 14, the OLED fabricated in Ex. 1 to Ex. 8 reduced its driving voltages up to 18.3%, improved its current density, EQE and luminous lifetime up to 138.2%, 96.2% and 58.8 times, respectively.

It will be apparent to those skilled in the art that various modifications and variations can be made in the OLED and the organic light emitting device including the OLED of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting diode, including:

a first electrode;

a second electrode facing the first electrode; and an emissive layer disposed between the first and second electrodes and including at least one emitting material layer, wherein the at least one emitting material layer includes a first compound and a second compound, wherein the first compound includes an organic compound having the following structure of Formula 1, and wherein the second compound includes an organic compound having the following structure of Formula 7:

[Formula 1]

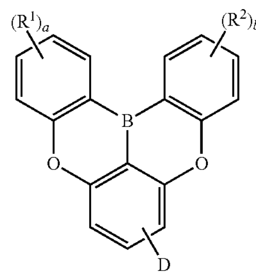

where in the Formula 1, each of $R^1$ and $R^2$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl amino, an unsubstituted or substituted $C_6$-$C_{30}$ aromatic group or an unsubstituted or substituted $C_3$-$C_{30}$ hetero aromatic group, each $R^1$ is different from or identical to each other when a is 2 or more, and each $R^2$ is different from or identical to each other when b is 2 or more, optionally, two adjacent $R^1$ when a is 2 or more and/or two adjacent $R^2$ when b is 2 or more are linked together to form an unsubstituted or substituted $C_6$-$C_{20}$ aromatic ring or an unsubstituted or substituted $C_3$-$C_{20}$ hetero aromatic ring;

D is a moiety having the following structure of Formula 2 or Formula 3; and each of a and b is 4 when each of $R^1$ and $R^2$ is a hydrogen atom, and each of a and b is independently 0, 1, 2, 3 or 4 when each of $R^1$ and $R^2$ is not a hydrogen atom,

[Formula 2]

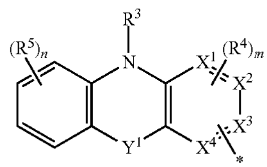

where in the Formula 2, $R^3$ is an unsubstituted $C_6$-$C_{30}$ aromatic group or an unsubstituted or substituted $C_3$-$C_{30}$ hetero aromatic group, each of $R^4$ and $R^5$ is independently a hydrogen atom, a deuterium, a tritium, a halogen atom, an unsubstituted or substituted $C_1$-$C_{20}$ alkyl, an unsubstituted or substituted $C_1$-$C_{20}$ hetero alkyl, an unsubstituted or substituted $C_2$-$C_{20}$ alkenyl, an unsubstituted or substituted $C_2$-$C_{20}$ hetero alkenyl, an unsubstituted or substituted $C_2$-$C_{20}$ alkynyl, an unsubstituted or substituted $C_2$-$C_{20}$ hetero alkynyl, an unsubstituted or substituted $C_1$-$C_{20}$ alkyl silyl, an unsubstituted or substituted $C_1$-$C_{20}$ hetero alkyl silyl, an unsubstituted or substituted $C_1$-$C_{20}$ alkyl amino, an unsubstituted or substituted $C_1$-$C_{20}$ alkoxy, carboxyl, cyano, sulfanyl, phosphine, an unsubstituted or substituted $C_3$-$C_{20}$ alicyclic group, an unsubstituted or substituted $C_3$-$C_{20}$ hetero alicyclic group, an unsubstituted or substituted $C_6$-$C_{30}$ aromatic group or an unsubstituted or substituted $C_3$-$C_{30}$ hetero aromatic group, each $R^4$ is different from or identical to each other when m is 2 or more, and each $R^5$ is different from or identical to each other when n is 2 or more, optionally, two adjacent $R^4$ when m is 2 or more and/or two adjacent $R^5$ when n is 2 or more are linked together to form an unsubstituted or substituted $C_6$-$C_{20}$ aromatic ring or an unsubstituted or substituted $C_3$-$C_{20}$ hetero aromatic ring;

one of $X^1$ to $X^4$ is a carbon atom linked to a hetero ring including a boron atom and an oxygen atom of Formula 1, and other of $X^1$ to $X^4$ is independently $CR^4$ or a nitrogen atom;

$Y^1$ is a single bond;

m is 0, 1, 2 or 3;

n is 0, 1, 2, 3 or 4; and the asterisk indicates a link position,

[Formula 3]

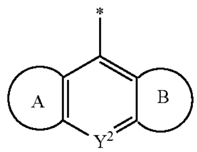

where in the Formula 3, $Y^2$ is $CR^6$ or N, wherein $R^6$ is a hydrogen atom, a deuterium, a tritium or an unsubstituted or substituted $C_1$-$C_{20}$ alkyl;

each of ring A and ring B independently has the following structure of Formula 4; and the asterisk indicated a link position,

[Formula 4]

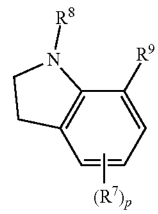

where in the Formula 4, $R^7$ is a deuterium, a tritium, an unsubstituted or substituted $C_1$-$C_{20}$ alkyl, an unsubstituted or substituted $C_1$-$C_{20}$ alkyl amino, an unsubstituted or substituted $C_6$-$C_{30}$ aromatic group or an unsubstituted or substituted $C_3$-$C_{30}$ hetero aromatic group, each $R^7$ is different from or identical to each other when p is 2 or more, optionally, two adjacent $R^7$ when p is 2 or more are linked together to form an unsubstituted or substituted $C_6$-$C_{20}$ aromatic ring or an unsubstituted or substituted $C_3$-$C_{20}$ hetero aromatic ring;

each of $R^8$ and $R^9$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl amino, an unsubstituted or substituted $C_6$-$C_{30}$ aromatic group or an unsubstituted or substituted $C_3$-$C_{30}$ hetero aromatic group, optionally, $R^8$ and $R^9$ are linked together to form an unsubstituted or substituted $C_6$-$C_{20}$ aromatic ring or an unsubstituted or substituted $C_3$-$C_{20}$ hetero aromatic ring; and p is 0, 1, 2, or 3,

[Formula 7]

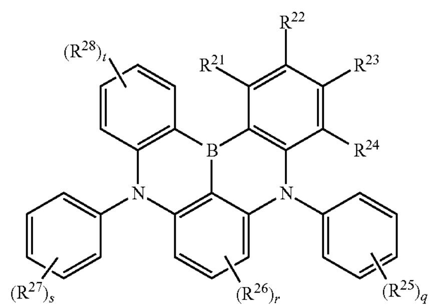

where in the Formula 7, each of $R^{21}$ to $R^{24}$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl silyl, an unsubstituted or substituted $C_1$-$C_{20}$ alkyl amino, an unsubstituted or substituted $C_6$-$C_{30}$ aromatic group or an unsubstituted or substituted $C_3$-$C_{20}$ hetero aromatic group, optionally, two adjacent groups among $R^{21}$ to $R^{24}$ are linked together to form an unsubstituted or substituted fused ring having a boron atom and a nitrogen atom;

each of $R^{25}$ to $R^{28}$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl silyl, an unsubstituted or substituted $C_1$-$C_{20}$ alkyl amino, an unsubstituted or substituted $C_6$-$C_{30}$ aromatic group or an unsubstituted or substituted $C_3$-$C_{20}$ hetero aromatic group, each $R^{25}$ is different from or identical to each other when q is 2 or more, each $R^{26}$ is different from or identical to each other when r is 2 or more, each $R^{27}$ is different from or identical to each other when s is 2 or more and each $R^{28}$ is different from or identical to each other when t is 2 or more;

each of q and s is independently 0, 1, 2, 3, 4 or 5;

r is 0, 1, 2 or 3; and t is 0, 1, 2, 3 or 4.

2. The organic light emitting diode of claim 1, wherein a highest occupied molecular orbital (HOMO) energy level of the first compound and a HOMO energy level of the second compound satisfy the following relationship in Equation (1):

$$|HOMO^{FD} - HOMO^{DF}| < 0.3 \text{ eV} \quad (1)$$

where in the Equation (1), $HOMO^{DF}$ indicates the HOMO energy level of the first compound; and $HOMO^{FD}$ indicates the HOMO energy level of the second compound.

3. The organic light emitting diode of claim 1, wherein a lowest unoccupied molecular orbital (LUMO) energy level of the first compound is higher than or equal to a LUMO energy level of the second compound.

4. The organic light emitting diode of claim 1, wherein an energy bandgap between a HOMO energy level and a LUMO energy level of the first compound is between about 2.6 eV and about 3.1 eV.

5. The organic light emitting diode of claim 1, wherein each of $R^1$ and $R^2$ in Formula 1 is independently a hydrogen atom, one of $X^1$ $X^4$ in Formula 2 is a carbon atom linked to the hetero ring having the boron atom and the oxygen atom and other of $X^1$ to $X^4$ in Formula 2 is independently $CR^4$.

6. The organic light emitting diode of claim 1, wherein each of $R^1$ and $R^2$ in Formula 1 is independently a hydrogen atom and D in Formula 1 includes the following moiety of Formula 5:

[Formula 5]

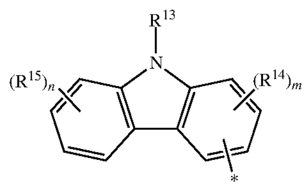

where in the Formula 5, $R^{13}$ is an unsubstituted or substituted $C_6$-$C_{30}$ aryl or an unsubstituted or substituted $C_3$-$C_{30}$ hetero aryl;

each of $R^{14}$ and $R^{15}$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl amino, an unsubstituted or substituted $C_6$-$C_{30}$ aromatic group or an unsubstituted or substituted $C_3$-$C_{30}$ hetero aromatic group, each $R^{14}$ is different from or identical to each other when m is 2 or more, and each $R^{15}$ is different from or identical to each other when n is 2 or more, optionally, two adjacent $R^{14}$ when m is 2 or more and/or two adjacent $R^{15}$ when n is 2 or more are linked together to form an unsubstituted or substituted $C_6$-$C_{20}$ aromatic ring or an unsubstituted or substituted $C_3$-$C_{20}$ hetero aromatic ring;

m is 0, 1, 2 or 3;

n is 0, 1, 2, 3 or 4; and the asterisk indicates a link position.

7. The organic light emitting diode of claim 1, wherein the first compound is selected from the following organic compounds:

1-1

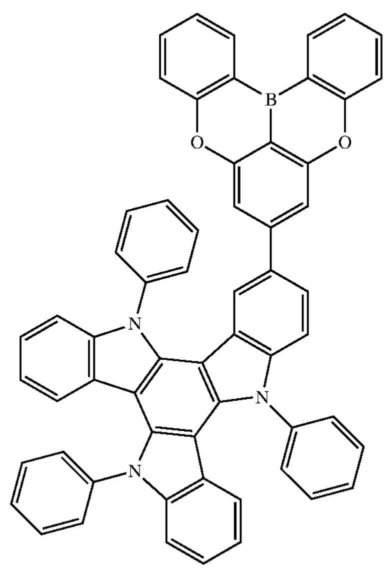

1-2

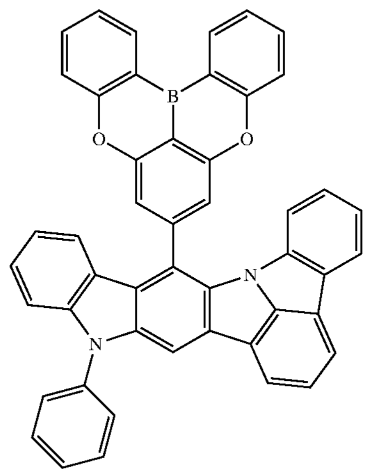

-continued
1-3
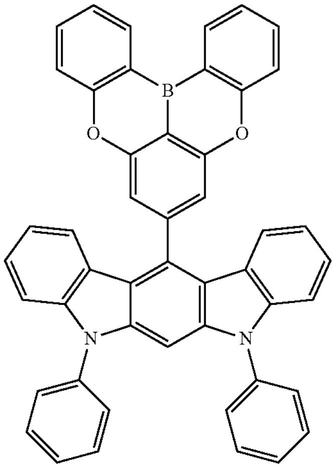
1-4
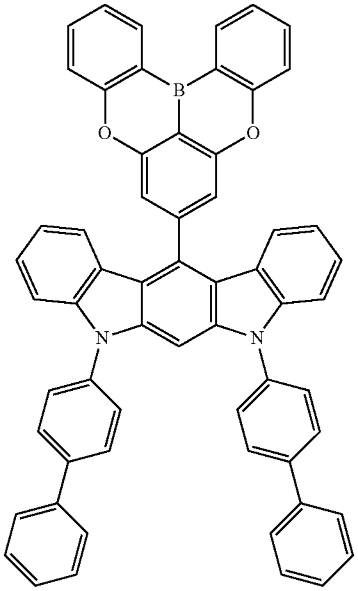
1-5
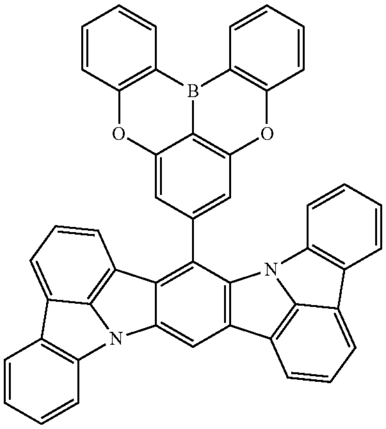
-continued
1-6
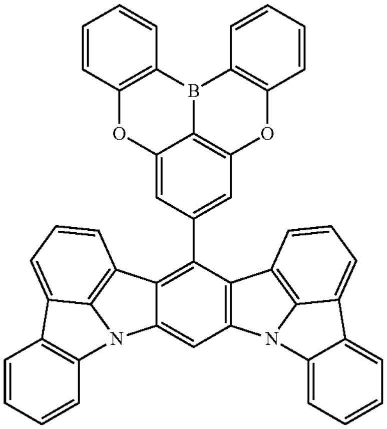
1-7
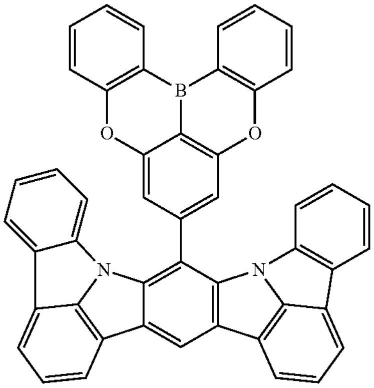
1-8
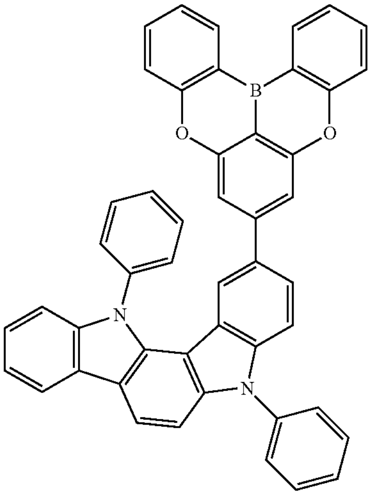

-continued
1-9
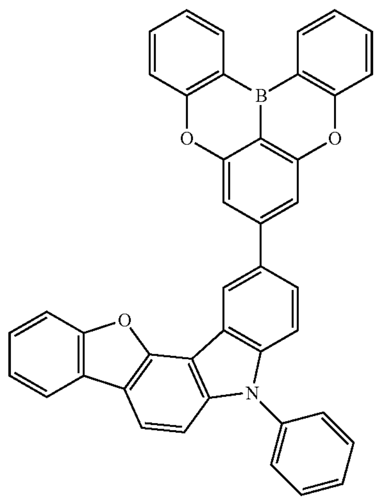
1-10
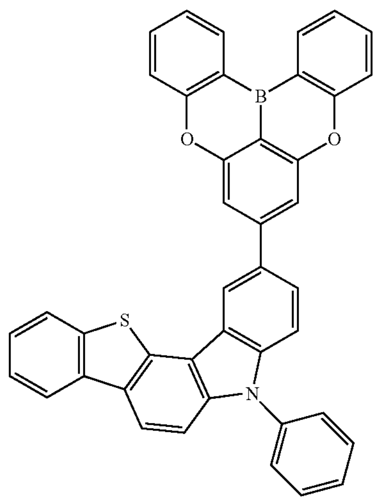
1-11
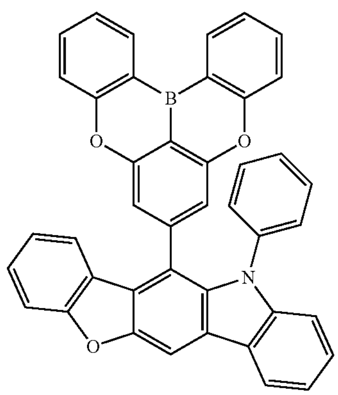
-continued
1-12
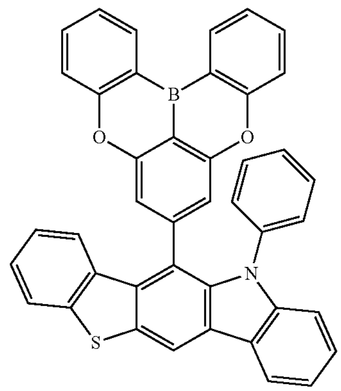
1-13
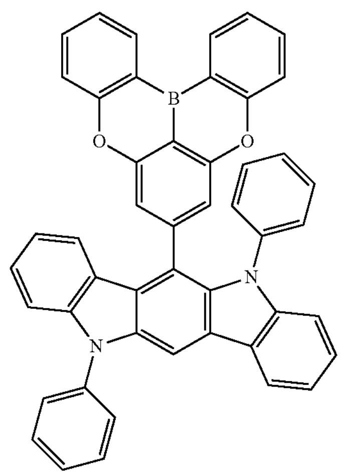
1-14
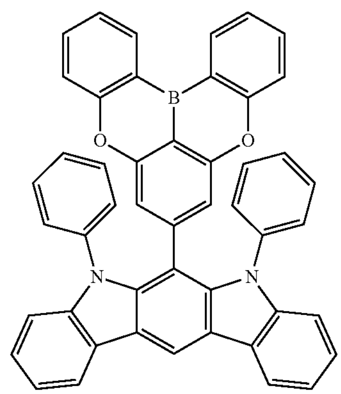

-continued
1-15
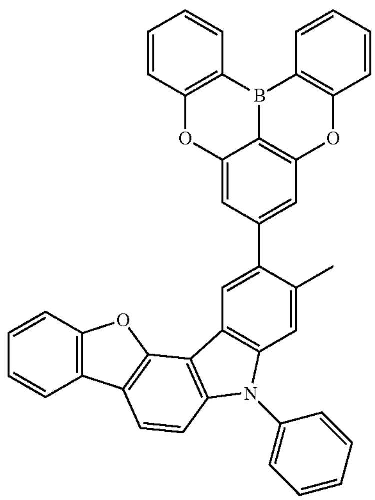
1-16
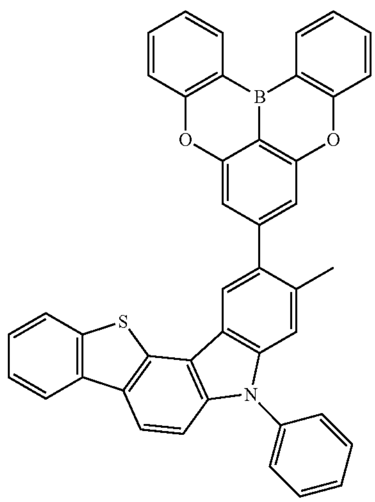
1-17
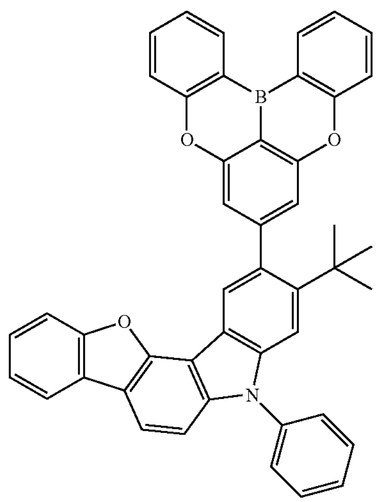
-continued
1-18
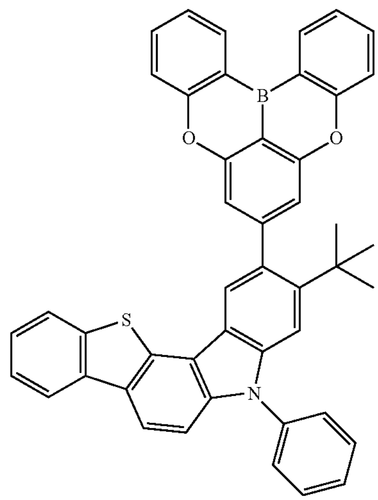
.
8. The organic light emitting diode of claim 1, wherein the second compound includes an organic compound having the following structure of Formula 8A, Formula 8B or Formula 8C:
[Formula 8A]
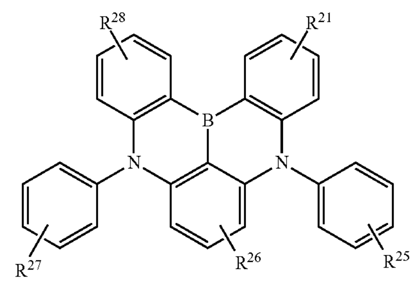
[Formula 8B]
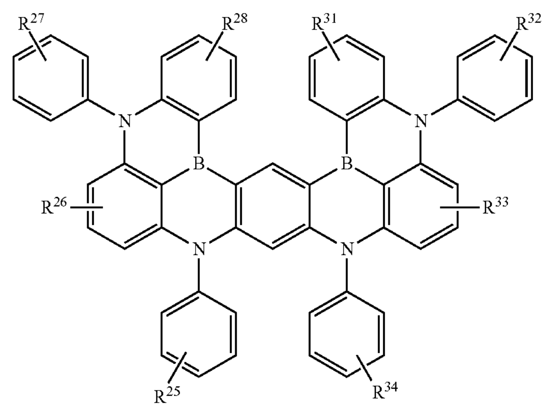

[Formula 8C]

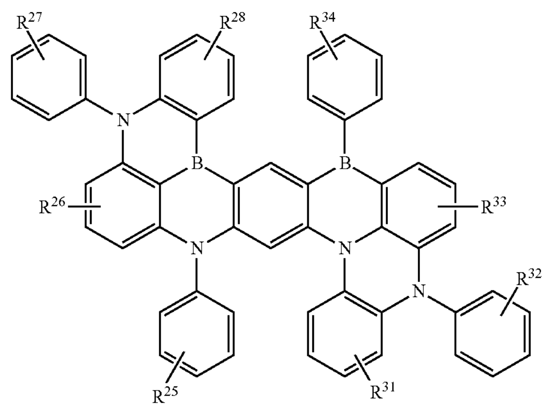

where in the Formulae 8A to 8C, each of $R^{21}$, $R^{25}$ to $R^{28}$ and $R^{31}$ to $R^{34}$ is independently a hydrogen atom, a deuterium, a tritium, a halogen atom, an unsubstituted or substituted $C_1$-$C_{20}$ alkyl, an unsubstituted or substituted $C_1$-$C_{20}$ alkyl silyl, an unsubstituted or substituted $C_1$-$C_{20}$ alkyl amino, an unsubstituted or substituted $C_6$-$C_{30}$ aryl or an unsubstituted or substituted $C_3$-$C_{20}$ hetero aryl.

9. The organic light emitting diode of claim 1, wherein the second compound is selected from the following organic compounds:

2-1

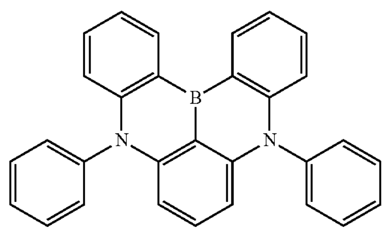

2-2

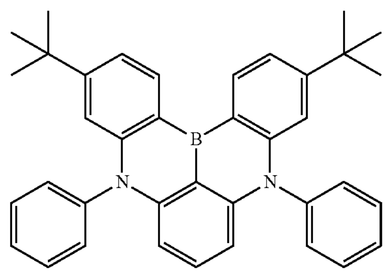

2-3

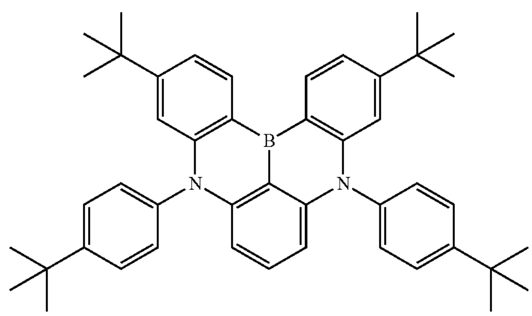

2-4

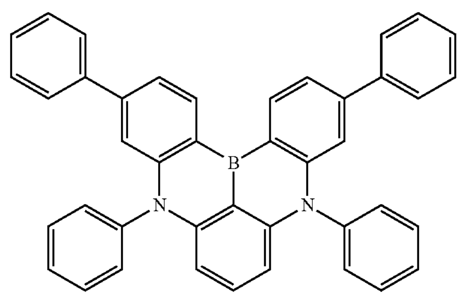

2-5

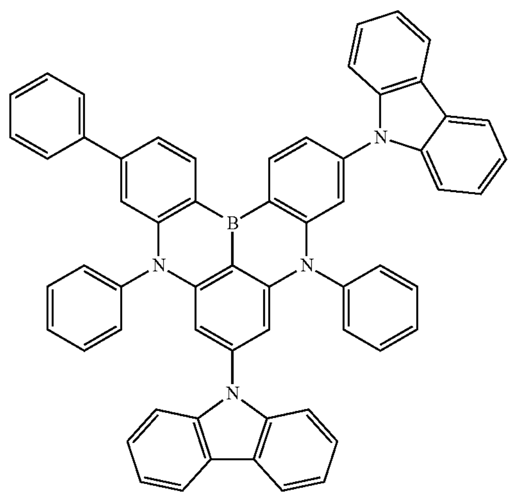

2-6

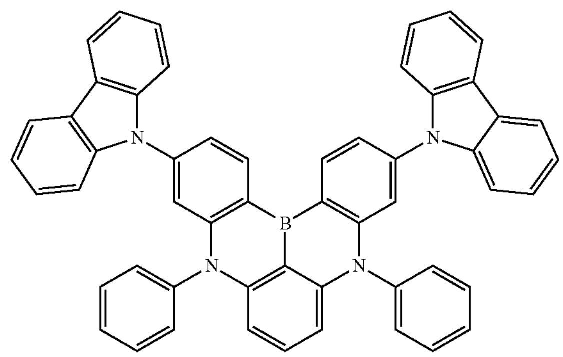

-continued
2-7
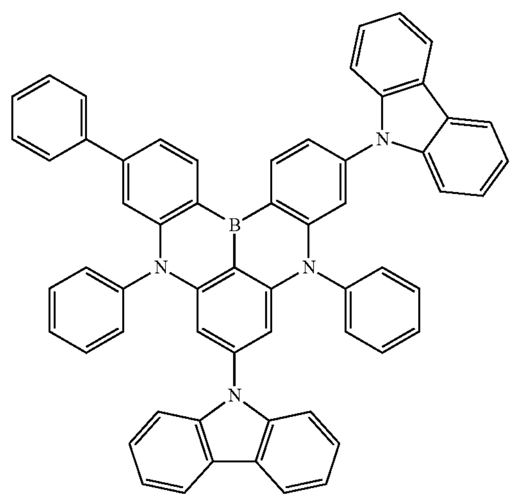
2-8
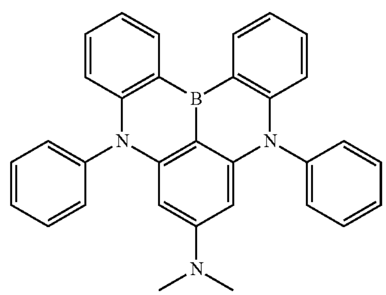
2-9
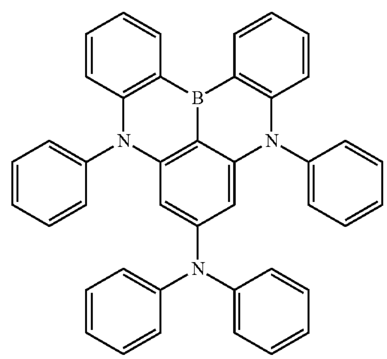
2-10
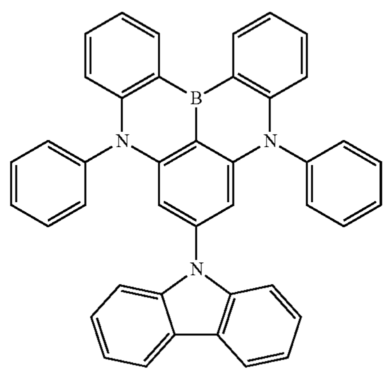
2-11
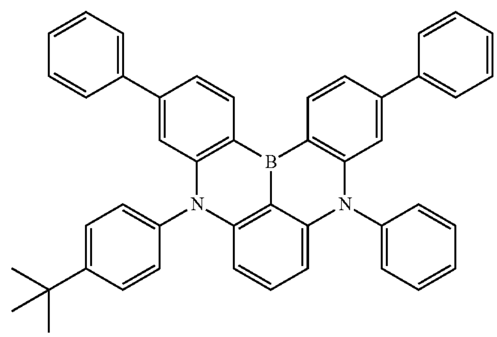
2-12
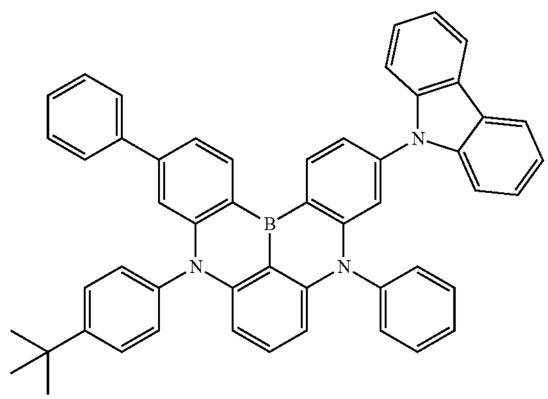

-continued
2-13
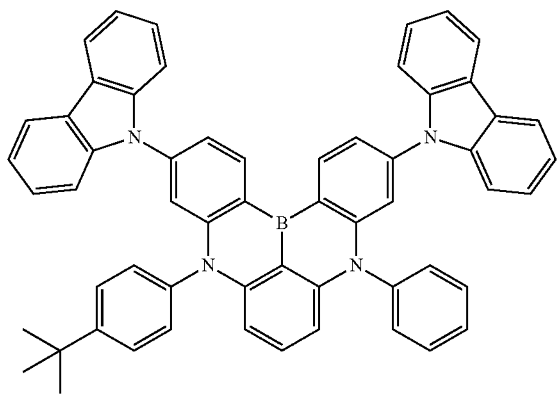
2-14
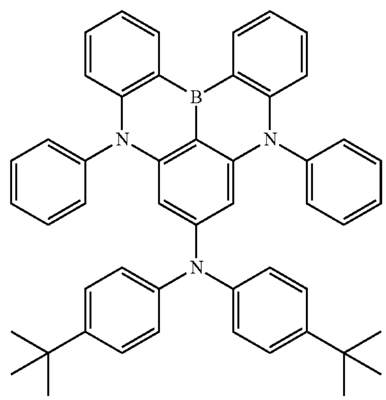
2-15
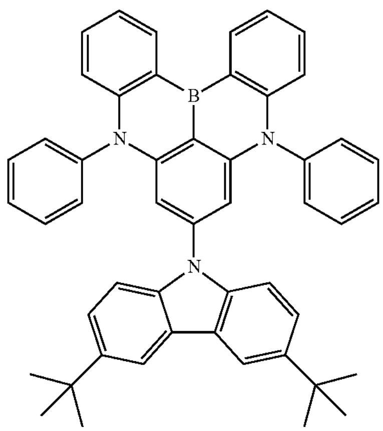
2-16
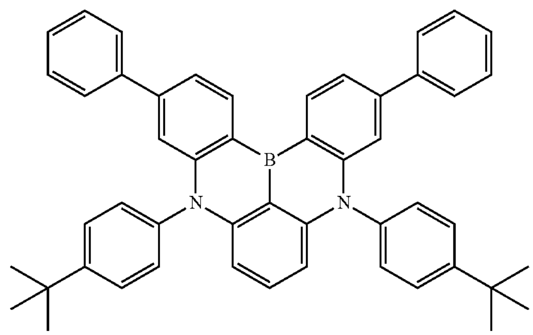
2-17
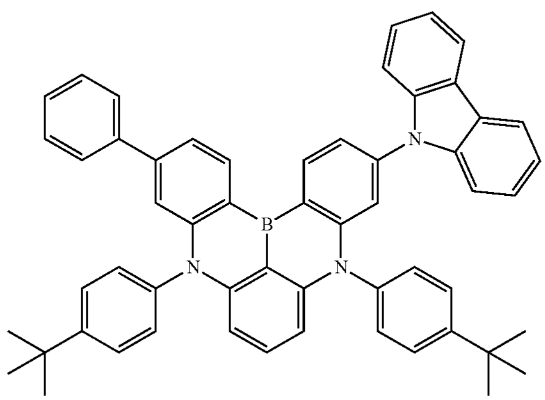
2-18
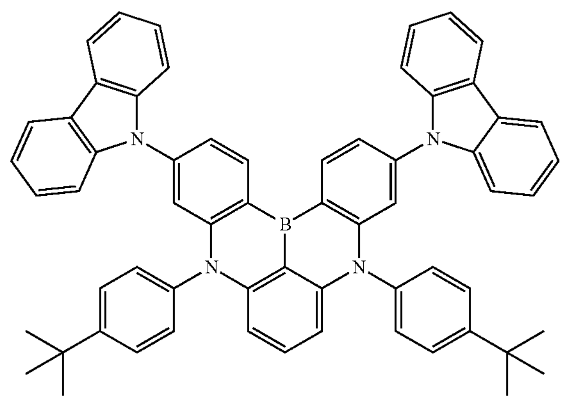
2-19
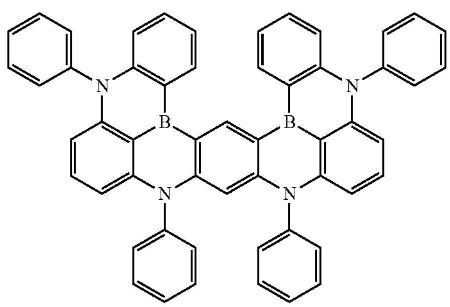
2-20
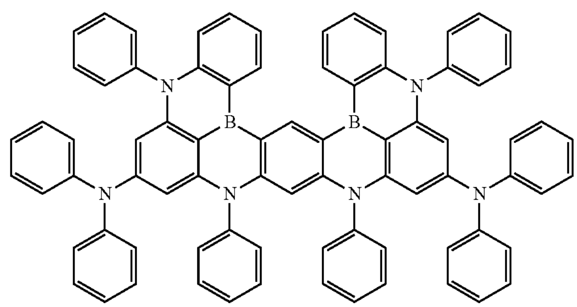

-continued
2-21
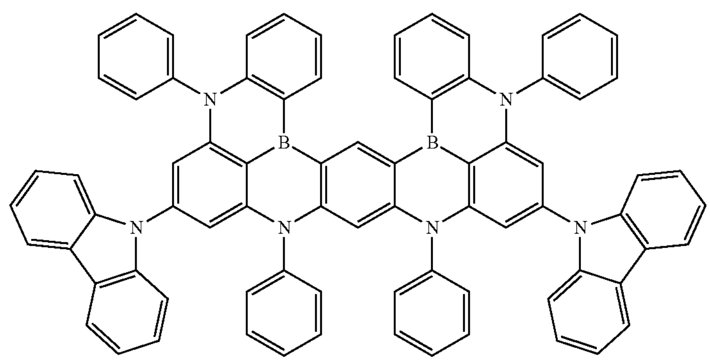
2-22
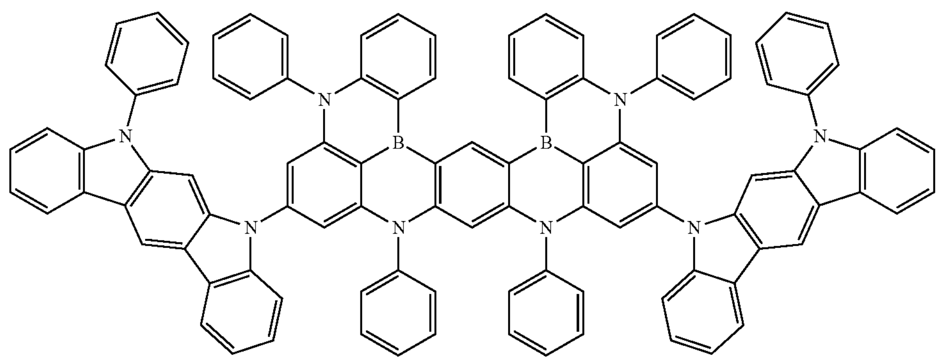
2-23
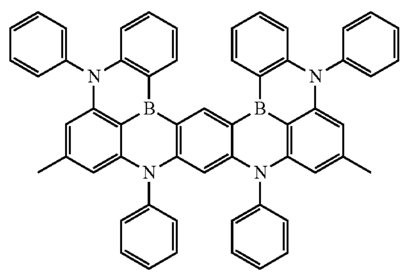
2-24
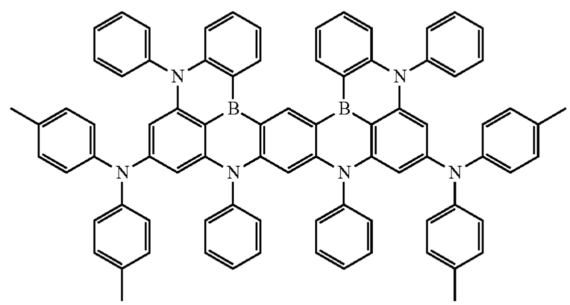
2-25
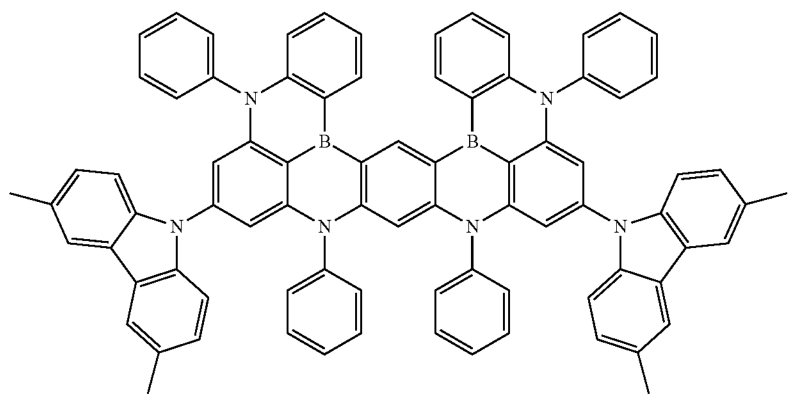

-continued
2-26
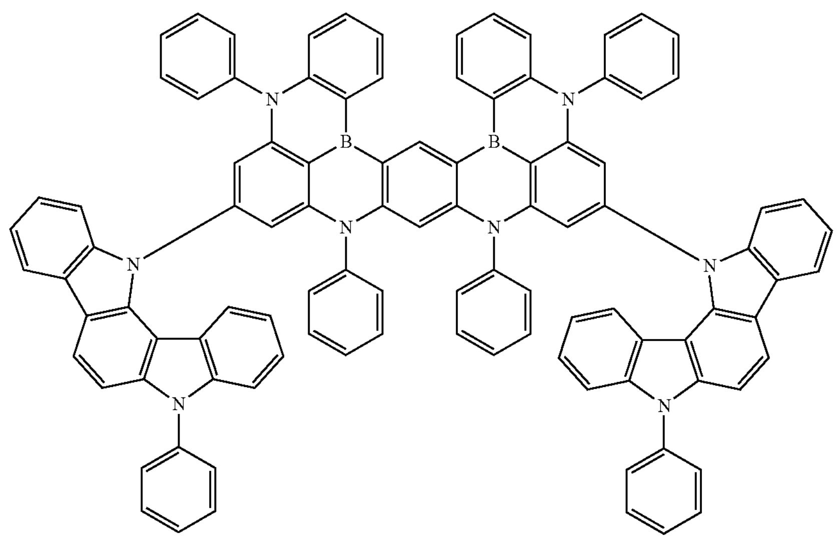
2-27
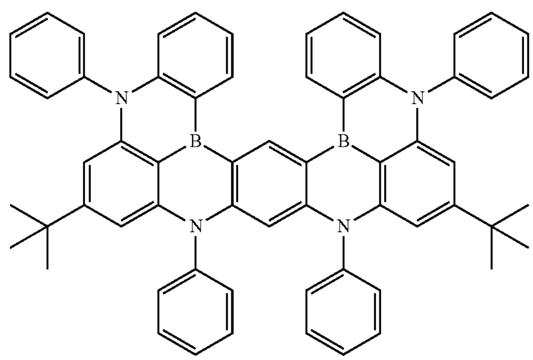
2-28
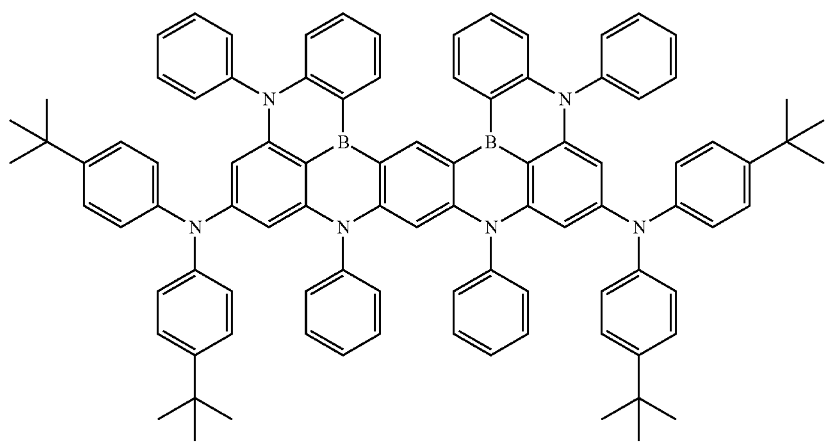

-continued
2-29
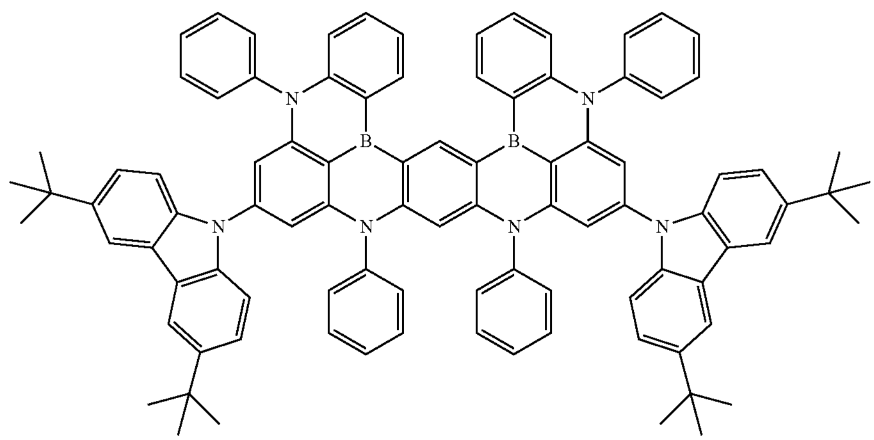
2-30
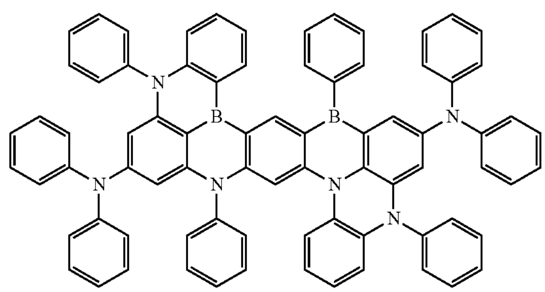
2-31
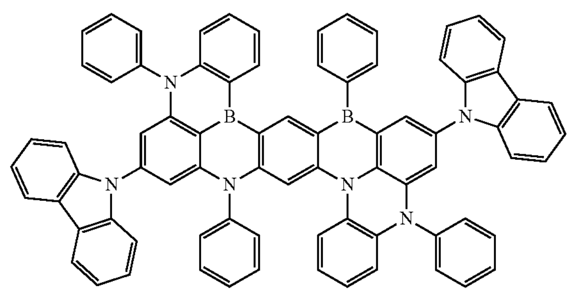
2-32
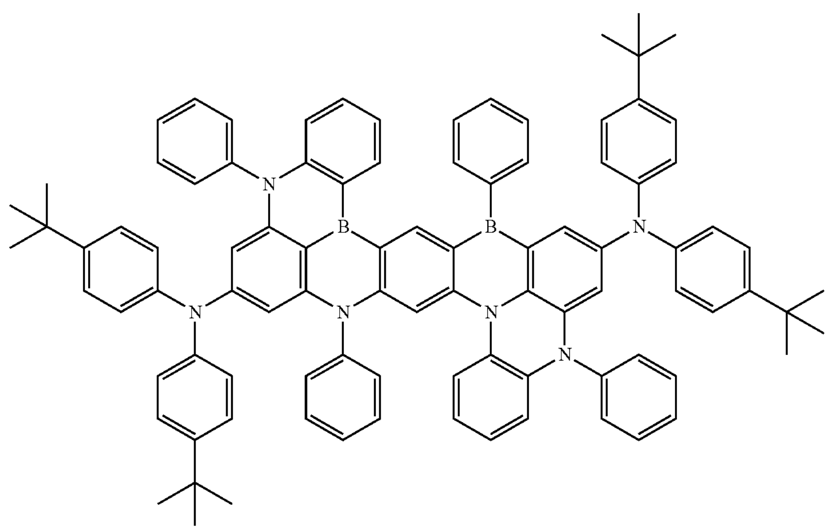

-continued 2-33

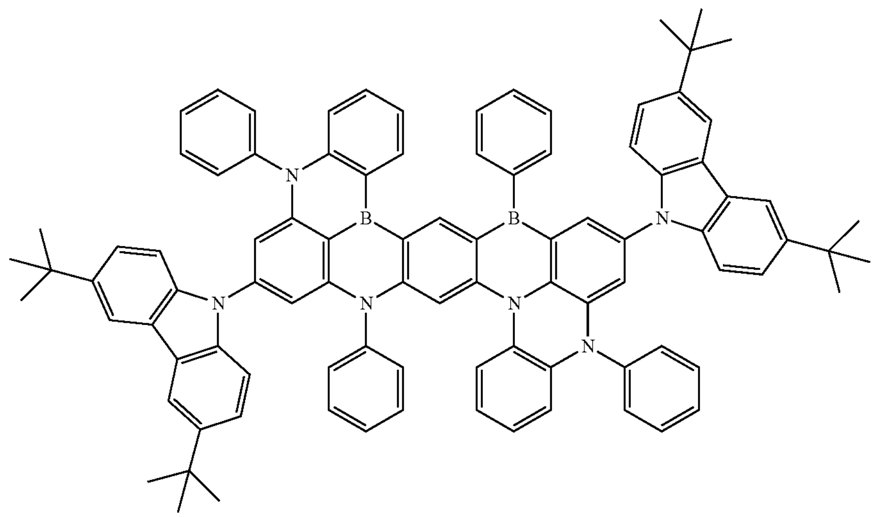

10. The organic light emitting diode of claim 1, wherein the at least one emitting material layer includes a single-layered emitting material layer.

11. The organic light emitting diode of claim 10, wherein the single-layered emitting material layer further includes a third compound.

12. The organic light emitting diode of claim 11, wherein an excited triplet energy level of the third compound is higher than an excited triplet energy level of the first compound, and wherein the excited triplet energy level of the first compound is higher than an excited triplet energy level of the second compound.

13. The organic light emitting diode of claim 11, herein an excited singlet energy level of the third compound is higher than an excited singlet energy level of the first compound, and wherein the excited singlet energy level of the first compound is higher than an excited singlet energy level of the second compound.

14. The organic light emitting diode of claim 1, wherein the at least one emitting material layer includes:

a first emitting material layer disposed between the first and second electrodes; and a second emitting material layer disposed between the first electrode and the first emitting material layer or between the second electrode and the first emitting material layer, wherein the first emitting material layer includes the first compound, and wherein the second emitting material layer includes the second compound.

15. The organic light emitting diode of claim 14, wherein the first emitting material layer further includes a third compound and the second emitting material layer further includes a fourth compound.

16. The organic light emitting diode of claim 15, wherein an excited triplet energy level of the third compound is higher than an excited triplet energy level of the first compound, and wherein the excited triplet energy level of the first compound is higher than an excited triplet energy level of the second compound.

17. The organic light emitting diode of claim 15, wherein an excited singlet energy level of the third compound is higher than an excited singlet energy level of the first compound, and wherein the excited singlet energy level of the first compound is higher than an excited singlet energy level of the second compound.

18. The organic light emitting diode of claim 15, wherein an excited singlet energy level of the fourth compound is higher than an excited singlet energy level of the second compound.

19. The organic light emitting diode of claim 14, wherein the at least one emitting material layer further includes a third emitting material layer disposed oppositely to the second emitting material layer with respect to the first emitting material layer.

20. The organic light emitting diode of claim 19, wherein the third emitting material layer includes a fifth compound and a sixth compound, and wherein the fifth compound includes an organic compound having the structure of Formula 7.

21. The organic light emitting diode of claim 1, wherein the emissive layer includes:

a first emitting part disposed between the first and second electrodes;

a second emitting part disposed between the first emitting part and the second electrode; and a charge generation layer disposed between the first and second emitting parts, and wherein at least one of the first emitting part and the second emitting part includes the at least one emitting material layer.

22. The organic light emitting diode of claim 21, wherein the first emitting part includes the at least one emitting material layer, and wherein the second emitting part emits at least one light of red color and green color.

23. An organic light emitting device, including:

a substrate; and the organic light emitting diode of claim 1 over the substrate.

* * * * *